US009257663B2

United States Patent
Nakamura et al.

(10) Patent No.: US 9,257,663 B2
(45) Date of Patent: Feb. 9, 2016

(54) ORGANIC ELECTROLUMINESCENT ELEMENT AND DISPLAY DEVICE

(71) Applicant: SONY CORPORATION, Tokyo (JP)

(72) Inventors: Masato Nakamura, Tokyo (JP); Emiko Kambe, Tokyo (JP); Masakazu Funahashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/407,825

(22) PCT Filed: Jun. 4, 2013

(86) PCT No.: PCT/JP2013/003503
§ 371 (c)(1),
(2) Date: Dec. 12, 2014

(87) PCT Pub. No.: WO2013/187007
PCT Pub. Date: Dec. 19, 2013

(65) Prior Publication Data
US 2015/0171356 A1      Jun. 18, 2015

(30) Foreign Application Priority Data

Jun. 12, 2012   (JP) ................................ 2012-132885

(51) Int. Cl.
*H01L 51/00*       (2006.01)
*H01L 51/05*       (2006.01)
(Continued)

(52) U.S. Cl.
CPC .............. *H01L 51/504* (2013.01); *C09K 11/06* (2013.01); *G09F 9/30* (2013.01); *H01L 51/006* (2013.01);
(Continued)

(58) Field of Classification Search
CPC ............ H01L 51/0061; H01L 51/0071; H01L 51/0072; H01L 51/0067
USPC ................. 257/40, E51.027, E51.001, E51.05
See application file for complete search history.

(56) References Cited

U.S. PATENT DOCUMENTS 6,329,084 B1 *   12/2001   Tamano ................. C07C 211/61
                                              252/301.16
6,753,097 B2 *    6/2004   Toguchi ................. C09K 11/06
                                              313/504
(Continued)

FOREIGN PATENT DOCUMENTS

JP         2005/100921        4/2005
JP         2006-049395 A      2/2006
(Continued)

OTHER PUBLICATIONS

International Search Report prepared by the Japanese Patent Office on Aug. 9, 2013, for International Application No. PCT/JP2013/003503.

*Primary Examiner* — Vongsavanh Sengdara
*Assistant Examiner* — Thai T Vuong
(74) *Attorney, Agent, or Firm* — Sheridan Ross P.C.

(57) ABSTRACT

An organic electroluminescence device that includes, between an anode 41 and a cathode 42, an organic layer stacked structure 43 that comprises stacked plural emitting layers that emit light of different colors, wherein the organic electroluminescent device comprises, between the emitting layers, at least one intermediate layer that comprises a compound represented by the following formula (1) in which at least one of $Ar_1$, $Ar_2$ and $Ar_3$ is a group represented by the following formula (2):

15 Claims, 4 Drawing Sheets

(51) Int. Cl.
  *H01L 51/30* (2006.01)
  *H01L 51/54* (2006.01)
  *H01L 21/312* (2006.01)
  *H01L 51/50* (2006.01)
  *C09K 11/06* (2006.01)
  *G09F 9/30* (2006.01)
  *H01L 51/52* (2006.01)

(52) U.S. Cl.
  CPC ........ *H01L 51/0052* (2013.01); *H01L 51/0054* (2013.01); *H01L 51/0058* (2013.01); *H01L 51/0059* (2013.01); *H01L 51/0061* (2013.01); *H01L 51/0067* (2013.01); *H01L 51/0072* (2013.01); *H01L 51/0073* (2013.01); *H01L 51/5024* (2013.01); *H01L 51/5044* (2013.01); *H01L 51/0074* (2013.01); *H01L 51/5012* (2013.01); *H01L 51/5072* (2013.01); *H01L 51/5265* (2013.01); *H01L 2251/5376* (2013.01); *H01L 2251/552* (2013.01)

(56) References Cited

U.S. PATENT DOCUMENTS

| | | | | |
|---|---|---|---|---|
| 6,921,588 B2* | 7/2005 | Toguchi | ............... | H01L 51/0055 313/504 |
| 8,221,904 B2* | 7/2012 | Nomura | ................. | C07D 13/10 313/504 |
| 8,558,223 B2* | 10/2013 | Schmid | ............... | H01L 51/0067 257/40 |
| 2002/0028346 A1* | 3/2002 | Shi | ...................... | H01L 51/0052 428/690 |
| 2005/0098207 A1* | 5/2005 | Matsumoto | ......... | H01L 51/0077 136/263 |
| 2005/0238914 A1* | 10/2005 | Lyu | .................... | C07F 15/0033 428/690 |
| 2006/0008672 A1* | 1/2006 | Jarikov | ................. | C09K 11/06 428/690 |
| 2007/0126347 A1* | 6/2007 | Jarikov | ............... | H01L 51/5048 313/506 |
| 2007/0248841 A1* | 10/2007 | Hosokawa | ............ | C09K 11/06 428/690 |
| 2008/0164809 A1* | 7/2008 | Matsunami | ............ | C09K 11/06 313/504 |
| 2015/0001511 A1* | 1/2015 | Kim | .................... | H01L 51/0071 257/40 |

FOREIGN PATENT DOCUMENTS

| | | |
|---|---|---|
| JP | 2009-272144 A | 11/2009 |
| JP | 2011-086442 A | 4/2011 |
| JP | 2012-014905 A | 1/2012 |
| JP | 2012-503294 A | 2/2012 |
| WO | WO 2011/046166 A1 | 4/2011 |
| WO | WO 2011/141109 A1 | 11/2011 |

* cited by examiner

ORGANIC ELECTROLUMINESCENT ELEMENT AND DISPLAY DEVICE

CROSS REFERENCE TO RELATED APPLICATIONS

This application is a national stage application under 35 U.S.C. 371 and claims the benefit of PCT Application No. PCT/JP2013/003503 having an international filing date of Jun. 4, 2013, which designated the United States, which PCT application claimed the benefit of Japanese Patent Application No. 2012-132885 filed Jun. 12, 2012, the disclosure of both the above-identified applications are incorporated herein by reference.

TECHNICAL FIELD

The invention relates to an organic electroluminescence device that emits light utilizing an organic electroluminescence (EL) phenomenon, and a display provided with this organic EL device.

BACKGROUND ART

A white-emitting organic EL device is used in lightings, a full-color display provided with a color filter, or the like. A display utilizing an organic EL device that emits while light has been actively developed since the production thereof is easy as compared with a display obtained by fabricating a red-emitting organic EL device, a green-emitting organic EL device and a blue-emitting organic EL device separately.

As the method for producing an organic EL device that emits white light, there is a method in which a plurality of emitting layers that emit different colors of light are stacked, and white color emission is obtained by overlapping of emission of each emitting layer. In this method, by forming an intermediate layer between the emitting layers, blocking of electrons or holes that causes light to be emitted mainly from one emitting layer can be prevented, whereby emission can be obtained from each emitting layer in a well-balanced manner.

For example, in Patent Document 1, an organic EL device is disclosed in which a red-emitting layer, a green-emitting layer and a blue-emitting layer are stacked from the anode side and an intermediate layer comprising α-NPD is formed between the green-emitting layer and the blue-emitting layer. Due to the formation of the intermediate layer, each emitting layer is caused to emit light in a well-balanced manner.

However, there is a problem mentioned below. Since α-NPD is a hole-transporting material, when α-NPD is used in the intermediate layer, while highly efficient emission can be obtained by blocking electrons, due to excessively strong blocking properties of α-NPD, electrons tend to be accumulated in the interface between the emitting layer on the cathode side of the intermediate layer and the intermediate layer, and the emitting layer on the cathode side of the intermediate layer tends to be deteriorated easily, whereby the life of the organic EL device is shortened.

Further, electrons are blocked strongly, electrons cannot be distributed to the emitting layer positioned on the anode side of the intermediate layer as long as the thickness of the intermediate layer is not allowed to be extremely thin (e.g. 3 nm). Therefore, film thickness control is significantly difficult, posing a problem in respect of mass production.

Further, there is another problem mentioned below. Since emission balance of each emitting layer is sensitive to changes in thickness of the intermediate layer, the film thickness margin of the intermediate layer becomes very small. As a result, film thickness control on the order of several angstroms becomes necessary, resulting in poor mass productivity.

On the other hand, if an electron-transporting material is used in an intermediate layer, there is a concern that, since it has a poor hole-transporting capability, poor emission is obtained from an emitting layer positioned on the side nearer to the cathode than the intermediate layer, whereby luminous efficiency may be lowered. In order to obtain well-balanced white emission, it is required to control the thickness of the intermediate layer on the order of several angstroms, resulting in poor mass productivity. When a material having a small energy gap is used in the intermediate layer in order to relax charge-blocking properties, an exciton energy in the adjacent emitting layers cannot be confined, thereby causing lowering in luminous efficiency.

RELATED ART DOCUMENT

Patent Document

Patent Document 1: JP-A-2005-100921

SUMMARY OF THE INVENTION

An object of the invention is to provide an organic EL device having a high luminous efficiency and a long life.

The inventors have found that, in an organic EL device in which two or more emitting layers are stacked, by using a specific aromatic amine derivative in an intermediate layer formed between the emitting layers, charges can be supplied to both the cathode side of the intermediate layer and the anode side of the intermediate layer in a well-balanced manner, and further, the driving voltage is not increased even if the thickness of the intermediate layer is increased. The invention has been attained based on this finding.

According to the invention, the following organic EL device or the like are provided.

1. An organic electroluminescence device that comprises, between an anode and a cathode, an organic layer stacked structure that comprises stacked plural emitting layers that emit light of different colors, wherein the organic electroluminescent device comprises, between the emitting layers, at least one intermediate layer that comprises a compound represented by the following formula (1):

wherein in the formula (1), $Ar_1$ to $Ar_3$ are independently a substituted or unsubstituted aromatic hydrocarbon group including 6 to 50 carbon atoms that form a ring (hereinafter referred to as "ring carbon atoms") or a substituted or unsubstituted heterocyclic group including 5 to 30 atoms that form a ring (hereinafter referred to as "ring atoms"), and any one pair of $Ar_1$ and $Ar_2$, $Ar_1$ and $Ar_3$ and $Ar_2$ and $Ar_3$ may be bonded to each other to form a substituted or unsubstituted nitrogen-containing heterocyclic ring including a nitrogen atom in the formula (1), provided that at least one of $Ar_1$ to $Ar_3$ is a heterocyclic group represented by the following formula (2):

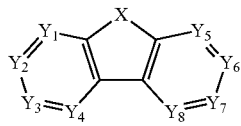

(2)

wherein in the formula (2), X is an oxygen atom or a sulfur atom and $Y_1$ to $Y_8$ are a carbon atom;

one of $Y_1$ to $Y_8$ is a carbon atom that is bonded to the following $L_1$ and the other seven of $Y_1$ to $Y_8$ are independently a carbon atom that is bonded to the following R or form a substituted or unsubstituted ring that includes an adjacent carbon atom;

$L_1$ is a linkage group that is bonded to a nitrogen atom in the formula (1), and is a single bond or a substituted or unsubstituted aromatic hydrocarbon group including 6 to 50 ring carbon atoms;

R is a hydrogen atom, a substituted or unsubstituted alkyl group including 1 to 10 carbon atoms, a substituted or unsubstituted cycloalkyl group including 3 to 10 ring carbon atoms, a substituted or unsubstituted trialkylsilyl group including 3 to 10 carbon atoms, a substituted or unsubstituted triarylsilyl group including 18 to 30 ring carbon atoms, a substituted or unsubstituted alkylarylsilyl group including 8 to 15 carbon atoms (an aryl part includes 6 to 14 ring carbon atoms), a substituted or unsubstituted aromatic hydrocarbon group including 6 to 16 ring carbon atoms, a substituted amino group, a group including a substituted amino group, a halogen atom or a cyano group.

2. The organic electroluminescence device according to 1, wherein at least one emitting layer of the plural emitting layers comprises an anthracene derivative as a host material.

3. The organic electroluminescence device according to 2, wherein the anthracene derivative is a compound represented by the following formula (3):

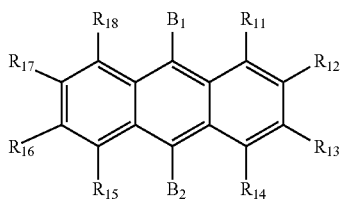

(3)

wherein in the formula (3), $B_1$ and $B_2$ are independently a substituted or unsubstituted aromatic hydrocarbon group including 6 to 20 ring carbon atoms; and $R_{11}$ to $R_{18}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsilyl group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

4. The organic electroluminescence device according to 2, wherein at least one emitting layer of the remaining emitting layers other than the emitting layer that comprises an anthracene derivative as a host material comprises at least compound A having an ionization potential of less than 5.6 eV as a host material.

5. The organic electroluminescence device according to 4, wherein the compound A is a polycyclic aromatic hydrocarbon compound including a 4 to 7-membered mother skeleton.

6. The organic electroluminescence device according to 5, wherein the mother skeleton of the polycyclic aromatic hydrocarbon compound is pyrene, benzopyrene, chrysene, naphthacene, benzonaphthacene, dibenzonaphthacene, perylene or coronene.

7. The organic electroluminescence device according to 4, wherein the compound A is a compound represented by the following formula (4):

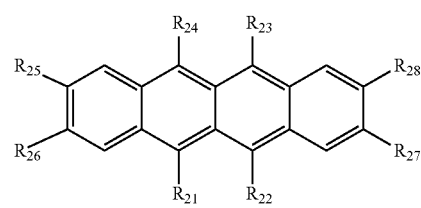

(4)

wherein in the formula (4), $R_{21}$ to $R_{28}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsily group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

8. The organic electroluminescence device according to 4, wherein the emitting layer including the compound A comprises, as a dopant material, a perylene derivative, a diketopyrrolo-pyrrole derivative, a pyrromethene complex, a pyrane derivative or a styryl derivative.

9. The organic electroluminescence device according to 4 that comprises, between an anode and a cathode, a first emitting layer, an intermediate layer, a second emitting layer and a third emitting layer being stacked in this sequence from the anode side, wherein the first emitting layer comprises at least the compound A as a host material; and the second emitting layer and the third emitting layer comprise an anthracene derivative as a host material.

10. The organic electroluminescence device according to 2, wherein at least one emitting layer of the remaining emitting layers other than the emitting layer that comprises an anthracene derivative as a host material comprises at least a phosphorescent emitting material as a host material.

11. The organic electroluminescence device according to 10, wherein the phosphorescent emitting material is a carbazole derivative or a quinoline complex derivative.

12. The organic electroluminescence device according to 10 that comprises, between an anode and a cathode, a first emitting layer, an intermediate layer and a second emitting layer being stacked from the anode side,
wherein
the first emitting layer comprises at least a phosphorescent emitting material as a host material, and
the second emitting layer comprises an anthracene derivative as a host material.
13. The organic electroluminescence device according to 1, wherein a part of the organic layer stacked structure, said part being in contact with the anode, comprises a hole-supplying layer, and a part of the organic layer stacked structure, said part being in contact with the cathode, comprises an electron-supplying layer.
14. The organic electroluminescence device according to 1, that emits white light by overlapping of light emitted from the plural emitting layers.
15. A display that comprises the organic electroluminescence devices according to any of 1 to 14 that are arranged in a two-dimensional matrix form.

According to the invention, a highly efficient and long-lived organic EL device can be provided.

MODE FOR CARRYING OUT THE INVENTION

Figure 1:
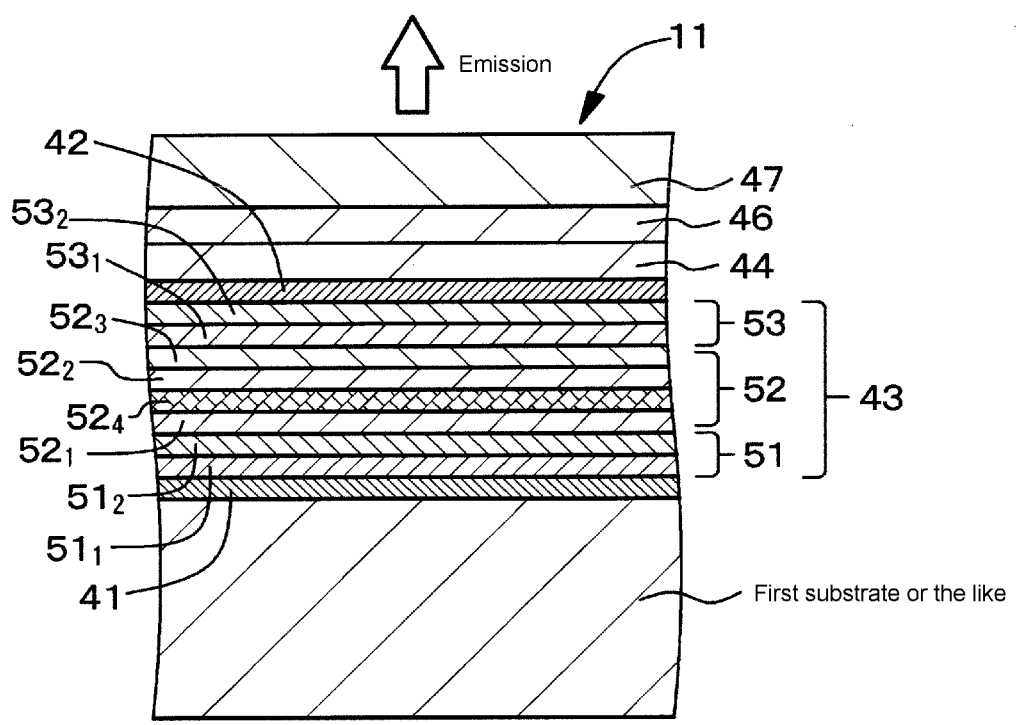
FIG. 1 is a schematic partial cross-sectional view of an organic EL device according to one embodiment of the invention.

The organic EL device of the invention comprises, between an anode and a cathode, an organic layer stacked structure that comprises plural (two or more) emitting layers that emit different colors of light. The organic EL device of the invention comprises, between the emitting layers, at least one intermediate layer that comprises a compound represented by the following formula (1):

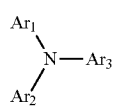

(1)

In the formula (1), $Ar_1$ to $Ar_3$ are independently a substituted or unsubstituted aromatic hydrocarbon group including 6 to 50 ring carbon atoms or a substituted or unsubstituted heterocyclic group including 5 to 30 ring atoms. Any one pair of $Ar_1$ and $Ar_2$, $Ar_1$ and $Ar_3$ and $Ar_2$ and $Ar_3$ may be bonded to each other to form a substituted or unsubstituted nitrogen-containing ring including a nitrogen atom in the formula (1).

As examples of the nitrogen-containing heterocyclic ring, a carbazole ring or the like can be given.

In the invention, at least one of $Ar_1$ to $Ar_3$ in the formula (1) is a heterocyclic group represented by the following formula (2). That is, the compound represented by the formula (1) has one or more dibenzofuran rings or one or more dibenzothiophene rings.

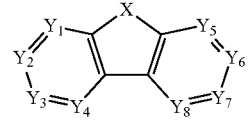

(2)

In the formula (2), X is an oxygen atom or a sulfur atom.
$Y_1$ to $Y_8$ are a carbon atom, and one of $Y_1$ to $Y_8$ is a carbon atom that is bonded to $L_1$. $L_1$ is a linkage group that is bonded to the nitrogen atom in the formula (1), and is a single bond or a substituted or unsubstituted aromatic hydrocarbon group including 6 to 50 ring carbon atoms.

Seven of $Y_1$ to $Y_8$ other than the carbon atom that is bonded to $L_1$ are independently a carbon atom that is bonded to the following R or form a substituted or unsubstituted ring that includes adjacent carbon atoms.

R is a hydrogen atom, a substituted or unsubstituted alkyl group including 1 to 10 carbon atoms, a substituted or unsubstituted cycloalkyl group including 3 to 10 ring carbon atoms, a substituted or unsubstituted trialkylsilyl group including 3 to 10 carbon atoms, a substituted or unsubstituted triarylsilyl group including 18 to 30 ring carbon atoms, a substituted or unsubstituted alkylarylsilyl group including 8 to 15 carbon atoms (an aryl part includes 6 to 14 ring carbon atoms), a substituted or unsubstituted aryl group including 6 to 16 ring carbon atoms, a substituted amino group, a group including a substituted amino group, a halogen atom, or a cyano group.

As the ring that includes adjacent carbon atoms, a benzene ring or the like can be given.

The following is desirable for the intermediate layer of the invention. In the intermediate layer of the invention, electrons are blocked in the interface between the emitting layer on the cathode side and the intermediate layer, thereby to improve the luminous efficiency of the emitting layer on the cathode side. At the same time, by allowing electrons to move sufficiently to the emitting layer on the anode side, the luminous efficiency of the emitting layer on the anode side is improved. Further, deterioration of the emitting layer on the cathode side in the interface between the emitting layer on the cathode side and the intermediate layer is prevented.

Properties required for a material constituting the intermediate layer mentioned above include hole-transporting properties, a sufficient energy gap, a LUMO level sufficient for blocking electrons for the cathode-side emitting layer, an energy gap sufficient for confining the emission energy of the emitting layer, and combination of hole-transporting properties and appropriate electron transporting ability.

The compound represented by the formula (1) is an amine compound having a dibenzofuran structure or a dibenzothiophene structure. Due to the presence of dibenzofuran or dibenzothiophene, this compound has a large energy gap, and hence, is suitable for confining exciton energy. That is, when an amine compound as represented by the formula (1), that includes dibenzofuran or dibenzothiophene, is used as the intermediate layer, a high luminous efficiency can be obtained by confinement of exciton energy, whereby transportation of holes and transportation of electrons can be conducted in a well-balance manner, and emission of two or more emitting layers can be conducted in a well-balanced manner. Further, due to high electron density, the compound has effects of accelerating transportation of electrons.

On the other hand, the compound represented by the formula (1) is an amine compound, and hence has hole-transporting properties. That is, as for the intermediate layer that comprises the compound represented by the formula (1), since it has a function of blocking electrons and a function of moving electrons in a well-balanced manner, while electrons are blocked in the interface between the emitting layer that is positioned nearer to the cathode relative to the intermediate layer (hereinafter referred to as the "cathode-side emitting layer") and the intermediate layer, electrons are moved sufficiently to the emitting layer positioned nearer to the anode relative to the intermediate layer (hereinafter referred to as the "anode-side emitting layer"). As a result, electrons are not accumulated in the interface between the intermediate layer and the cathode-side emitting layer, and deterioration of the emitting layer hardly occurs, whereby a long-lived organic EL device can be realized.

Further, since distribution of electrons to the anode-side emitting layer can be sufficiently conducted, the thickness of the intermediate layer can be large. In addition, variations in balance of emission of each color for variations in film thickness of the intermediate layer are small, the margin of film thickness for the intermediate layer can be set large, and as a result, an organic EL device having a high mass productivity can be realized. Further, due to optimum combination with carrier transporting performance of the emitting layer, an organic EL device in which all of the emitting layers emit light in a well-balanced manner can be realized.

In the invention, between the emitting layers, at least one intermediate layer that comprises a compound represented by the following formula (1) is provided. This means that, if three emitting layers are provided, it suffices that the intermediate layer be provided in at least one of the two spaces between the three emitting layers.

Emission of different colors of light by the emitting layers means that the peak wavelength of emission is different.

Hereinbelow, an explanation will be made on each group of the compound that is represented by the formula (1) mentioned above and is used in the invention.

In the invention, the "ring carbon atoms" means carbon atoms that constitute a saturated ring, an unsaturated ring or an aromatic ring. The "ring atoms" means carbon atoms and hetero atoms that constitute a hetero ring (including a saturated ring, an unsaturated ring and an aromatic ring".

In the invention, the hydrogen atom includes protium, deuterium and tritium.

The aromatic hydrocarbon group including 6 to 50 ring carbon atoms is preferably one including 6 to 20 ring carbon atoms, more preferably 6 to 16 ring carbon atoms, and particularly preferably 6 to 12 ring carbon atoms.

Specific examples of the monovalent aromatic hydrocarbon group (aryl group) include a phenyl group, a naphthyl group, a phenanthryl group, a pyrenyl group, a chrysenyl group, a benzanthryl group, a benzo[c]phenanthryl group, a benzo[g]chrysenyl group, a triphenylenyl group, a fluorenyl group, a benzofluorenyl group, a dibenzofluorenyl group, a biphenyl group, a terphenyl group and a fluoranthenyl group. Among these, a phenyl group, a biphenyl group and a naphthyl group are preferable.

As the aromatic hydrocarbon group including a substituent, a tolyl group, a xylyl group, a 9,9-dimethylfluorenyl group or the like are preferable.

As the aromatic hydrocarbon group represented by $L_1$, a divalent group obtained by allowing one of hydrogen atoms in the above-mentioned monovalent aromatic hydrocarbon group to be a single bond can be given.

The aromatic hydrocarbon group represented by R is, among the above-mentioned aromatic hydrocarbon groups, one including 6 to 16 ring carbon atoms.

The heterocyclic group including 5 to 30 ring atoms is preferably one including 5 to 20 ring atoms, more preferably one including 5 to 14 ring atoms.

Specific examples of the monovalent aromatic heterocyclic group (heteroaryl group) include a pyrrolyl group, a pyrazolyl group, a pyrazinyl group, a pyrimidinyl group, a pyridazinyl group, a pyridyl group, a triazinyl group, indolyl group, isoindolyl group, an imidazolyl group, a benzimidazolyl group, an indazolyl group, an imidazo[1,2-a]pyridinyl group, a furyl group, a benzofuranyl group, an isobenzofuranyl group, a dibenzofuranyl group, an azadibenzofuranyl group, a thiophenyl group, a benzothiophenyl group, a dibenzothiophenyl group, an azadibenzothiophenyl group, a quinolyl group, an isoquinolyl group, a quinoxalinyl group, a quinazolinyl group, a naphthyridinyl group, a carbazolyl group, an azacarbazolyl group, a phenanthridinyl group, an acridinyl group, a phenanthrolinyl group, a phenazinyl group, a phenothiazinyl group, a phenoxazinyl group, an oxazolyl group, an oxadiazolyl group, a furazanyl group, a benzoxazolyl group, a thienyl group, a thiazolyl group, a thiadiazolyl group, a benzothiazolyl group, a triazolyl group, a tetrazolyl group or the like. Among them, a dibenzofuranyl group, a dibenzothiophenyl group and a carbazolyl group are preferable.

As the alkyl group including 1 to 10 carbon atoms, linear and branched alkyl groups can be given. As the linear and branched alkyl groups, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group or the like can be given. Among them, a methyl group, an ethyl group, a propyl group, an isopropyl group, an n-butyl group, an isobutyl group, a sec-butyl group, a tert-butyl group or the like are preferably given. A methyl group, an ethyl group, a propyl group, an isopropyl group, an n-butyl group, an s-butyl group and a t-butyl group are further preferable.

As the cycloalkyl group including 3 to 10 ring carbon atoms, a cyclopropyl group, a cyclobutyl group, a cyclopentyl group, a cyclohexyl group, a 1-adamantyl group, a 2-adamantyl group, a 1-norbornyl group, a 2-norbornyl group or the like can be given. Among them, a cyclopentyl group and a cyclohexyl group are preferable.

The trialkylsilyl group including 3 to 10 carbon atoms is represented by $-Si(R^a)(R^b)(R^c)$. As examples of $(R^a)$, $(R^b)$ and $(R^c)$, the alkyl groups mentioned above can be given. Specifically, a trimethylsilyl group, a triethylsilyl group, a t-butyldimethylsilyl group, a vinyldimethylsilyl group, a propyldimethylsilyl group or the like can be given.

The triarylsilyl group including 18 to 30 ring carbon atoms is represented by $-Si(Ar^a)(Ar^b)(Ar^c)$. As examples of $(Ar^a)$, $(Ar^b)$ and $(Ar^c)$, the aryl groups mentioned above can be given. Specifically, a triphenylsilyl group or the like can be given.

As the alkylarylsilyl group including 8 to 15 carbon atoms (an aryl part includes 6 to 14 ring carbon atoms), a dialkylarylsilyl group or an alkyldiarylsilyl group can be given.

The dialkylarylsilyl group is represented by $-Si(R^a)(R^b)(Ar^c)$. As examples of $(R^a)$ and $(R^b)$, the alkyl groups mentioned above can be given. As examples of $(Ar^c)$, the aromatic hydrocarbon group mentioned above can be given. Specifically, a phenyldimethylsilyl group or the like can be given.

The alkyldiarylsilyl group is represented by $-Si(R^a)(Ar^b)(Ar^c)$. As examples of $(R^a)$, the alkyl groups mentioned above can be given. As examples of $(Ar^b)$ and $(Ar^c)$, the aryl groups mentioned above can be given. Specifically, a methyldiphenylsilyl group or the like can be given.

The substituted amino group is represented as —N(Ar$^a$)(Ar$^b$). As examples of (Ar$^b$) and (Ar$^c$), the aryl groups or the heteroaryl groups mentioned above can be given. Specifically, a diphenylamino group, a dibiphenylamino group, a dibenzofuranylbiphenylamino group or the like can be given.

As examples of the group having a substituted amino group, an aryl group substituted by the above-mentioned substituted amino group can be given.

As the halogen atom, F, Cl, Br, I or the like can be given.

As the substituent of the "substituted or unsubstituted" of each group in the compound represented by the formula (1), the alkyl group, the cycloalkyl group, the substituted silyl group, the aromatic hydrocarbon group, the heterocyclic group and the halogen atom mentioned above can be given. In addition, an alkoxyl group, an aralkyl group, a silyl group, a hydroxyl group, a nitro group, a cyano group, a carboxy group, an aryloxy group, a substituted amino group or the like can also be given.

The "unsubstituted" in the "substituted or unsubstituted" means bonding of a hydrogen atom.

In the invention, the compound represented by the formula (1) may be a compound in which a diamine compound, a triamine compound or the like is formed by bonding of one or more of $Ar_1$ to $Ar_3$ to a group including a substituted amino group or a substituted or unsubstituted carbazole group.

As the group including a substituted amino group, the substituted or unsubstituted aromatic hydrocarbon group or the group including an amino group that includes the substituted or unsubstituted heterocyclic group including 5 to 30 ring atoms mentioned above can be given. Specific examples thereof include a diphenylamino group, a dibiphenylamino group, a dibenzofuranylbiphenylamino group or a group obtained by bonding of these substituted amino groups to an aromatic hydrocarbon group (benzene, naphthalene, anthracene, a 9,9-dimethylfluorenyl group or the like).

Specific examples of the compound represented by the formula (1) are given below.

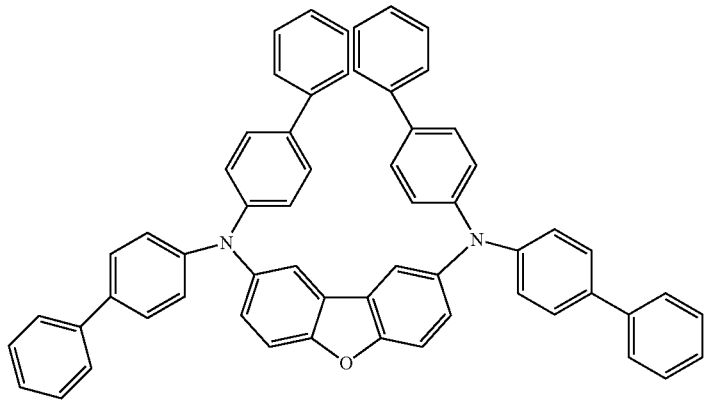

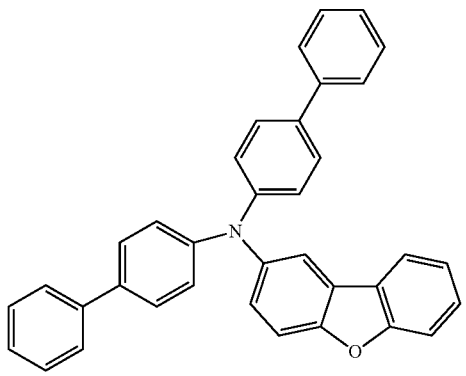

-continued
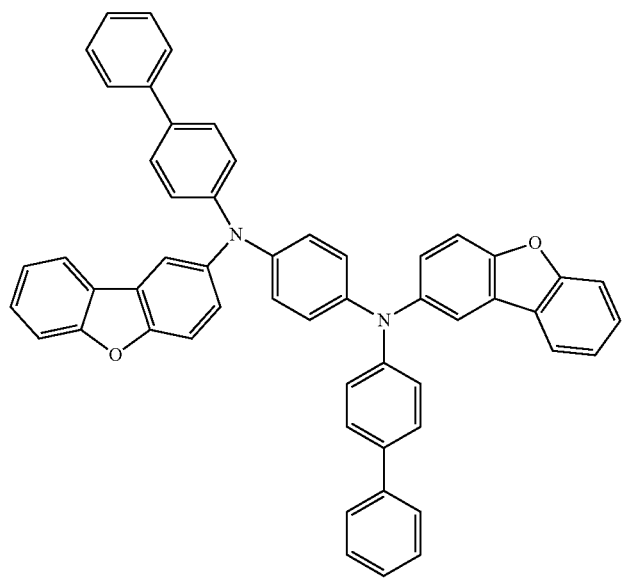
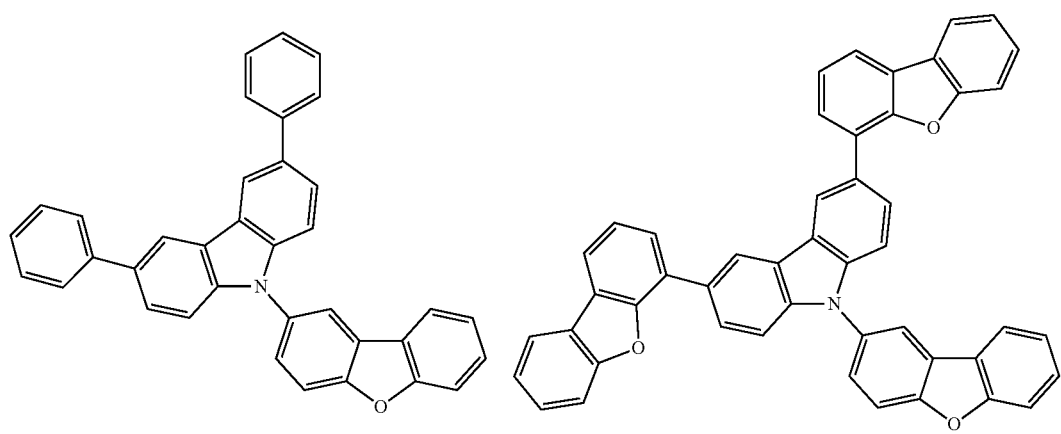
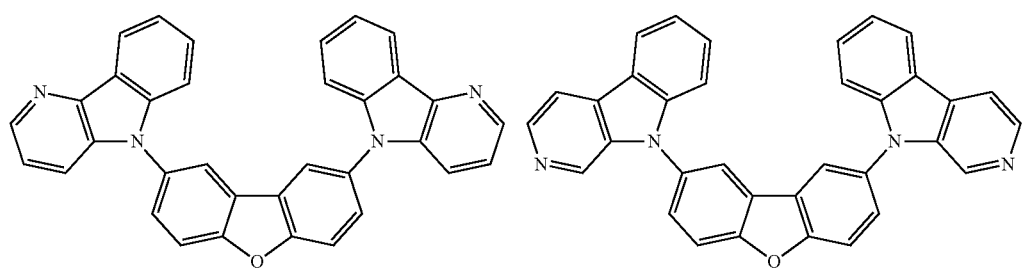

-continued
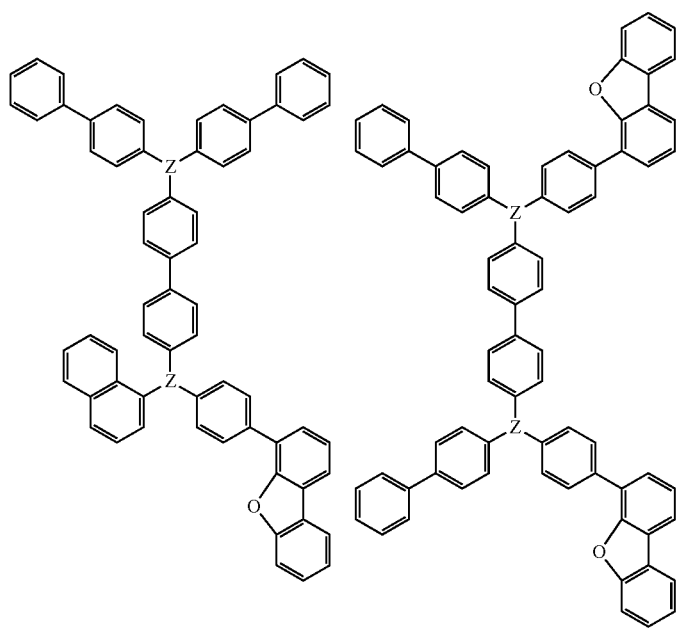
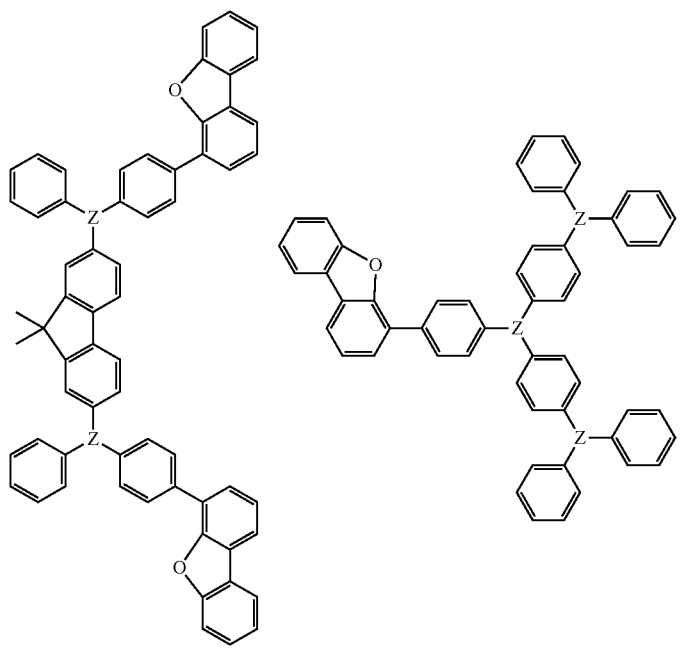

-continued
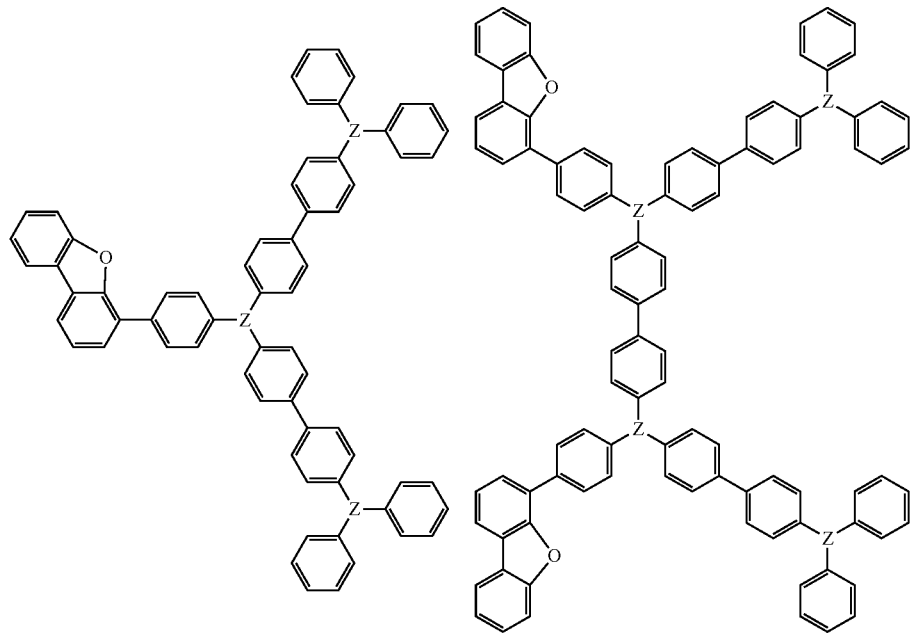
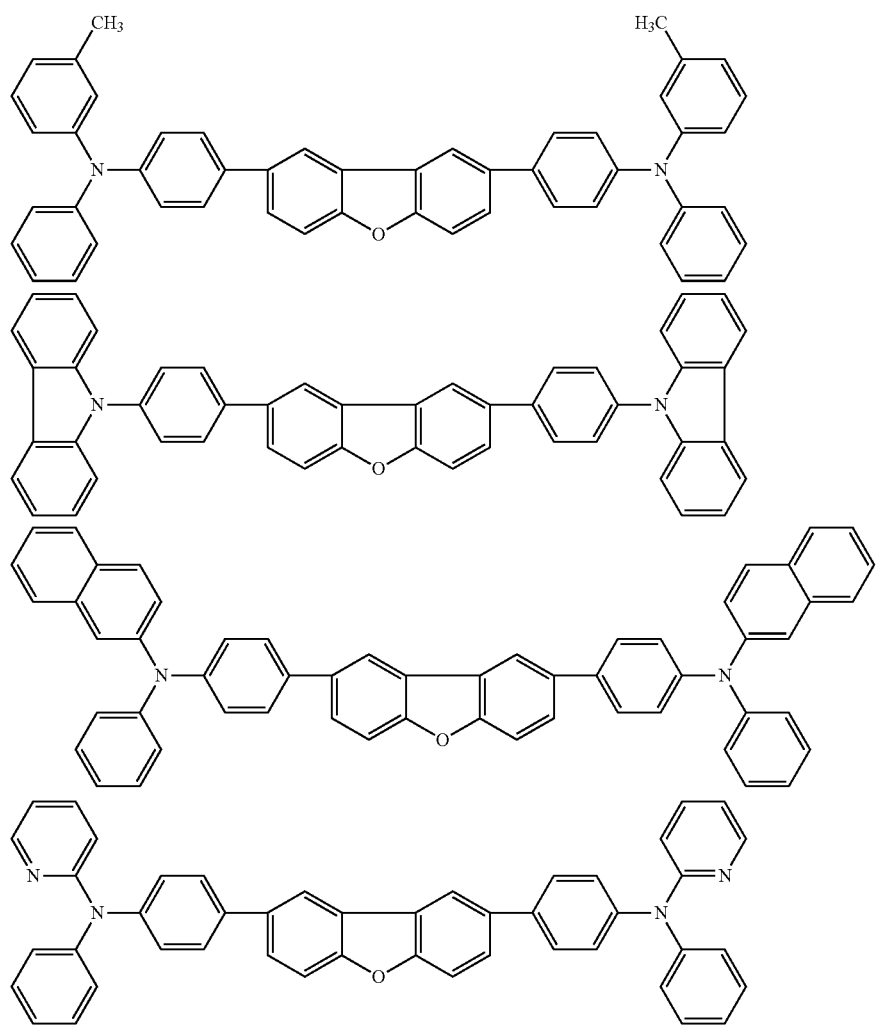

-continued
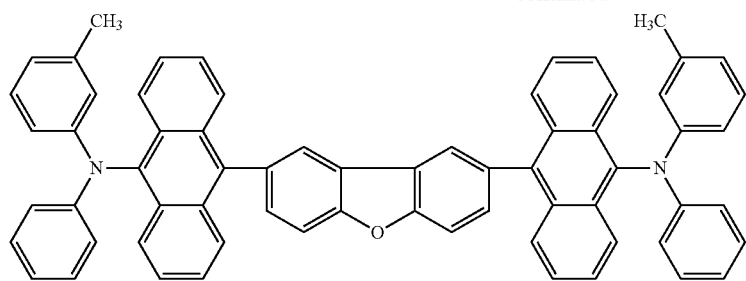
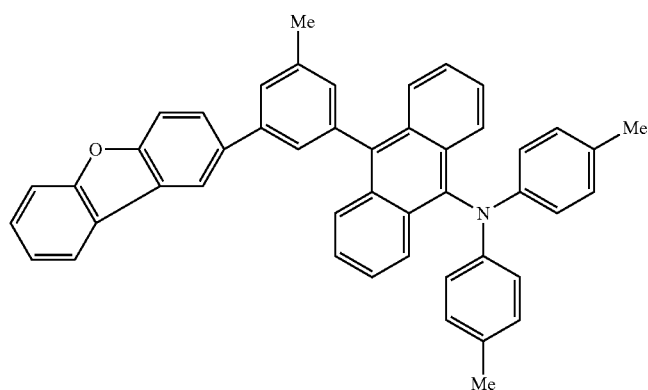
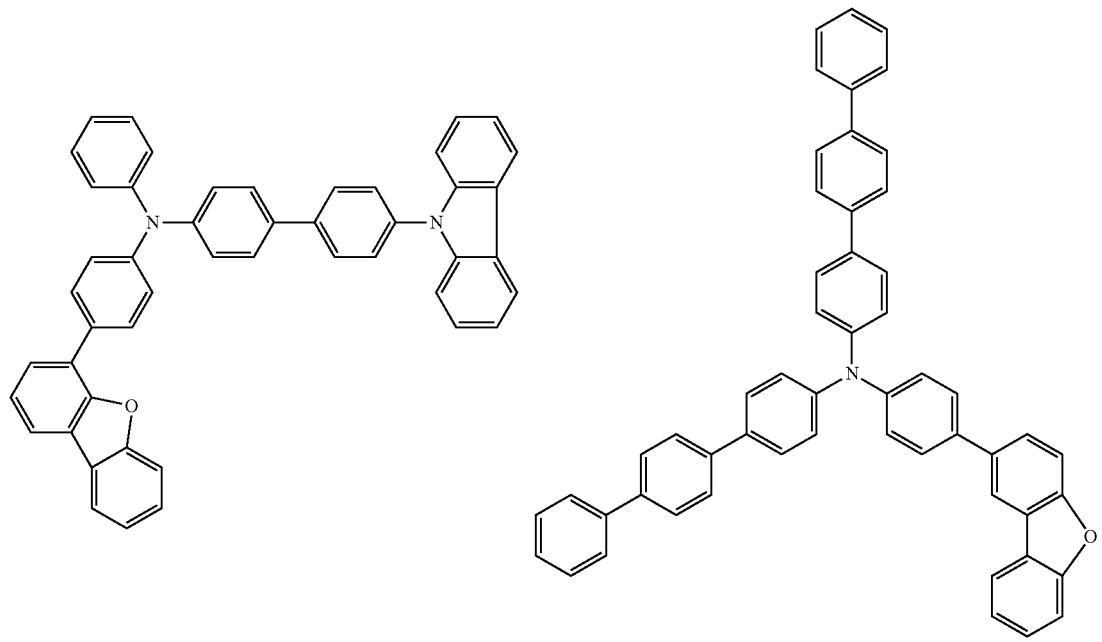

-continued
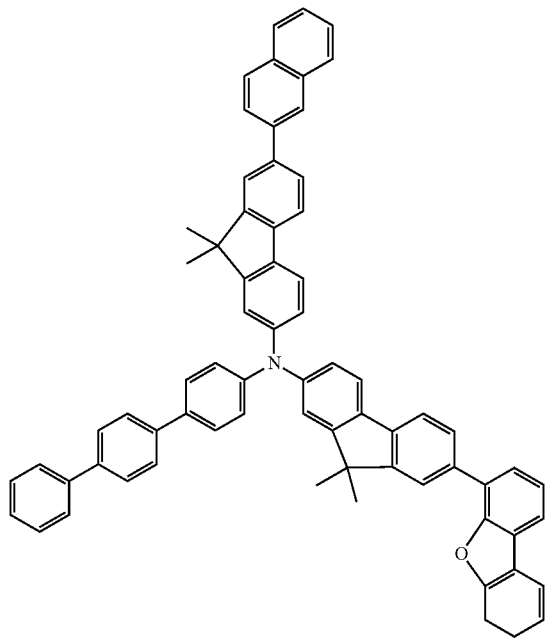
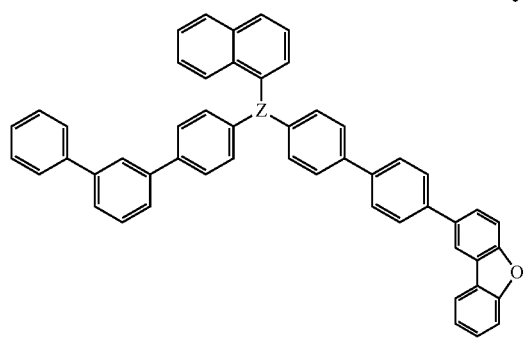
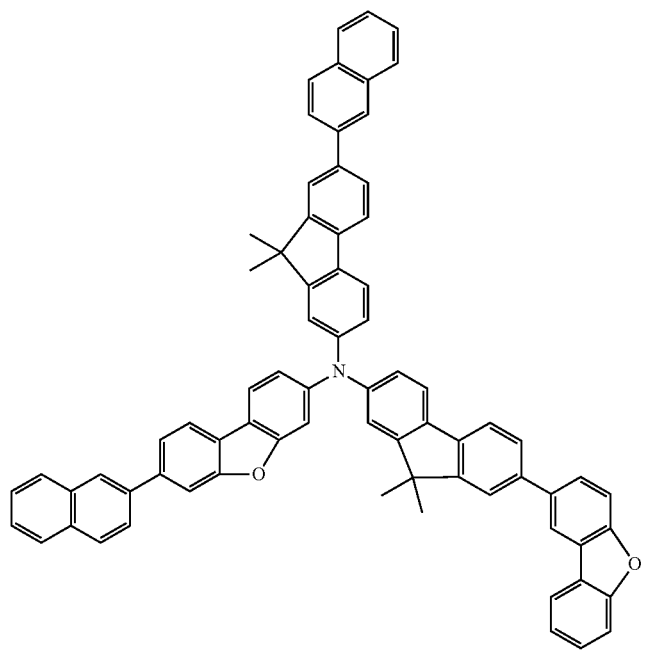

-continued
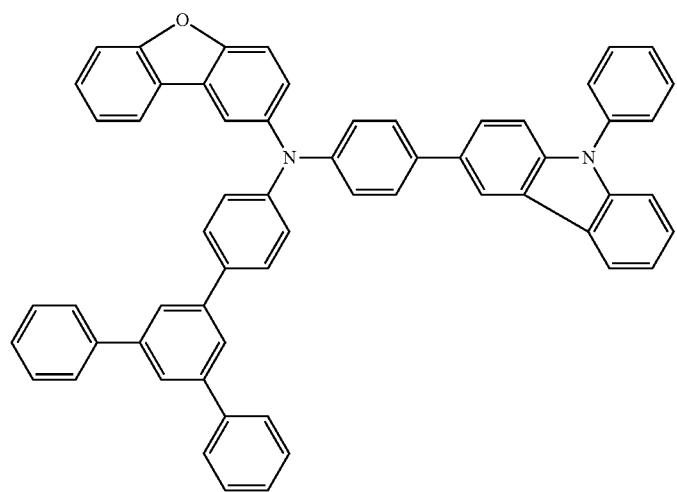
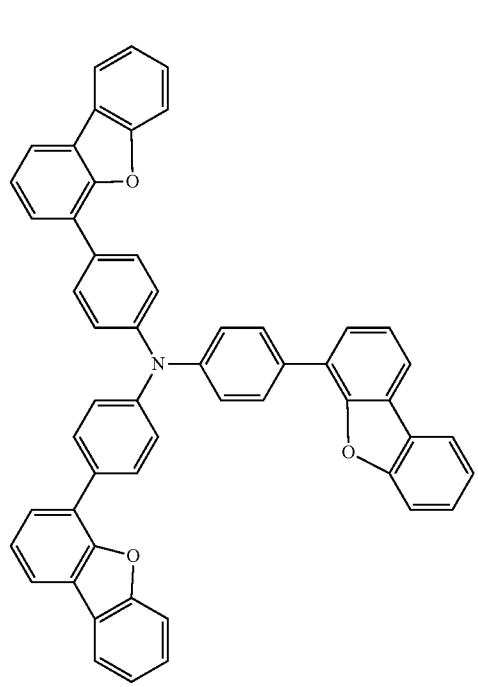
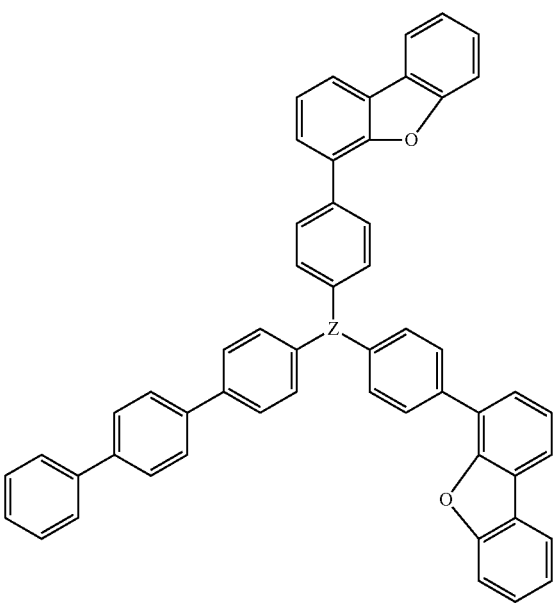

-continued
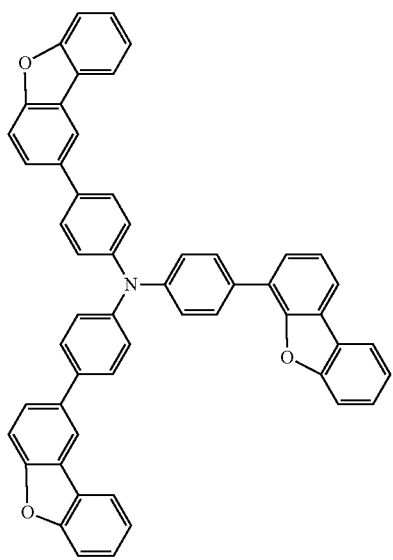
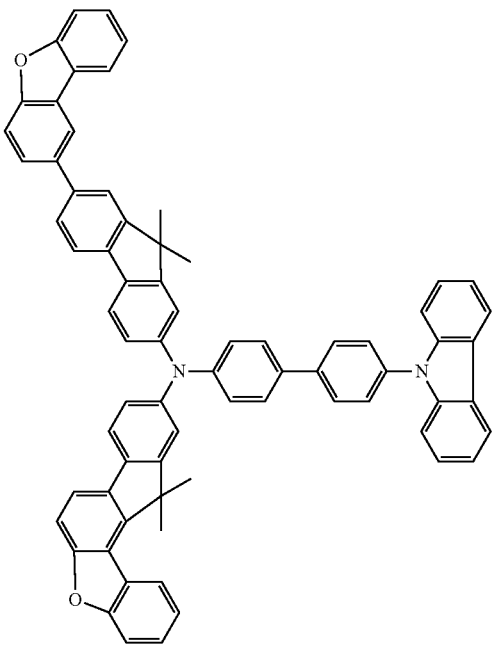
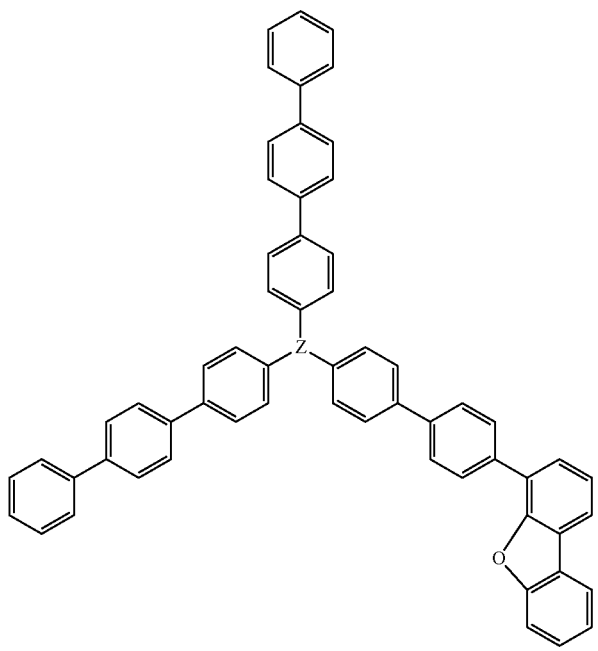
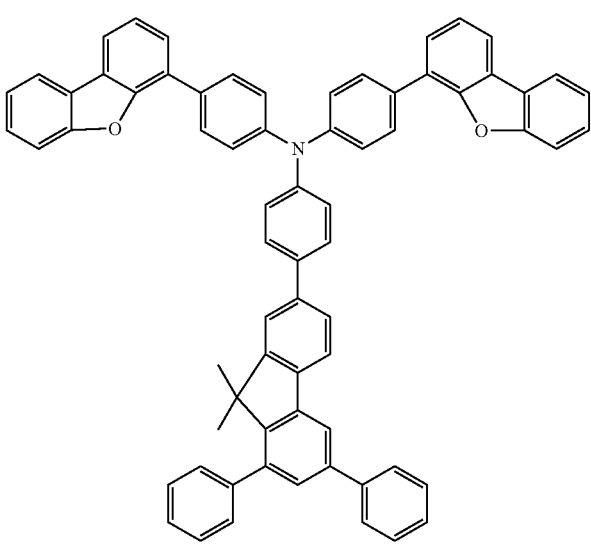

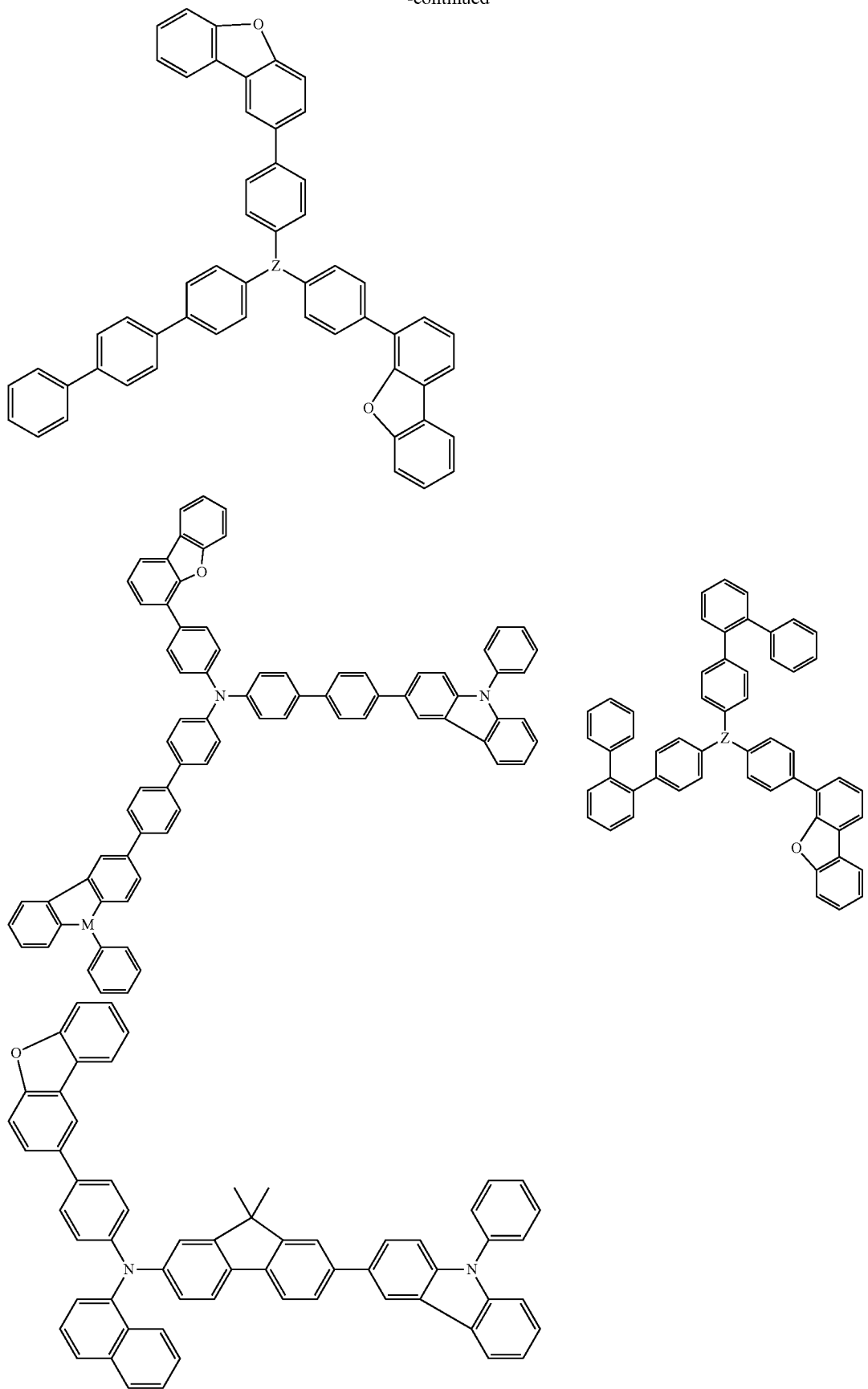

-continued
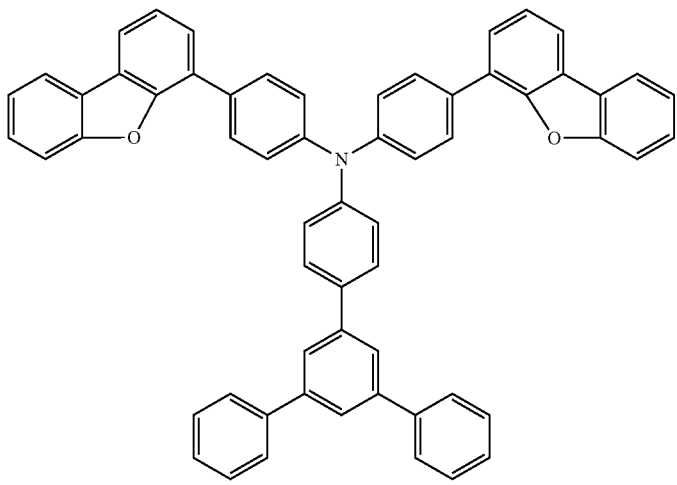
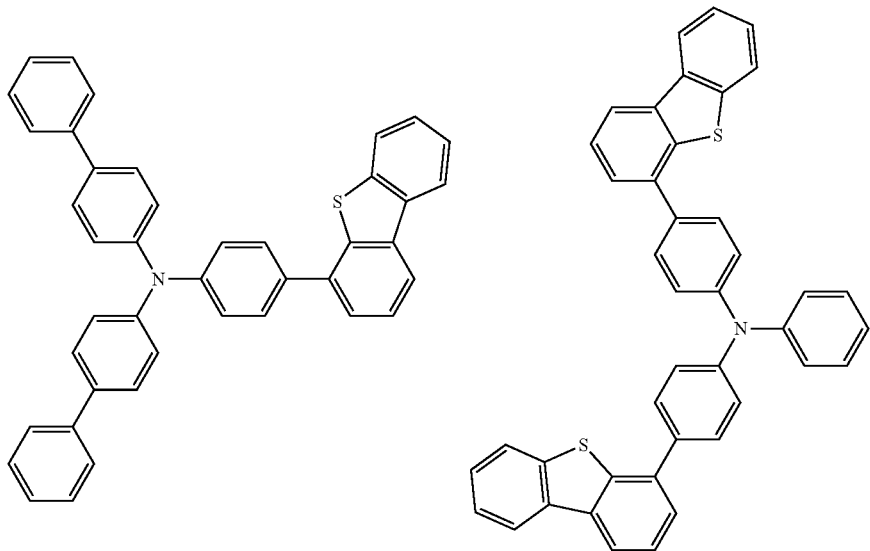
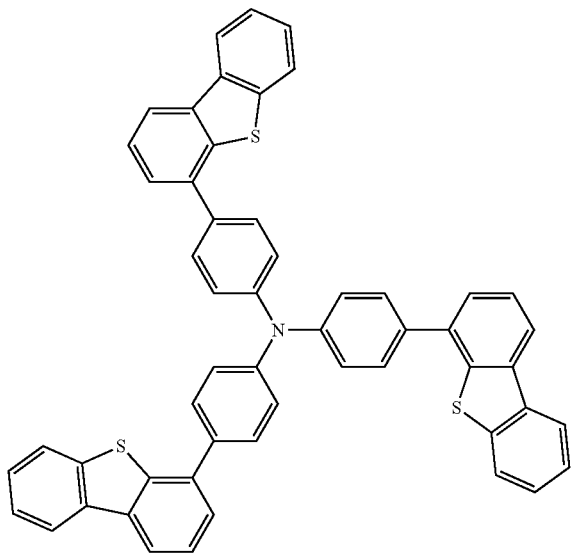

-continued

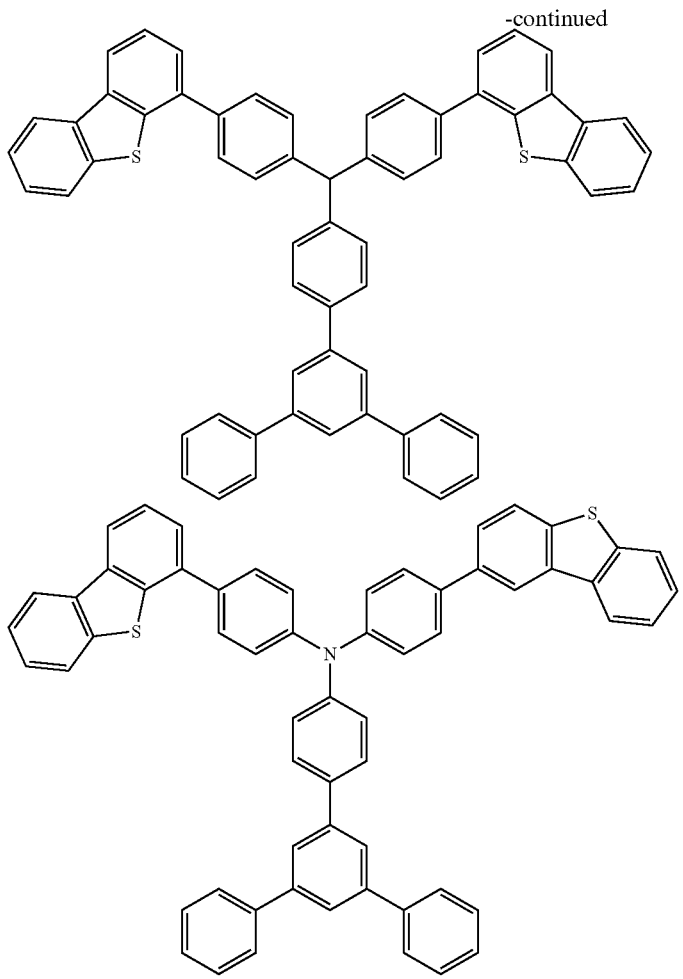

As for the compound represented by the formula (1), reference can be made to JP-A-2006-151844, JP-A-2008-021687, WO2007/125714, WO2010-061824 and JP-A-2005-112765, for example.

It is desired that the thickness of the intermediate layer be 0.1 nm to 20 nm, preferably 5 to 10 nm. By using the compound represented by the formula (1) as the intermediate layer, supply of electrons to the anode-side emitting layer and blocking of electrons in the interface between the cathode-side emitting layer and the intermediate layer can be conducted in a well-balanced manner. As a result, the thickness of the intermediate layer can be larger as compared with the thickness of conventional intermediate layers.

The content of the compound represented by the formula (1) in the intermediate layer is not particularly restricted. The content is preferably 1 to 100 wt %, more preferably 80 to 100 wt %, with 100 wt % being particularly preferable.

As for other compounds usable in the intermediate layer, host materials for the emitting layer (mentioned later) or compounds that can be used in a hole-transporting zone or an electron-transporting zone can be given.

It suffices that the organic EL device of the invention comprise the intermediate layer that comprises the compound represented by the formula (1) mentioned above. As for other configurations such as the anode, known configurations in the art can be used. One example of each element, and preferable examples of each element in the invention will be explained below.

[Substrate]

As for the substrate, a supporting substrate that serves as a base of the device, a substrate that is formed so as to cover the device in order to protect the device, or the like can be given.

As the substrate, a high-strain-point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various glass substrates on which an insulating film is formed on the surface thereof, a quarts substrate, a quarts substrate on which an insulating film is formed on the surface thereof, a silicon substrate on which an insulating film is formed on the surface thereof, a substrate of organic polymers such as polymethyl methacrylate(methylpolymethacrylate, PMMA) or polyvinylalcohol (PVA), polyvinyl phenol (PVP), polyethersulfone (PES), polyimide, polycarbonate (PC), polyethylene terephthalate (PET), polyethylene naphthalate (PEN) or polybutylene naphthalate (PBN) (in the form of a plastic film, a plastic sheet or a plastic substrate having flexibility and is made of a polymer material) and metal foil can be given. Meanwhile, if the substrate is formed of an organic polymer, in order to suppress water permeability or gas permeability, it is preferred that the substrate be of a stacked layer structure or that the substrate be subjected to a surface treatment.

[Anode]

As for the anode (anode electrode), in order to allow holes to be injected efficiently, it is preferable to use an electrode material having a large work function from the vacuum level. Specifically, for example, a metal or an alloy having a high work function such as platinum (Pt), gold (Au), silver (Ag), silver (Ag) alloy, chromium (Cr), tungsten (W), nickel (Ni), copper (Cu), iron (Fe), cobalt (Co), tantalum (Ta) (for example, an Ag—Pd—Cu alloy containing silver as a main component and containing 0.3 mass % to 1 mass % of palladium (Pd) and 0.3 mass % to 1 mass % of copper (Cu) or an Al—Nd alloy), an alloy of tin oxide ($SnO_2$) and antimony (Sb), an alloy of zinc oxide (ZnO) and aluminum (Al) can be given. Oxides or the like of these metals or alloys can be used singly or in a mixture.

The anode (anode electrode) may be of a stacked layer structure of a first layer that has excellent light reflectivity and a second layer that has light transmittance and a large work function. The second layer is positioned nearer to the side of the organic layer stacked structure. In the first layer, it is preferable to use an alloy that comprises aluminum (Al) as a main component. It is preferable to use, as a secondary component, an element having a relatively smaller work function than that of aluminum as the main component. As the secondary component, a lanthanoid-based element can be given. Although the work function of a lanthanoid-based element is not large, due to the presence of these elements, the stability of the anode is improved, and the hole-injecting properties of the anode are also improved. Further, as the secondary component, in addition to a lanthanoid-based element, an element such as silicon (Si), copper (Cu), nickel (Ni) and titanium (Ti) may be used.

As for the content of the secondary component in the Al alloy layer that constitutes the first layer of the anode, if the secondary component is neodymium (Nd), nickel (Ni) or titanium (Ti) or the like that stabilizes aluminum, it is preferred that the total content of the secondary components be about 10 mass % or less. Due to this amount, while keeping the reflectivity of the aluminum alloy layer as the first layer, the aluminum alloy layer can be kept stably in the production process of an organic EL device. Further, high processing accuracy and chemical stability can be obtained. In addition, the conductivity of the anode and, for example, the adhesiveness to the first substrate can be improved. Meanwhile, a metal such as neodymium (Nd) has a small work function, when an amine-based material that is commonly used is used in a hole-supplying layer, a hole-injection barrier becomes large. In such a case, by mixing an acceptor material such as 7,7,8,8-tetracycano-2,3,5,6-tetrafluoroquinodimetane (F4-TCNQ) with an amine-based material or by forming a p-doped layer such as polyethylenedioxythiophene-polystyrenesulfonic acid (PEDOT-PSS) in the interface of the anode, a hole-injection barrier is reduced, whereby an increase in driving voltage can be suppressed. As other methods, by using an azatriphenylene derivative, it becomes possible to stabilize an organic EL device while suppressing an increase in driving voltage.

The second layer of the anode may be formed of an oxide of an Al alloy, an oxide of molybdenum (Mo), an oxide of zirconium (Zr), an oxide of chromium (Cr) or an oxide of tantalum (Ta). For example, if the second layer is formed of an oxide layer (including a naturally oxidized film) of an aluminum alloy that contains a lanthanoid-based element as the secondary component, since an oxide of a lanthanoid-based element has high light transmittivity, the light transmittivity of the second layer that comprises this oxide becomes excellent. As a result, the light transmittivity at the surface of the first layer is kept high. Further, by forming the second layer of a transparent conductive layer such as ITO (Indium Tin Oxide) or IZO (Indium Zinc Oxide), electron-injection properties of the anode can be improved. Since ITO and IZO have a large work function, for example, by using them in the side that is in contact with the first substrate, that is, in the first layer, carrier injection efficiency can be enhanced, and adhesiveness between the anode and the first substrate can be improved.

[Cathode]

The cathode (cathode electrode) has a thickness of 2 nm to 15 nm, for example, and is formed of a material that has excellent light transmittance and has a small work function. The cathode may be a single layer or may have a two-layer structure. If the cathode is formed into a two-layer structure, when a second layer is positioned nearer to the organic layer stacked structure, it is preferred that the first layer be formed of a material having a small work function and having excellent light transmittance. Specifically, as the material that constitutes the first layer, for example, an alkali metal oxide an alkali metal fluoride, an alkaline earth metal oxide and an alkaline earth metal fluoride such as $Li_2O$, $Cs_2Co_3$, $Cs_2SO_4$, MgF, LiF or $CaF_2$, can be given. Further, as the material having light transmittance and excellent electrical conductivity that constitutes the second layer, a material such as Mg—Ag (Mg:Ag=5:1 to 30:1 in terms of volume ratio, for example) or Mg—Ca (Mg:Ca=2:1 to 10:1 in terms of volume ratio, for example), Ca or the like can be given. The first and second layers can be formed by a vacuum vapor deposition method, a sputtering method, a plasma CVD method or the like.

The cathode can be formed of a mixture layer that contains an organic emitting material such as an aluminoquinoline complex, a styrylamine derivative and a phthalocyanine derivative. In this case, a layer formed of Mg—Ag that has light transmittance may further be provided. The structure of the cathode is not limited to the above-mentioned stacked layer structure, and an optimum combination or stacked structure may be used in accordance with the structure of an organic EL device or a display to be fabricated. For example, a cathode having the two-layer structure has a stacked layer structure in which the functions of electrodes are separated, i.e. an inorganic layer (first layer) that accelerates injection of electrons to the organic layer stacked structure and an inorganic layer (second layer) that fulfils functions as an electrode. However, the inorganic layer that accelerates injection of electrons to the organic layer stacked structure may also serve as the inorganic layer that fulfils functions as an electrode. In such a case, the cathode may be of a single layer structure. A transparent electrode layer such as ITO may be stacked on this single layer structure to obtain a cathode with a stacked layer structure.

If the organic EL device has a cavity structure (resonator structure), it is preferred that the electrode from which light is outcoupled be formed of a semi-transmissive/semi-reflective material. Due to such a configuration, emitted light that is subjected to multiple interference between the light-reflective surface of one electrode and the light-reflective surface of the other electrode can be outcoupled through an electrode formed of a semi-transmissive/semi-reflective material. In this case, the optical length between the light-reflective surface of one electrode and the light-reflective surface of the other electrode can be specified by the wavelength of light to be outcoupled, and the film thickness of each layer is set such that this optical length is satisfied. In such a display, due to the use of a cavity structure, light-outcoupling efficiency to the outside can be improved, and the emission spectrum can be controlled.

[Organic Stacked Layer Structure]

In the invention, the organic layer stacked structure is a stacked body that comprises a plurality of emitting layers and at least one layer of the above-mentioned intermediate layers. The organic layer stacked structure may have one or more hole-supplying layers (often referred to as the "hole-injecting layer" or the "hole-transporting layer") and others between the anode and the emitting layer that is nearest to the anode (hole-transporting region), or may have one or more electron-transporting layer (often referred to as the "electron-injecting layer" or the "electron-supplying layer") and others between the cathode and the emitting layer nearest to the cathode (electron-transporting region).

The organic layer stacked structure may contain an inorganic compound in a part thereof.

1. Emitting Layer

The emitting layer is a region where holes injected from the anode side and electrons injected from the cathode side are recombined when an electrical field is applied to the anode and the cathode.

The device of the invention has two emitting layers that emit light of colors different from each other. When the emitting layer is formed into a three-layer structure, it may be a structure of a red-emitting layer, a green-emitting layer and a blue-emitting layer. The order of stacking the red-emitting layer, the green-emitting layer and the blue-emitting layer may be appropriately determined from the optical length path adjustment that is in accordance with the carrier transporting properties of each emitting layer and the emission wavelength of outcoupled light.

The thickness of the entire emitting layer varies depending on the entire configuration of the organic EL device, but is desirably 3 nm to 30 nm, preferably 5 nm to 20 nm. For example, as the thickness of the red-emitting layer, 5 nm to 15 nm can be exemplified. As the thickness of the green-emitting layer, 5 nm to 15 nm can be exemplified. As the thickness of the blue-emitting layer, 5 nm to 15 nm can be exemplified. The thickness of each emitting layer is not restricted thereto.

It is preferred that the material for constituting the emitting layer have a charge-injection function (a function of injecting holes from the anode or the hole-supplying layer and injecting electrons from the cathode or the electron-supplying layer at the time of application of an electric field), a transporting function (a function of moving holes and electrons injected by the force of an electronic field) and a function of emission (a function of allowing electrons and holes to be recombined to emit light).

In the invention, the emitting layer may be a fluorescent emitting layer or a phosphorescent emitting layer.

As the host material that constitutes a fluorescent emitting layer, for example, a styryl derivative, an anthracene derivative, a naphthacene derivative or an aromatic amine can be given.

As the styryl derivative, a distyryl derivative, a tristyryl derivative, a tetrastyryl derivative and a styrylamine derivative can be mentioned.

As the anthracene derivative, an asymmetrical anthracene-based compound can be given. This compound can keep excellent carrier balance.

As the aromatic amine, a compound that has 2 to 4 nitrogen atoms and is substituted by an aromatic ring group can be given.

In the device of the invention, it is preferred that at least one emitting layer among a plurality of emitting layers contain an anthracene derivative as a host material.

As the anthracene derivative, a compound represented by the following formula (3) is preferable.

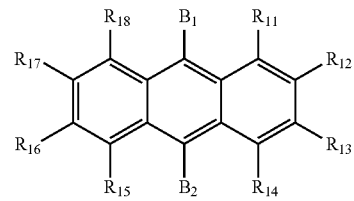

(3)

In the formula (3), $B_1$ and $B_2$ are independently a substituted or unsubstituted aromatic hydrocarbon group including 6 to 20 ring carbon atoms. Specifically, the same groups as the aromatic hydrocarbon groups exemplified above referring to the compound represented by the formula (1) can be given. A phenyl group, a naphthyl group, a phenanthryl group, a pyrenyl group, a chrysenyl group, a benzanthryl group, a benzo[c]phenanthryl group, a benzo[g]crysenyl group, a triphenylenyl group, a fluorenyl group, a benzofluorenyl group, a dibenzofluorenyl group, a biphenyl group, a terphenyl group, a fluoranthenyl group or the like can preferably be given.

As the substituent of the aromatic hydrocarbon group, the same substituents as those exemplified referring to the formula (1) can be given.

$R_{11}$ to $R_{18}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsilyl group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

As specific examples of these groups, the same groups as those given above as the examples of the compound represented by the formula (1) can be given.

The alkoxy group including 1 to 20 carbon atoms is represented by —OY. As examples of Y, the examples of alkyl mentioned above can be given. Specific examples of the alkoxy group include a methoxy group and an ethoxy group, or the like.

The aryloxy group including 6 to 20 ring carbon atoms is represented by —OZ. As examples of Z, the examples of the aryl group mentioned above can be given. Specific examples of the aryloxy group include a phenoxy group and a naphthyloxy group, for example.

It is preferred that $R_{11}$ to $R_{18}$ be independently a hydrogen atom or a substituted or unsubstituted alkyl group including 1 to 10 carbon atoms.

Specific examples (5-1 to 5-64) of the compound represented by the formula (3) are shown below.
(5-1)
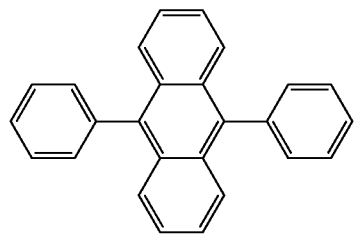
(5-2)
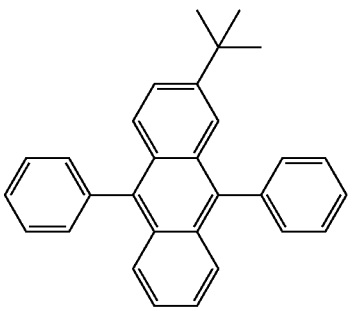
(5-3)
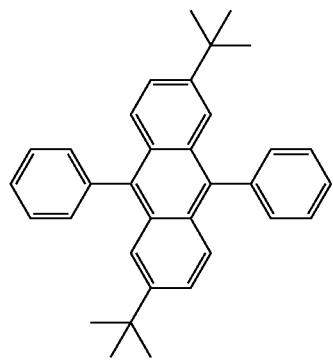
(5-4)
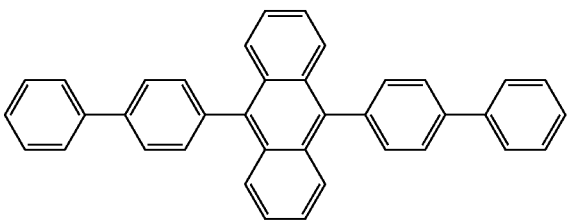
(5-5)
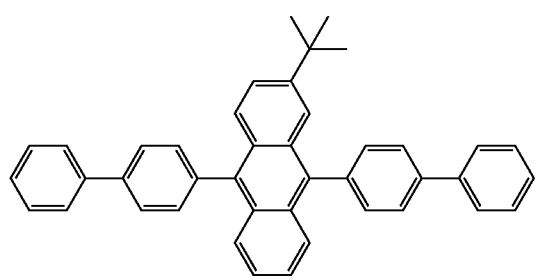
(5-6)
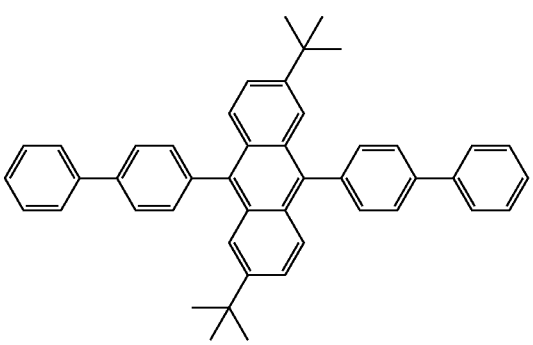
(5-7)
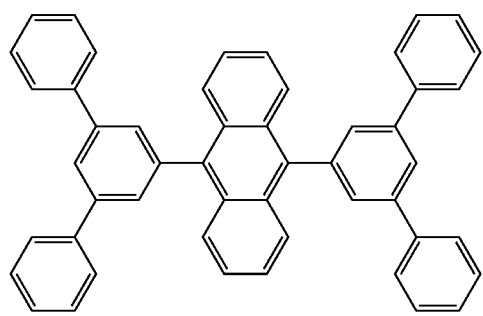
(5-8)
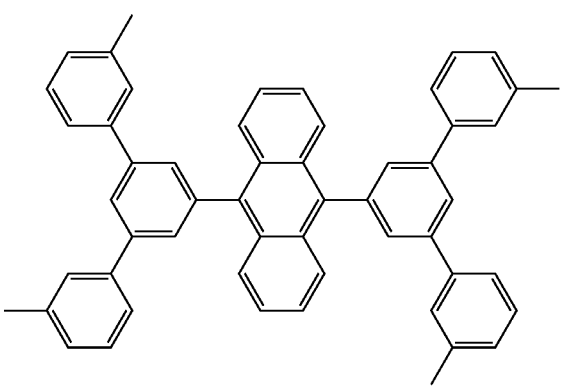

(5-9)
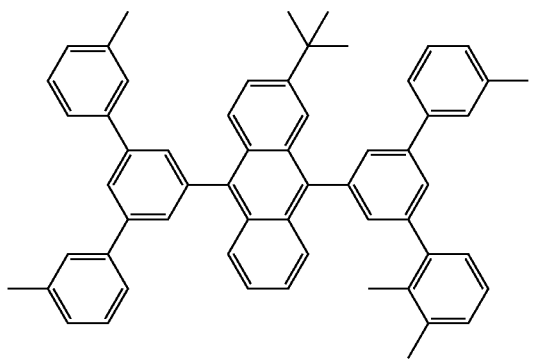
(5-10)
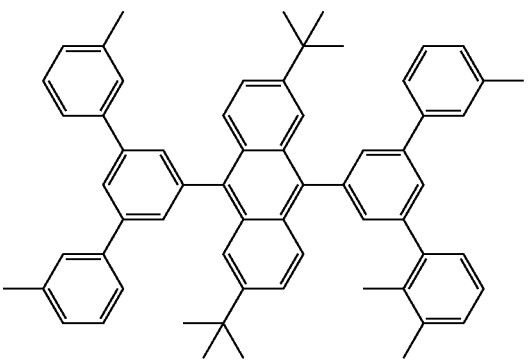
(5-11)
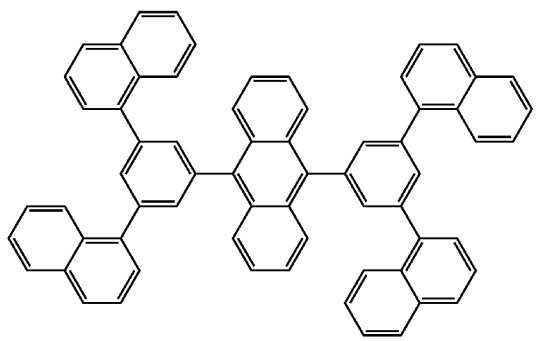
(5-12)
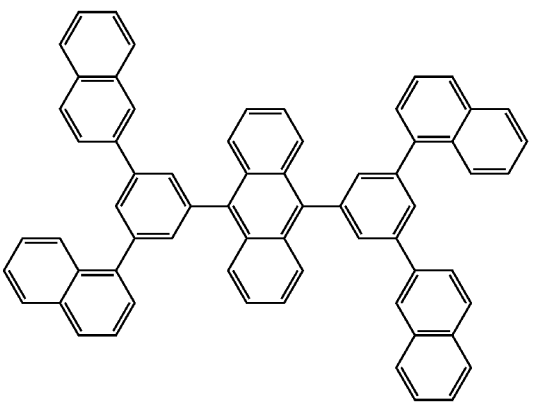
(5-13)
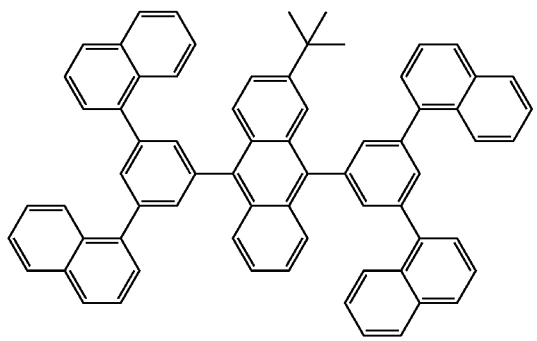
(5-14)
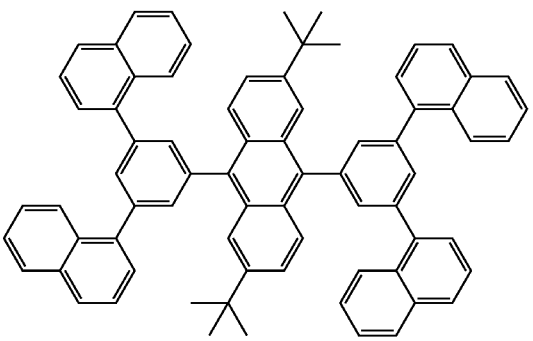
(5-15)
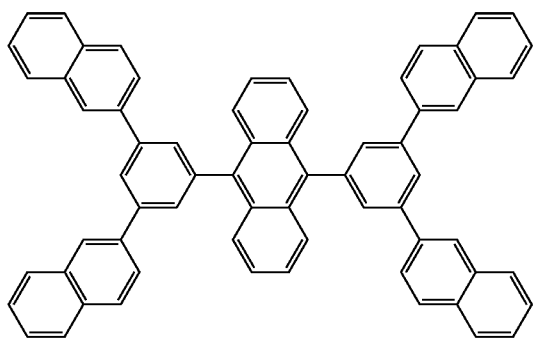

-continued
(5-17)
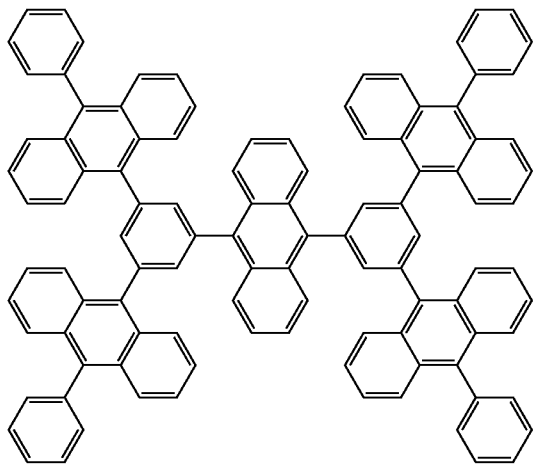
(5-18)
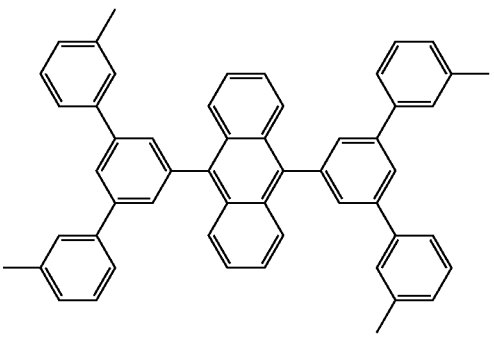
(5-19)
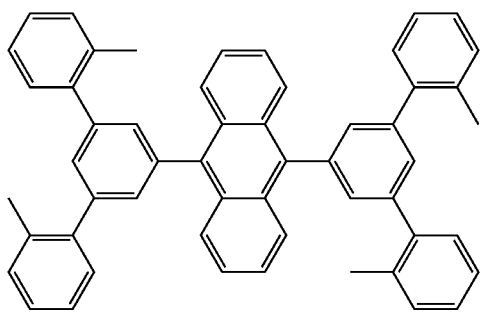
(5-20)
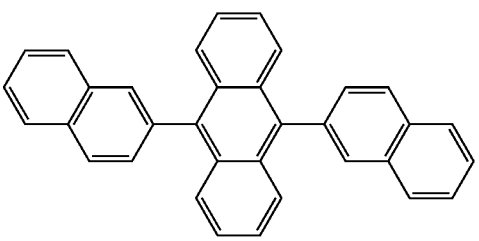
(5-21)
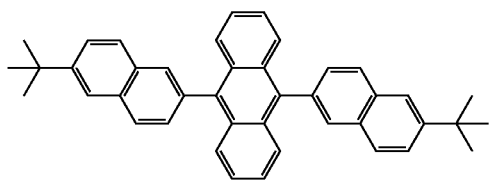
(5-22)
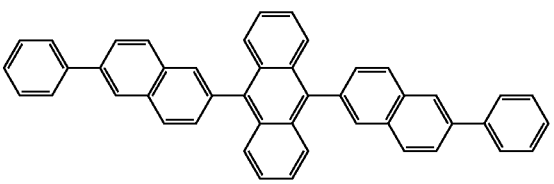
(5-23)
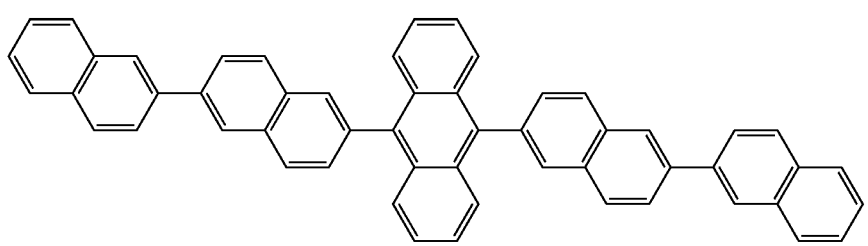
(5-24)
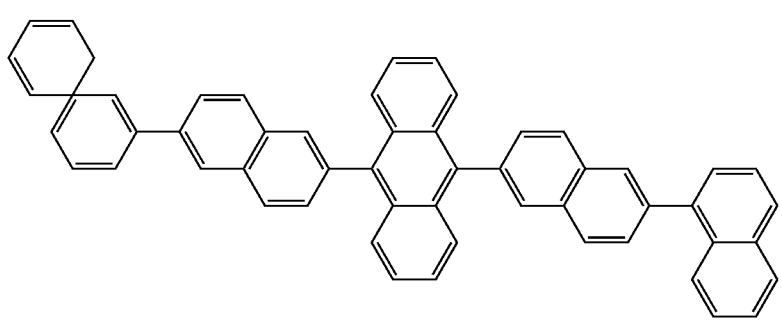

(5-25)
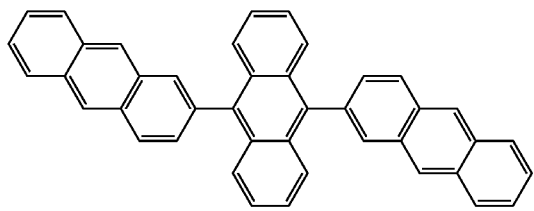
(5-26)
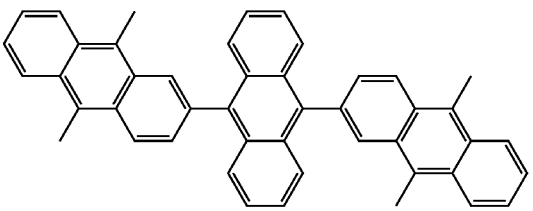
(5-27)
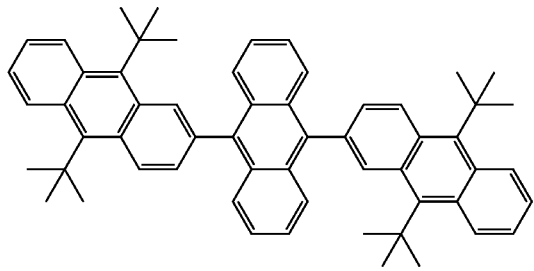
(5-28)
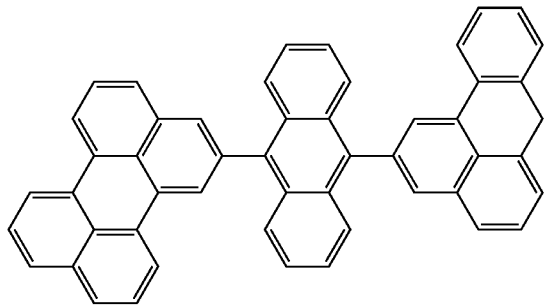
(5-29)
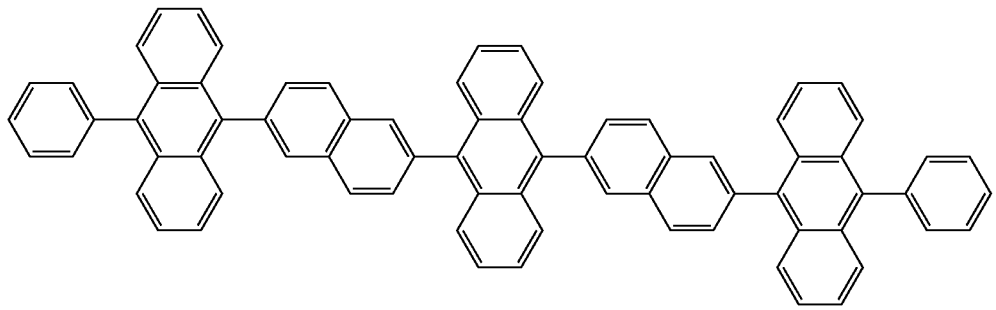
(5-30)
(5-31)
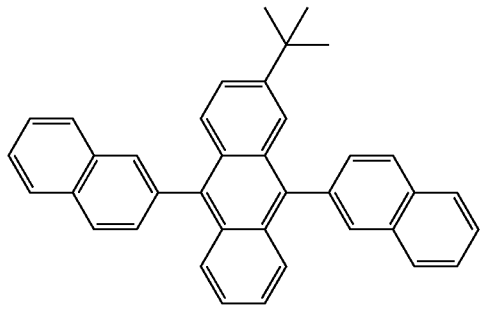
(50=-32)
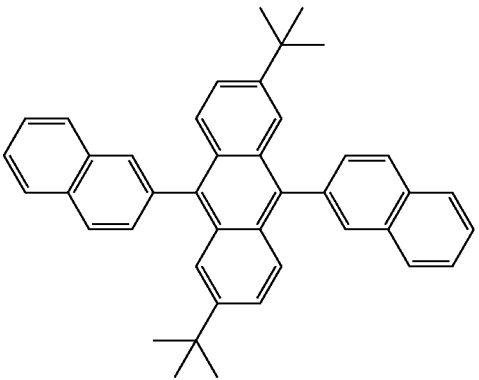

-continued
(5-33)
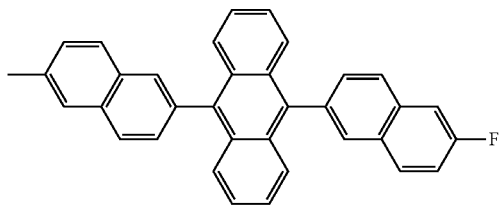
(5-34)
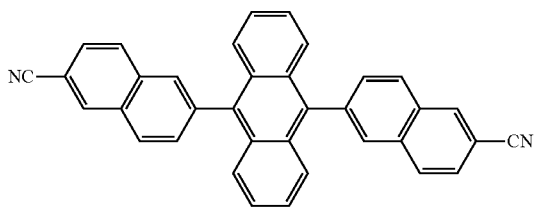
(5-35)
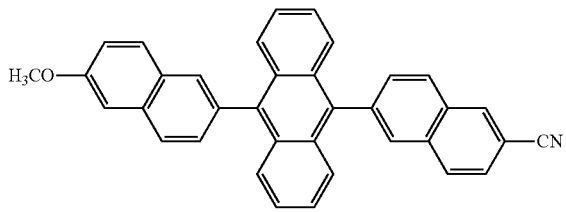
(5-36)
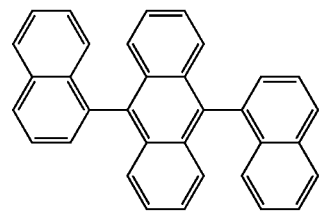
(5-37)
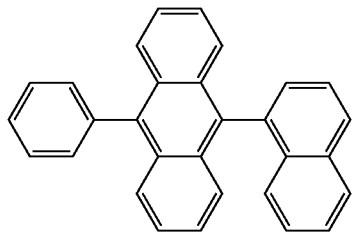
(5-38)
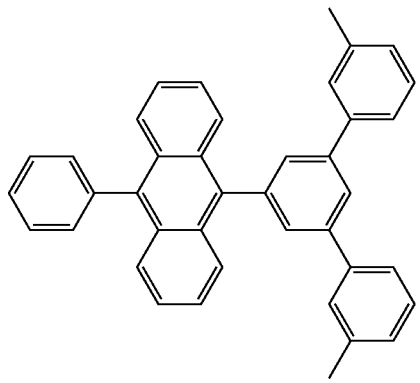
(5-39)
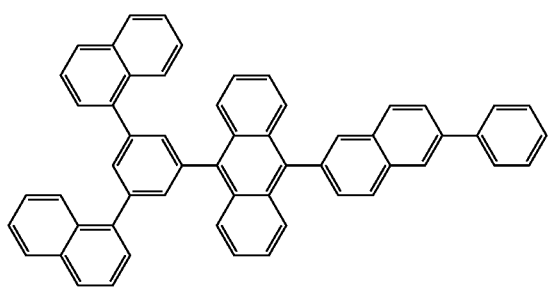
(5-40)
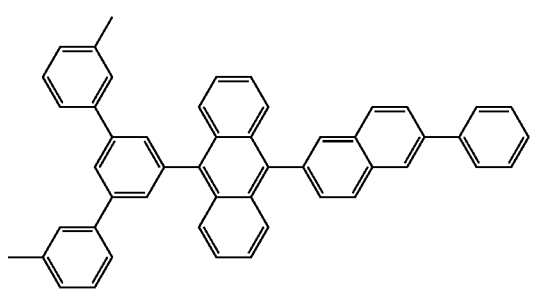
(5-41)
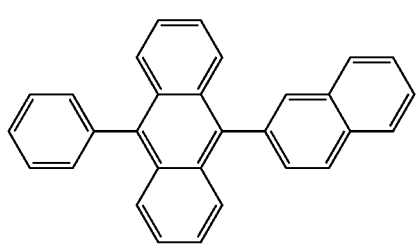
(5-42)
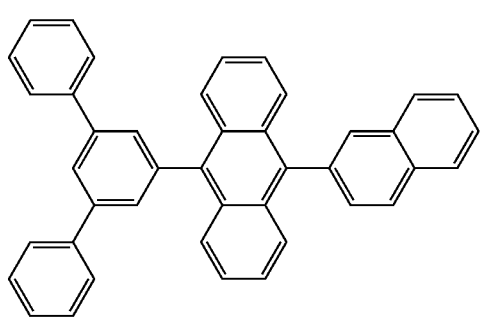

(5-43)
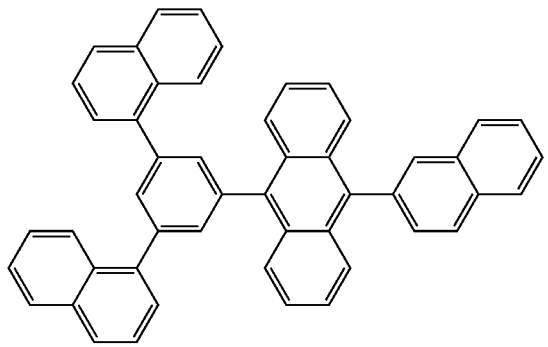
(5-44)
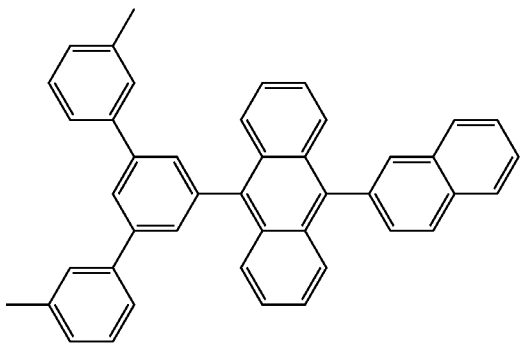
(5-45)
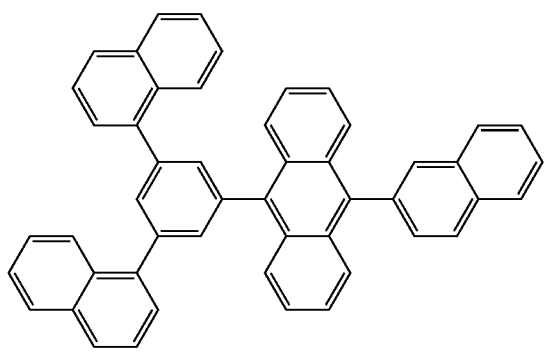
(5-46)
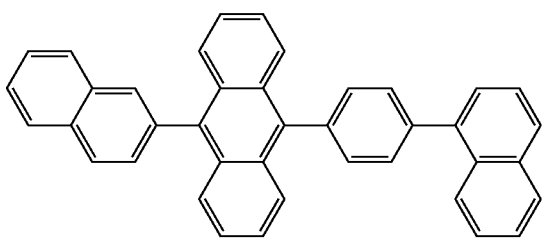
(5-47)
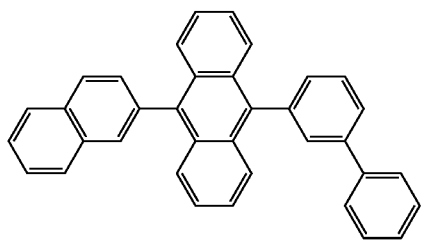
(5-48)
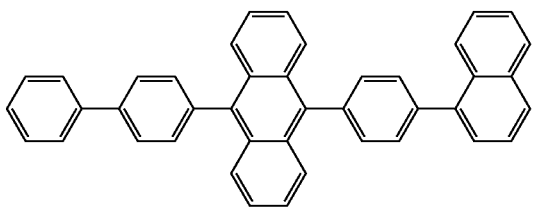
(5-49)
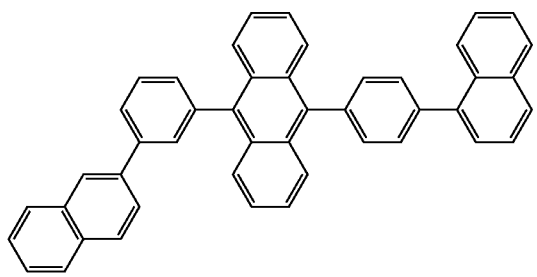
(5-50)
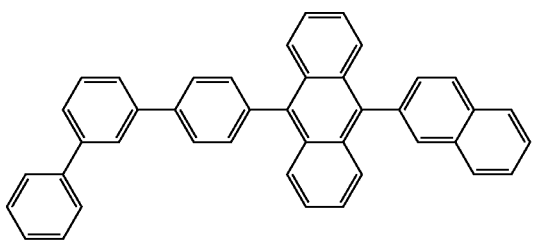
(5-51)
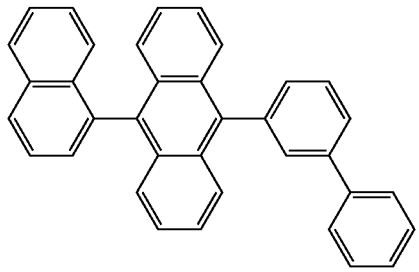
(5-52)
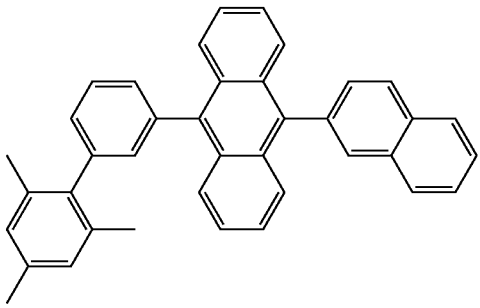

(5-53)
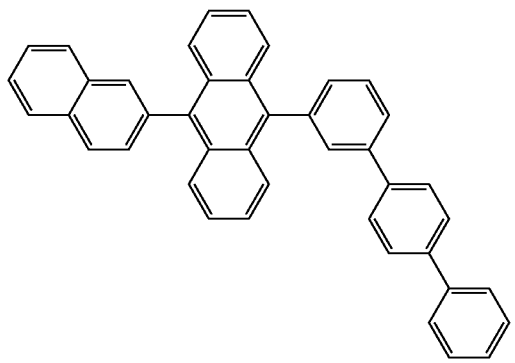
(5-54)
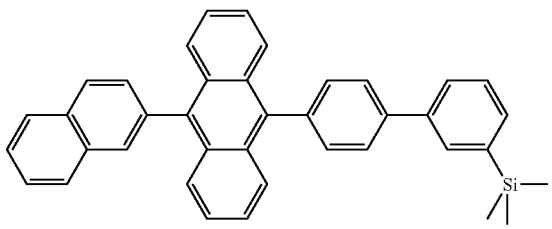
(5-55)
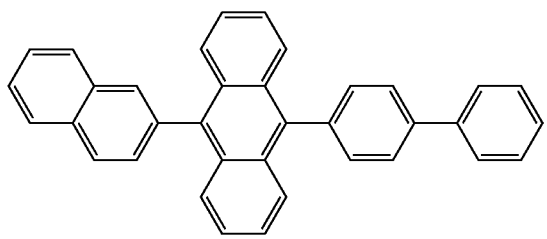
(5-56)
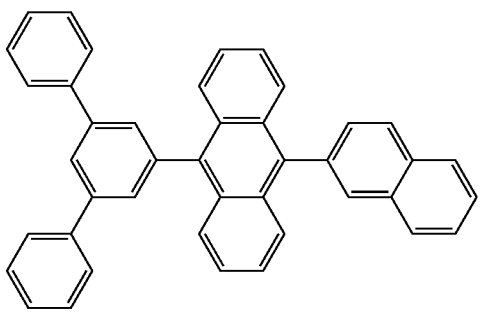
(5-57)
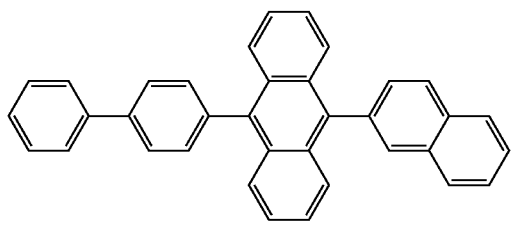
(5-58)
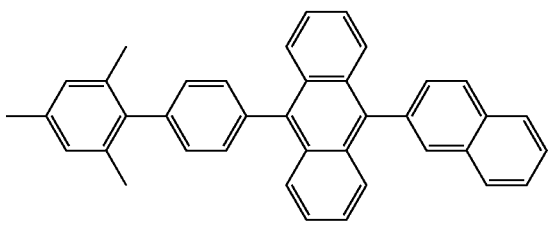
(5-59)
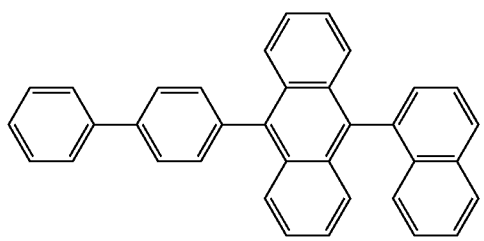
(5-60)
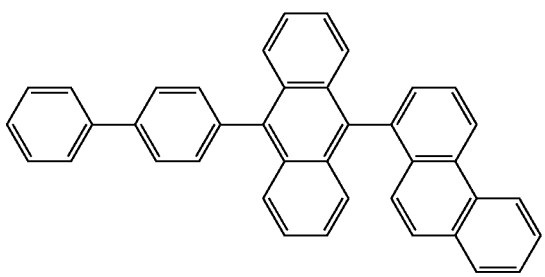
(5-61)
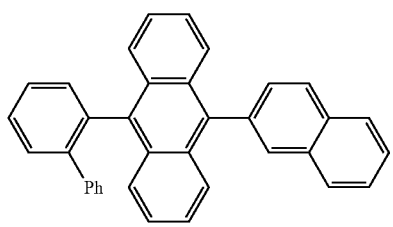
(5-62)
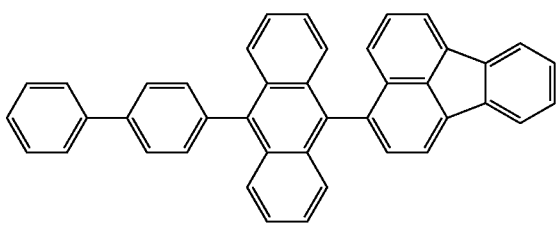

(5-63) 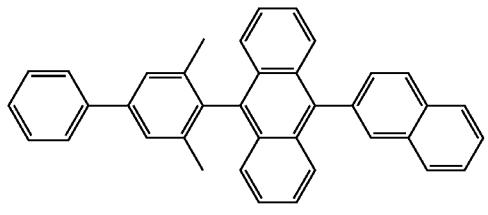

(5-64) 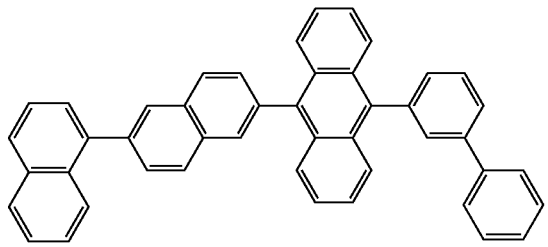

In the invention of the device, it is preferred that, among plural emitting layers, at least one layer of emitting layers other than the emitting layer that comprises an anthracene derivative as the host material comprise a material having an ionization potential of less than 5.6 eV as a host material. Further, it is preferred that this emitting layer be positioned nearest to the anode among the plural emitting layers. As a result, injection of holes from the anode is stabilized.

As the compound having an ionization potential of less than 5.6 eV (hole-transporting material), a polycyclic aromatic hydrocarbon compound having a 4 to 7-membered mother skeleton can be given. As the mother skeleton, pyrene, benzopyrene, chrysene, naphthacene, benzonaphthacene, dibenzonaphthacene, perylene or coronene is preferable.

More specifically, compounds represented by the following formula (4) can be exemplified. By using these compounds, holes are injected from the anode stably.

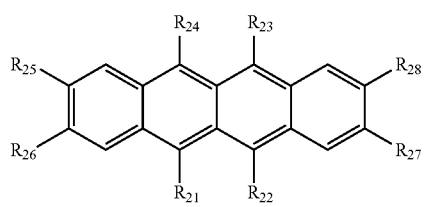
(4)

In the formula (4), $R_{21}$ to $R_{28}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsilyl group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

As specific examples of these groups, the same groups as those given above as examples of the compound represented by the formula (1) and the compound represented by the formula (3) can be given.

Specifically, the compound represented by the following formulas (6-1) to (6-5) can be given.

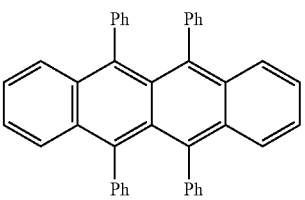
(6-1)

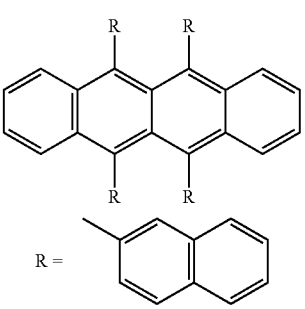
(6-2)

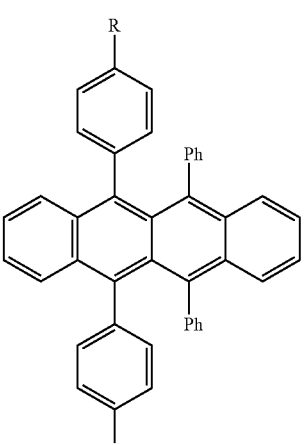
(6-3)

(6-4)

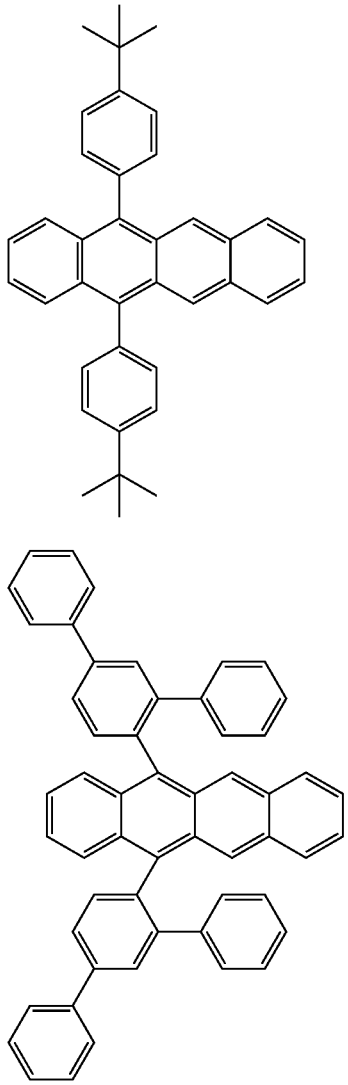

(6-5)

As the dopant material of the fluorescent emitting layer, a dye for a laser such as a styrylbenzene-based dye, an oxazole-based dye, a perylene-based dye, a coumarin-based dye and an acridine-based dye; a polycyclic aromatic hydrocarbon-based material such as an anthracene derivative, a naphthacene derivative, a pentacene derivative, a chrysene derivative, a diketo-pyrrolo-pyrrole derivative, a pyrane derivative and a styryl derivative; a pyrromethene skeleton-derivative; or a fluorescent material such as a metal complex, a quinacridone derivative, a cyanomethylenepyrane-based derivative (DCM, DCJTB), a benzothiazole-based compound, a benzoimidazole-based compound and a metal-chelated oxynoid derivatives or the like can be given.

The doping concentration of these fluorescent materials is preferably 0.5% or more and 15% or less in terms of film thickness ratio.

In the invention, it is preferred that the emitting layer that includes a hole-transporting material contain, as a dopant material, a perylene derivative, a diketo-pyrrolo-pyrrole derivative, a pyrromethene complex, a pyrane derivative or a styryl derivative.

The host that is preferable for use in the phosphorescent emitting layer is a compound that has a function of allowing a phosphorescent compound to emit light as a result of energy transfer from the excited state to the phosphorescent compound. No specific restrictions are imposed on the host compound, as long as it is a compound that has a large triplet energy gap and can transfer exciton energy to a phosphorescent compound. An appropriate host can be selected according to purpose. As specific examples of such a host compound, a fused ring compound formed of a combination of a benzene ring, a naphthalene ring or a heterocyclic ring; carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, anthraquinodimethane derivatives, anthrone derivatives, diphenylquinone derivatives, thiopyrandioxide derivatives, carbodiimide derivatives, fluorenylidene methane derivatives, distyrylpyrazine derivatives and heterocyclic tetracarboxylic anhydrides of naphthalene, perylene or the like; metal complexes of phthalocyanine derivatives and 8-quinolinol derivatives; various metal complex polysilane compounds represented by metal complexes having metal phthalocyanine, benzoxazole or benzothiazole as a ligand; poly(N-vinylcarbazole) derivatives; aniline-based copolymers; conductive high polymer oligomers such as thiophene oligomers and polythiophene; and polymer compounds such as polythiophene derivatives, polyphenylene derivatives, polyphenylene vinylene derivatives and polyfluorene derivatives can be given. The host compounds may be used alone or in combination of two or more. As specific examples, the following compounds can be given.

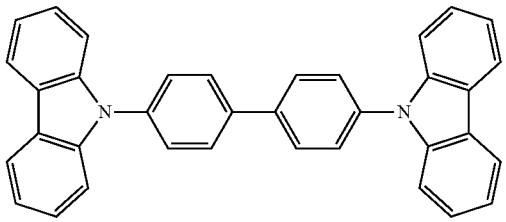

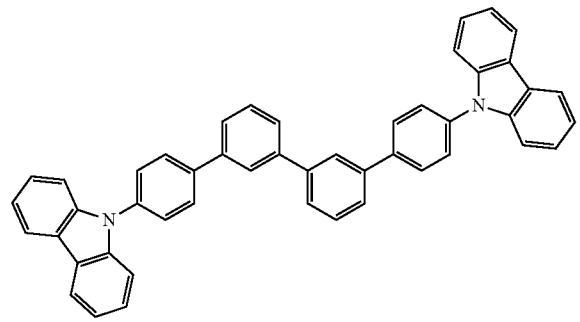

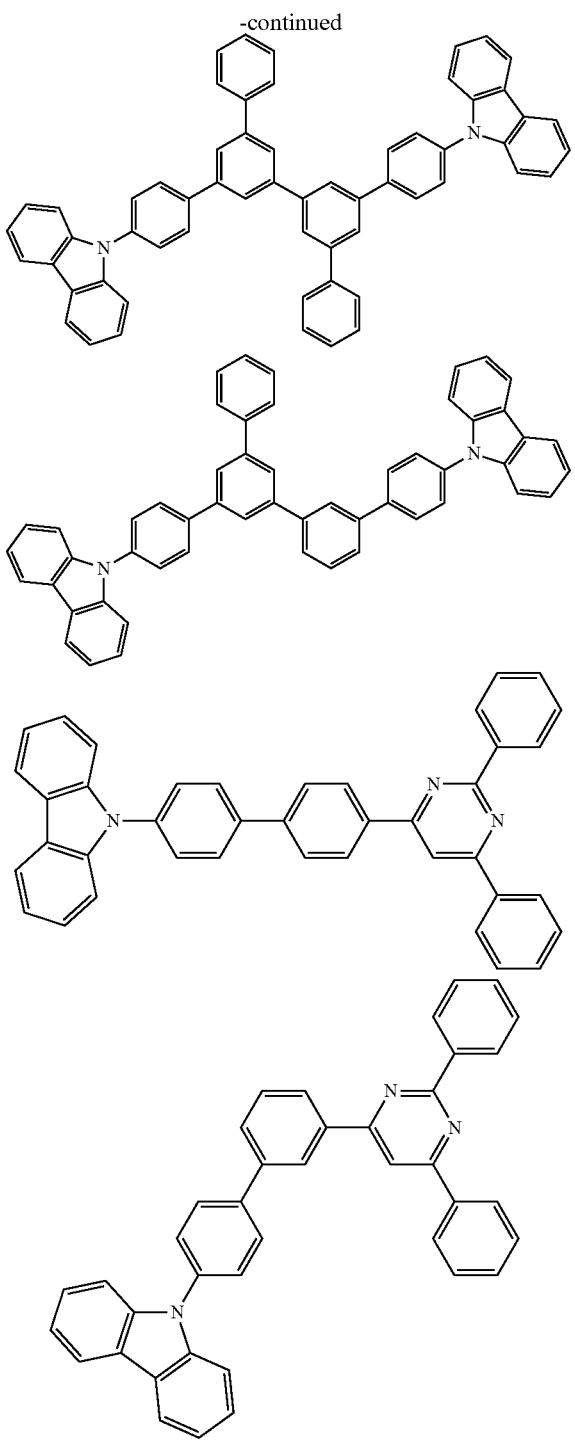

A phosphorescent compound (phosphorescent dopant) is a compound that can emit light from triplet excitons. The phosphorescent dopant is not limited as long as it can emit from triplet excitons. The phosphorescent dopant is preferably a metal complex containing at least one metal selected from Ir, Ru, Pd, Pt, Os and Re. A porphyrin metal complex or an ortho-metalated metal complex is preferable. As the porphyrin metal complex, a porphyrin platinum complex is preferable. The phosphorescent compound may be used alone or in combination of two or more.

There are various ligands forming an ortho-metalated metal complex. As a preferred ligand, a 2-phenylpyridine derivative, a 7,8-benzoquinoline derivative, a 2-(2-thienyl)pyridine derivative, a 2-(1-naphthyl)pyridine derivative, a 2-phenylquinoline derivative or the like can be given. These derivatives may have substituents, if necessary. In particular, those obtained by introducing a fluoride or a trifluoromethyl group is preferable as a blue dopant. It may have a ligand other than the above-mentioned ligands, e.g. acetylacetonate and picric acid, as an auxiliary ligand.

In addition, known phosphorescent dopants having a desired emitting color can be used. Specifically, an amine having a stilbene structure, an aromatic amine, a perylene derivative, a coumarin derivative, a borane derivative, a pyrane derivative or the like can be given.

Among these, it is preferable to use a phosphorescent dopant material such as an iridium complex, a platinum complex or a rhenium complex.

The content of the phosphorescent compound (phosphorescent dopant) in the emitting layer is not particularly restricted, and it may be appropriately selected depending on the purpose. For example, the content is 0.1 mass % to 70 mass %, with 1 mass % to 30 mass % being preferable. When the content of the phosphorescent compound is 0.1 mass % or more, it is possible to prevent emission from becoming weak, whereby the effects of the presence of the phosphorescent dopant can be fully exhibited. By allowing the content to be 70 mass % or less, it is possible to suppress a phenomenon called concentration quenching, thereby to prevent lowering of device performance of the organic EL device.

In the invention, it is preferred that the red-emitting layer be formed of the above-mentioned hole-transporting material.

The green-emitting layer can be formed of a fluorescent emitting material or a phosphorescent emitting material.

In the blue-emitting layer, by using the above-mentioned anthracene compound as the host material, and by doping the host material with a blue fluorescent dopant material, blue emission can be generated, for example.

As the host material that constitutes the blue-emitting layer and the green-emitting layer, it is preferable to use the anthracene derivative represented by the formula (3) given above.

As the blue-emitting dopant material, a compound having an emission peak in a range of about 400 nm to 490 nm can be given. As such a compound, an organic substance such as a naphthalene derivative, an anthracene derivative, a naphthacene derivative, a styrylamine derivative, and a bis(azinyl) methene boron complex can be given. Among these, it is preferable to use an aminonaphthalene derivative, an aminoanthracene derivative, an aminochrysene derivative, an aminopyrene derivative, a styrylamine derivative and a bis (azinyl)methene boron complex.

In the invention, it is preferred that the organic layer stacked structure have a configuration in which the first emitting layer, the intermediate layer, the second emitting layer and the third emitting layer are stacked in this sequence from the anode side, and preferred that the first emitting layer contain at least the above-mentioned hole-transporting material mentioned above as the host material and the second emitting layer and the third emitting layer contain the above-mentioned anthracene derivative as the host material.

In addition, at least one of the emitting layers other than the emitting layer that contains the above-mentioned anthracene derivative as the host material may preferably contain at least a phosphorescent emitting material as the host material.

In this case, it is preferred that the phosphorescent emitting material be a carbazole derivative or a quinoline complex derivative.

In particular, it is preferred that the organic layer stacked structure have a configuration in which the first emitting layer, the intermediate layer and the second emitting layer are stacked from the anode side, that the first emitting layer contain at least a phosphorescent emitting material as the host material and the second emitting layer contain an anthracene derivative as the host material.

In the device of the invention, due to the overlapping of light emitted from plural emitting layers, a desired color of light can be obtained. In particular, the device of the invention is preferable as a device that emits white color.

2. Hole-Transporting Region

A layer that forms a hole-transporting region (hole-supplying layer or the like) functions as a buffer layer that enhances the injection efficiency of holes to the emitting layer and prevents leakage. The film thickness of the hole-supplying layer varies depending on the entire configuration of the organic EL device, in particular, varies depending on the relationship with the electron-supplying layer. The film thickness is 5 nm to 300 nm, for example, preferably 10 nm to 200 nm.

The material that constitutes the hole-supplying layer may be selected appropriately taking into consideration the relationship with materials that constitute the electrode or adjacent layers. For example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof, a heterocyclic conjugated monomer, oligomer or polymer such as a polysilane-based compound, a vinylcarbazole-based compound, a thiophene-based compound, an aniline-based compound or the like can be given.

When the hole-supplying layer is of a two-layer structure, as the material that constitutes the first layer (anode side) and the second layer (emitting layer side), α-naphthylphenyl phenylenediamine, porphyrin, metal tetraphenyl porphyrin, metal naphthalocyanine, hexacyanoazatriphenylene, 7,7,8,8-tetracyanoquinodimethane (TCNQ), F4-TCNQ, tetracyano-4,4,4-tris (3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolyl-amino stilbene, poly(p-phenylenevinylene), poly(thiophenevinylene), poly(2,2'-thienylpyrrole) or the like can be given.

By using the compounds represented by the following formulas (21), (22), (23) and (24), supply of holes from the hole-supplying layer to the emitting layer can be optimized relative to the supply of electrons from the electron-supplying layer to the emitting layer.

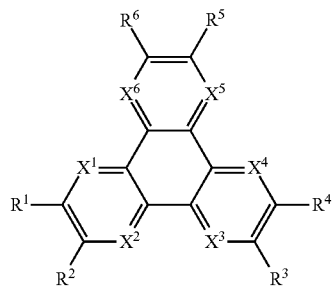

(21)

In the formula (21), $R^1$ to $R^6$ are independently a hydrogen atom, a halogen atom, a hydroxyl group, or one substituent selected from an amino group, an arylamino group, a carbonyl group including 20 or less carbon atoms, a carbonyl ester group including 20 or less carbon atoms, an alkyl group including 20 or less carbon atoms, an alkenyl group including 20 or less carbon atoms, an alkoxyl group including 20 or less carbon atoms, an aryl group including 30 or less carbon atoms, a heterocyclic group including 30 or less carbon atoms, a nitrile group, a cyano group, a nitro group and a silyl group or derivatives thereof. Adjacent $R^1$ to $R^6$ may be bonded with each other to form a ring structure. Further, $X^1$ to $X^6$ are independently a carbon atom or a nitrogen atom. The azatriphenylene derivative represented by the formula (21) is preferably used in the hole-supplying layer since the nitrogen content in the compound is increased by substitution of X by a nitrogen atom.

As specific examples of the azatriphenylene derivative represented by the formula (21), a compound represented by the following formula (21-1) or the like can be given.

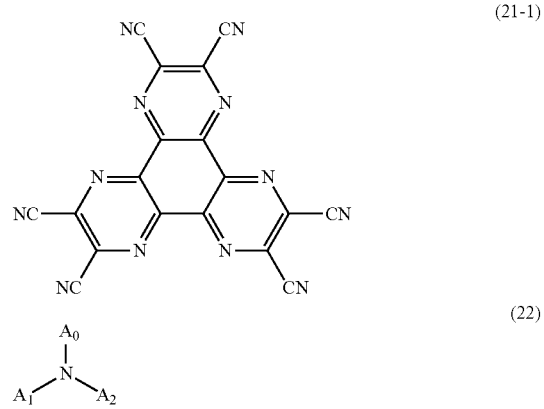

In the formula (22), $A_0$ to $A_2$ are independently an aromatic hydrocarbon group that includes 6 to 30 carbon atoms and is substituted by a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group or a silyl group. As specific examples of the amine derivative represented by the formula (22), compounds represented by the following formulas (22-1) to (22-9) can be given.

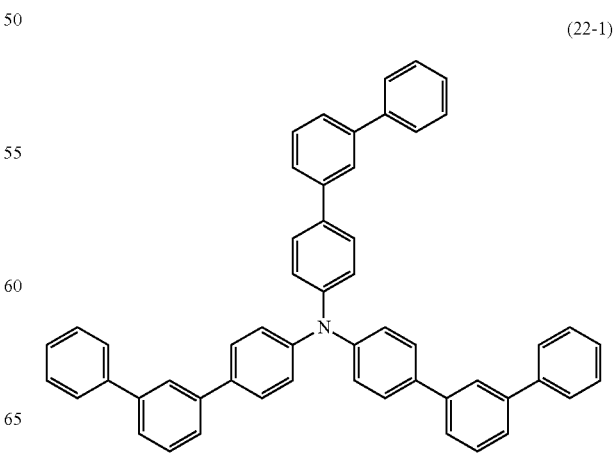

(22-1)

(22-2)
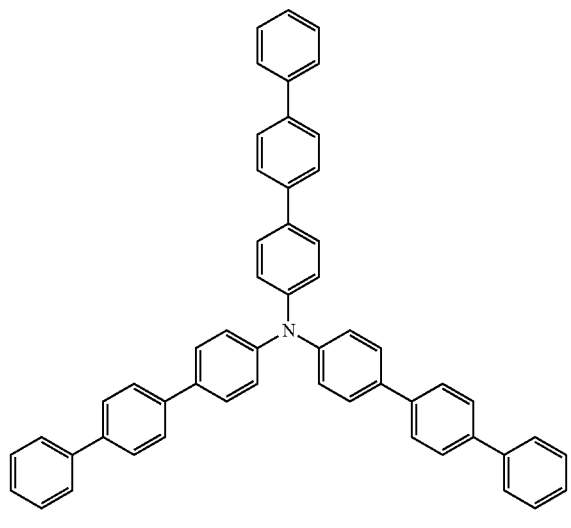
(22-3)
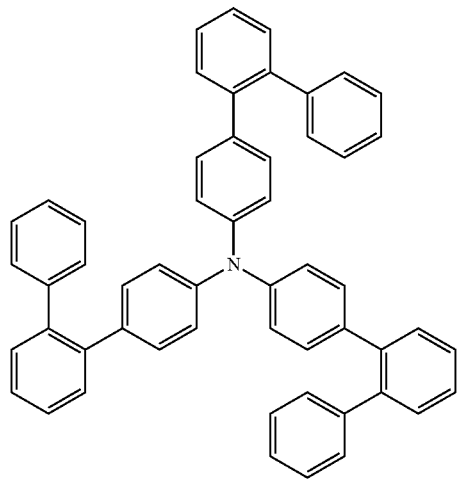
(22-4)
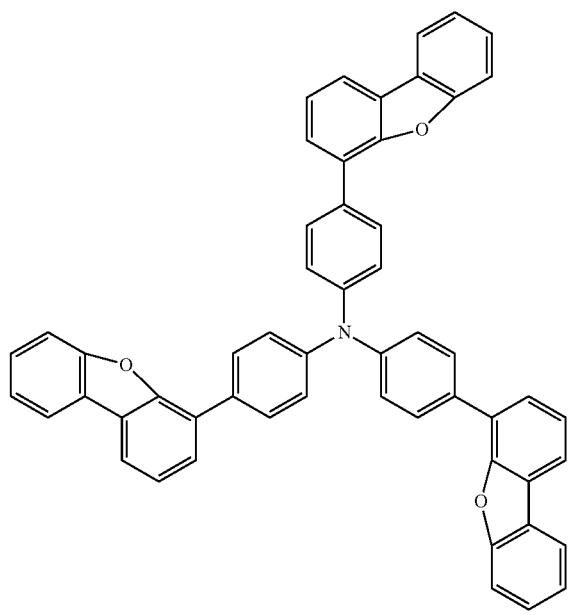
(22-5)
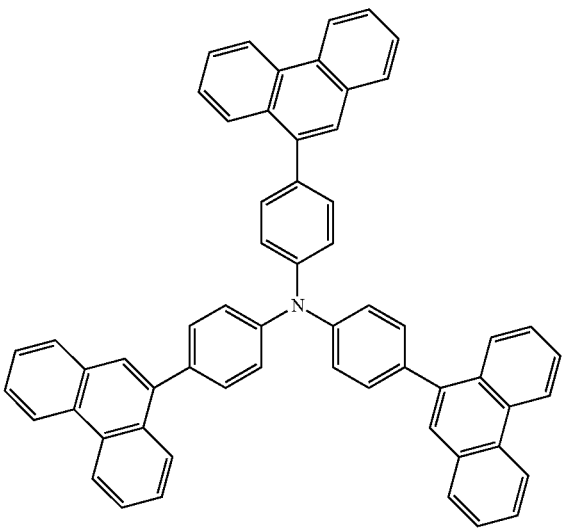
(22-6)
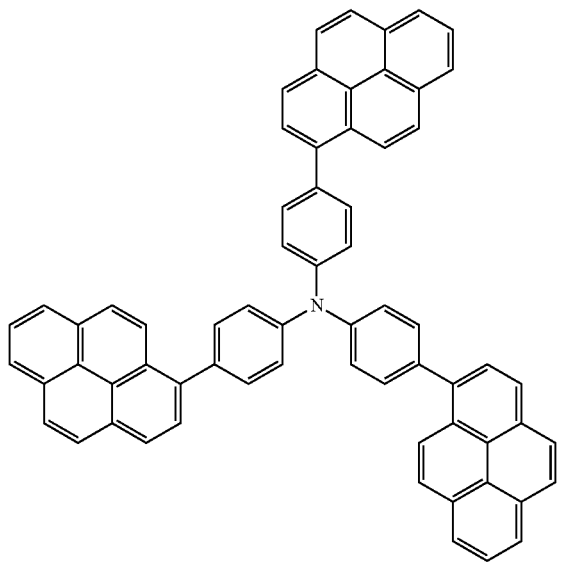

(22-7)

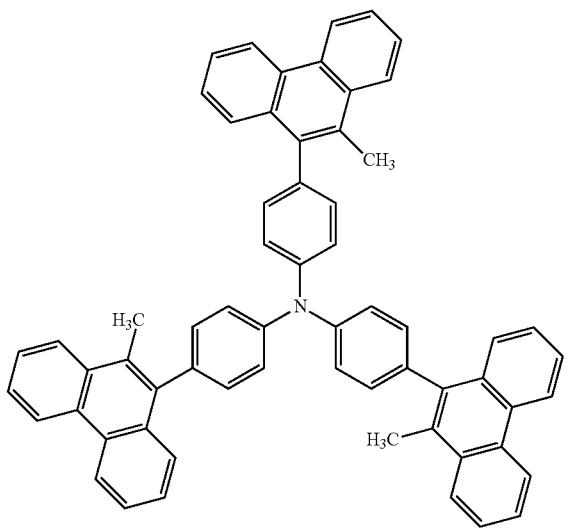

(22-9)

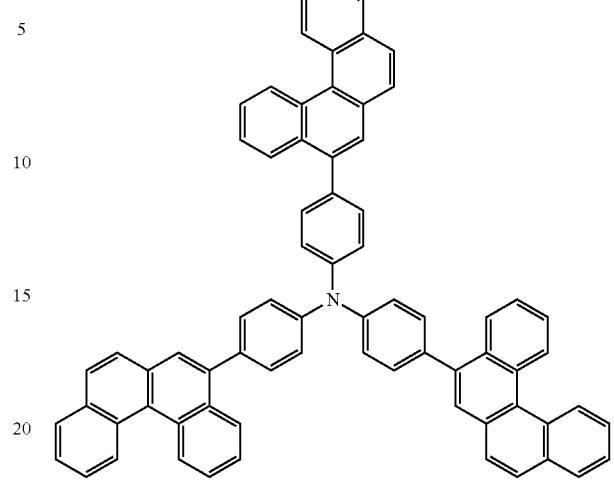

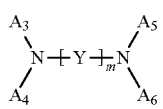

(23)

In the formula (23), $A_3$ to $A_6$ are independently an aromatic hydrocarbon group that includes 6 to 20 carbon atoms and is substituted by a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group or a silyl group. $A_3$ and $A_4$ may be bonded with each other through a linkage group and $A_5$ and $A_6$ may be bonded with each other through a linkage group. Y is a divalent aromatic hydrocarbon group selected from benzene, naphthalene, anthracene, phenanthrene, naphthacene, fluoranthene and perylene in which the ring carbons other than the bonding part with nitrogen (N) are independently substituted by a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group or a silyl group. m is an integer of 1 or more.

As specific examples of the diamine derivative represented by the formula (23), compounds represented by the following formulas (23-1) to (23-84) can be mentioned.

(22-8)

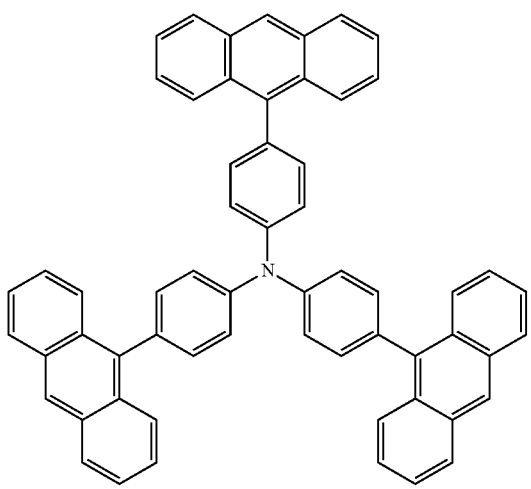

(23-1)

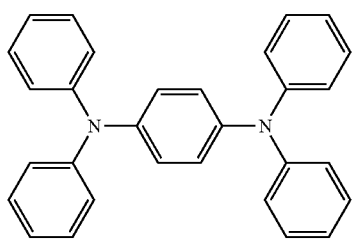

(23-2)

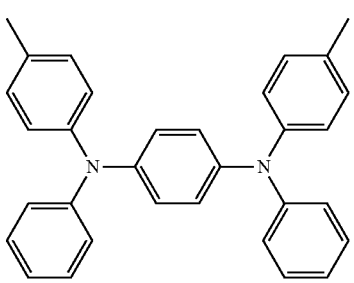

-continued
(23-3)
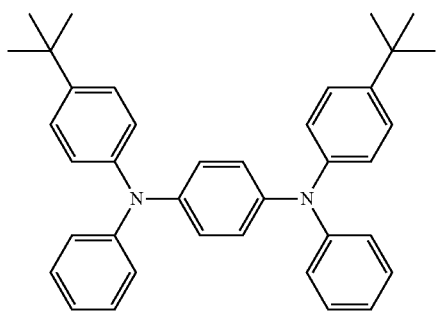
(23-4)
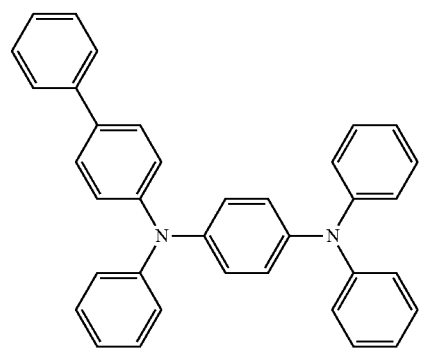
(23-5)
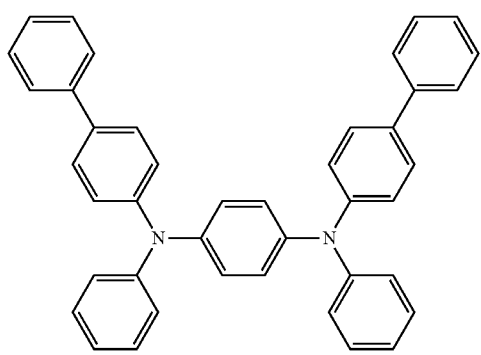
(23-6)
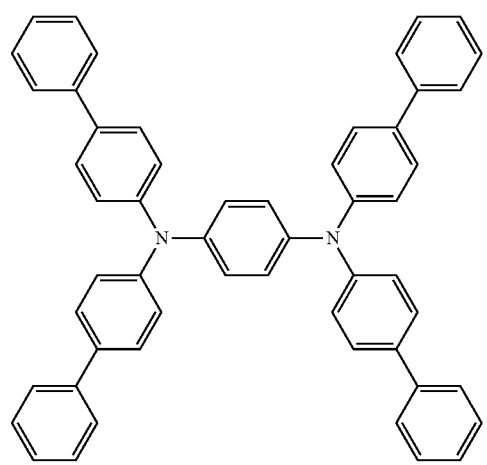
(23-7)
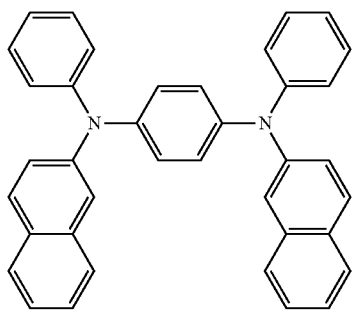
(23-8)
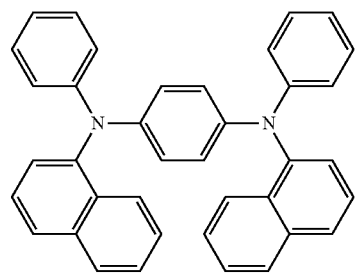
(23-9)
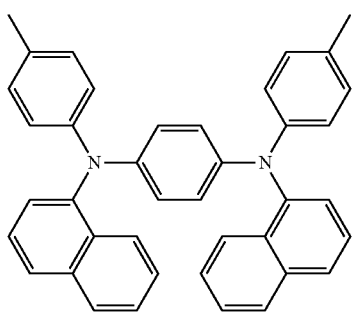
(23-10)
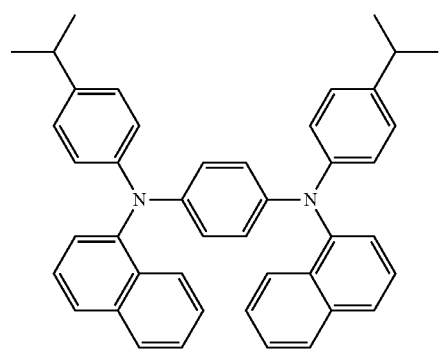

-continued
(23-11)
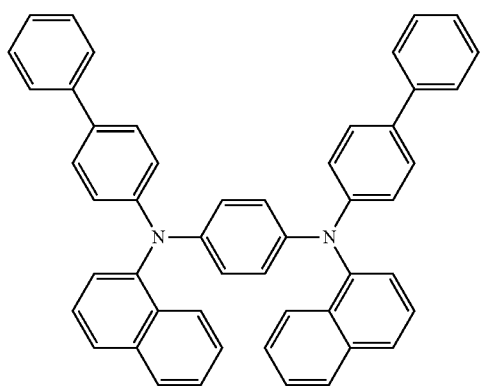
(23-12)
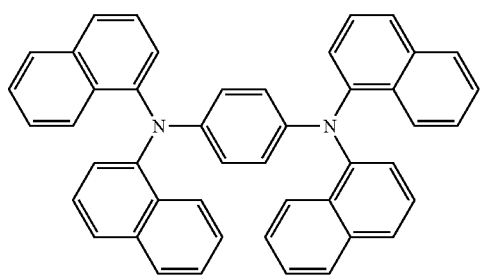
(23-13)
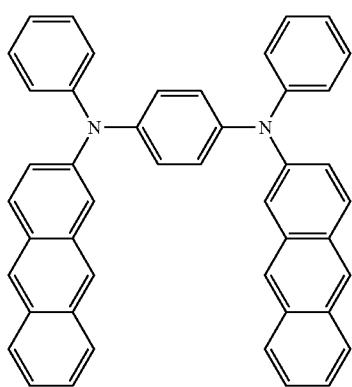
(23-14)
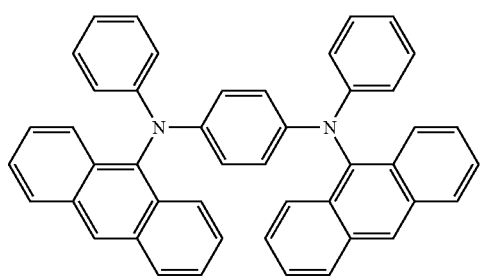
(23-15)
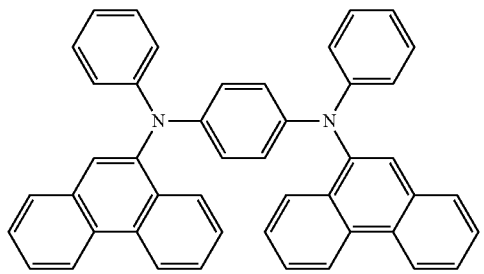
(23-16)
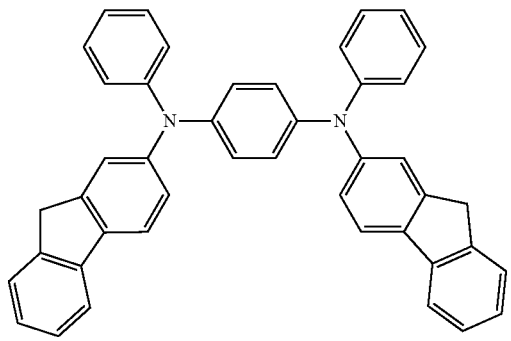
(23-17)
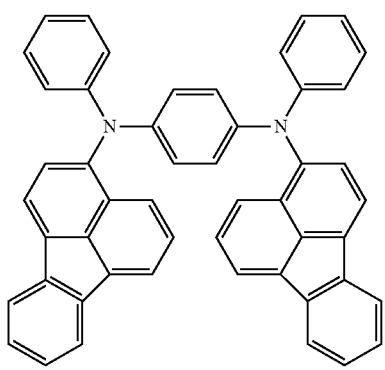
(23-18)
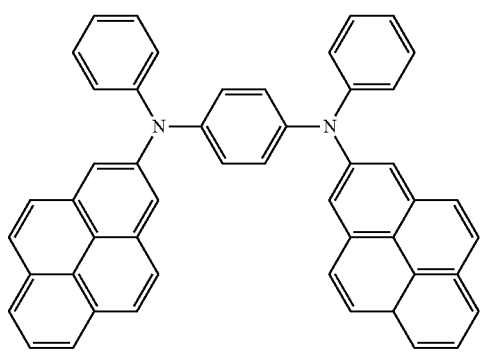

-continued
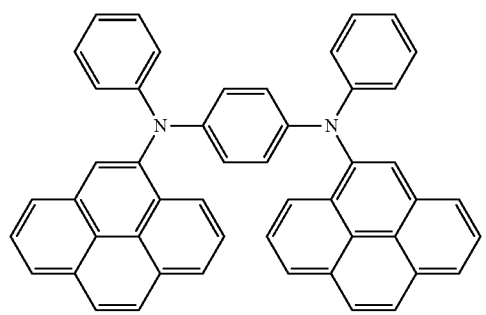
(23-19)
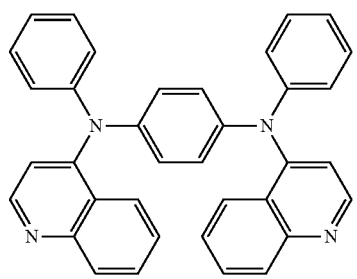
(23-20)
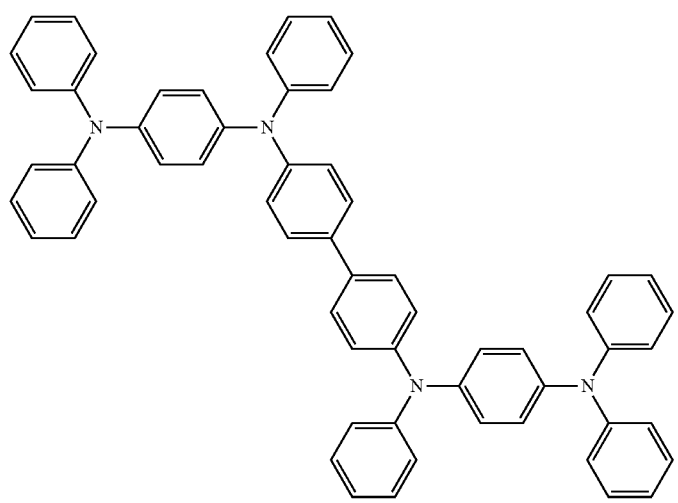
(23-21)
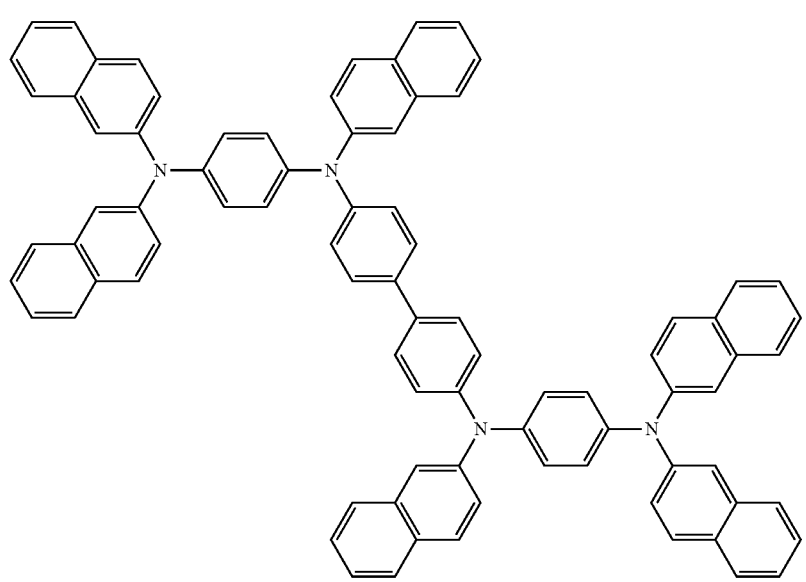
(23-22)

-continued
(23-23)
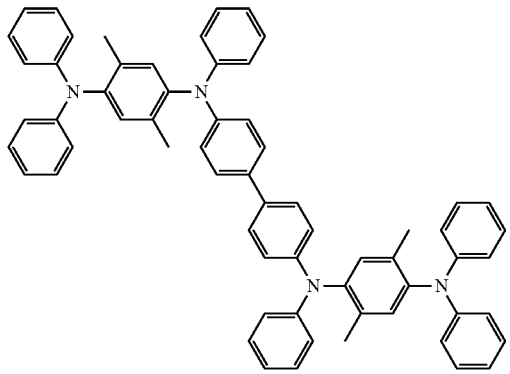
(23-24)
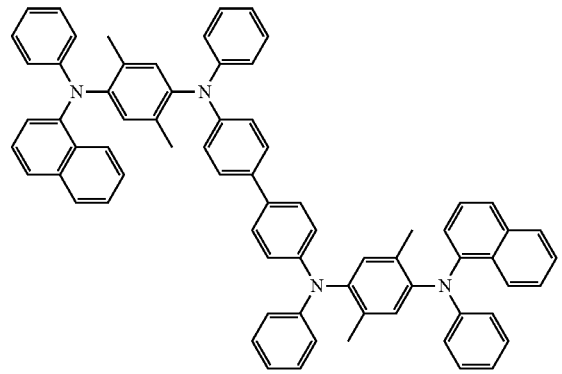
(23-25)
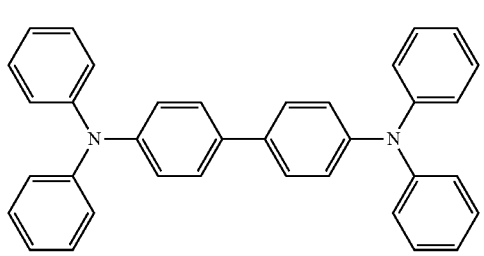
(23-26)
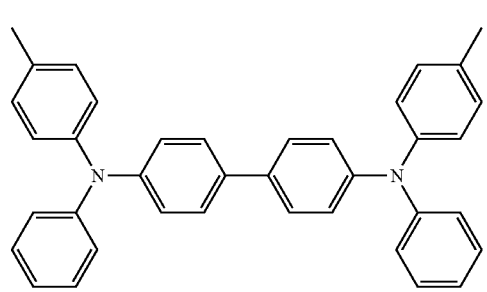
(23-27)
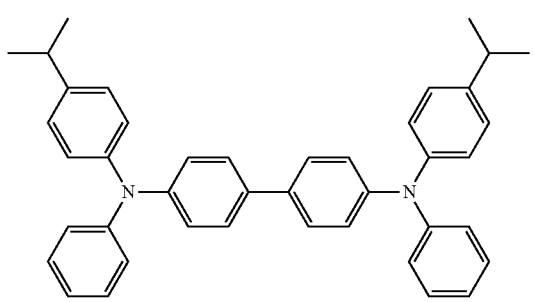
(23-28)
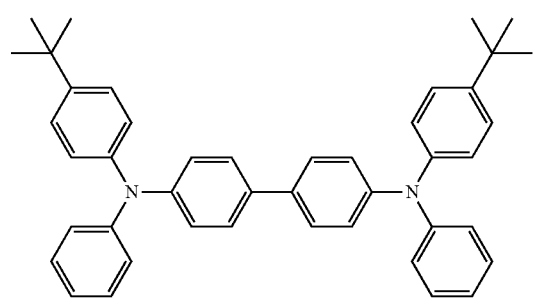
(23-29)
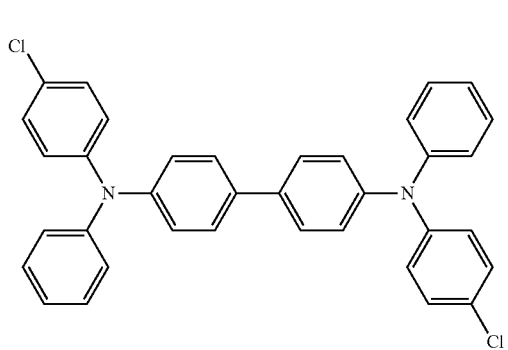
(23-30)
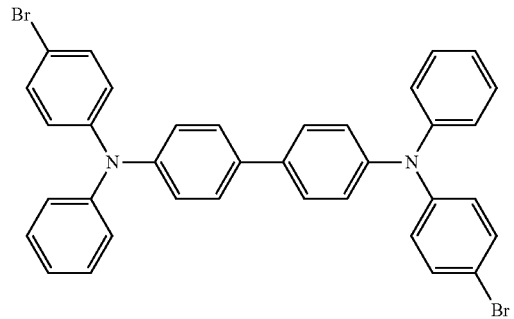

(23-31)
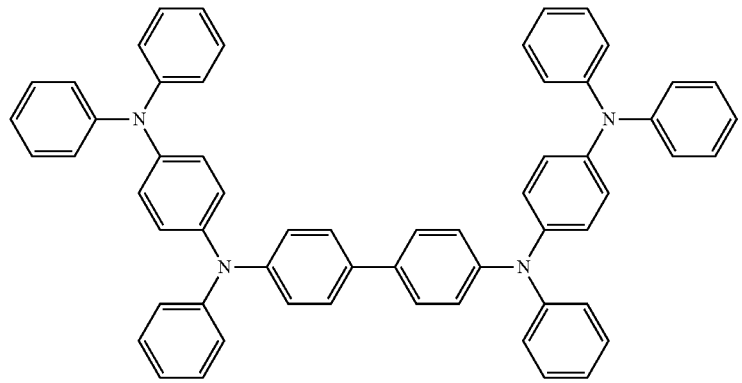
(23-32)
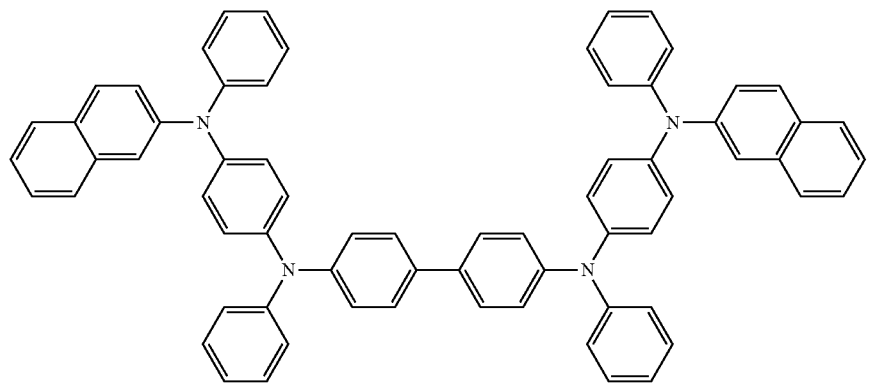
(23-33)
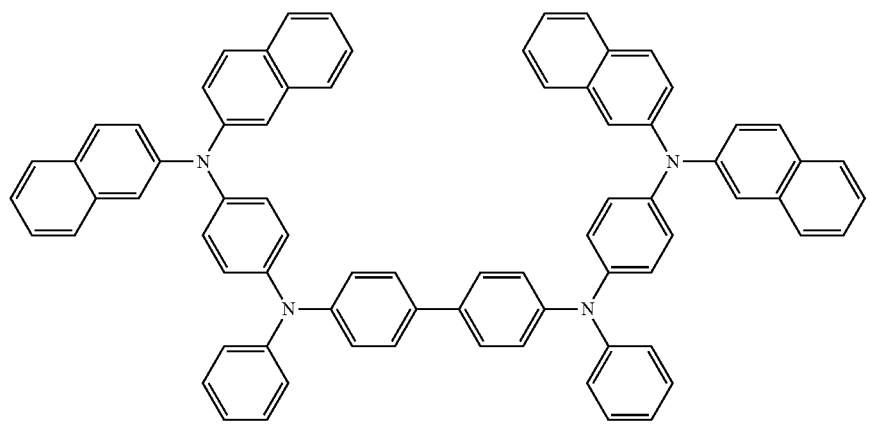
(23-34)
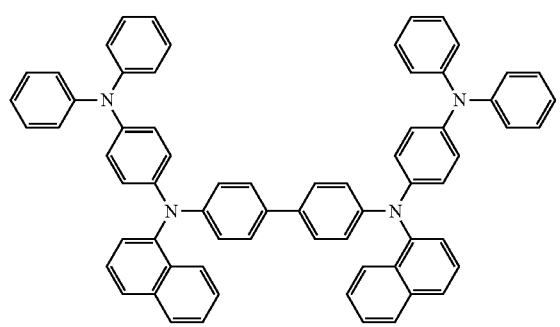
(23-35)
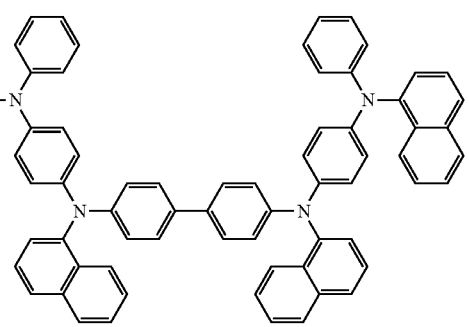

-continued
(23-36)
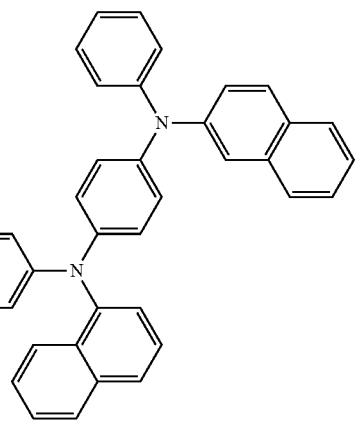
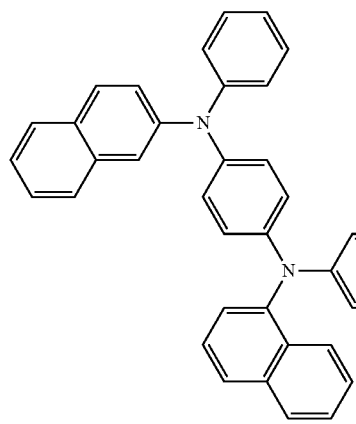
(23-27)
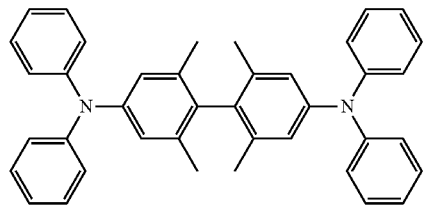
(23-38)
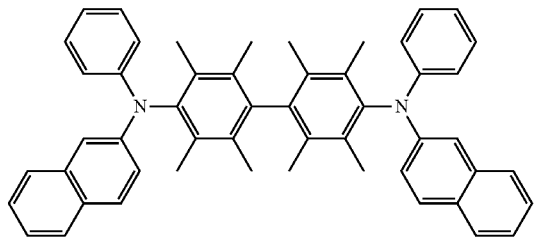
(23-39)
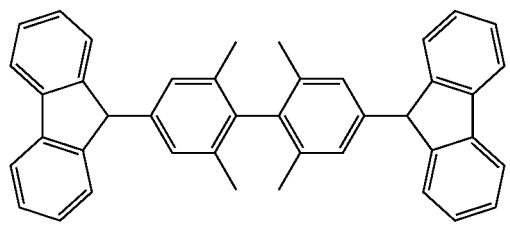
(23-40)
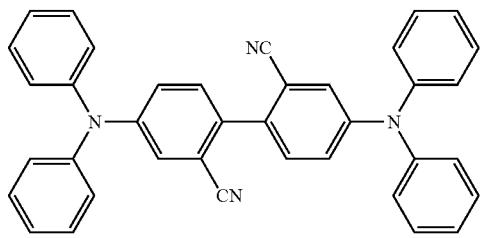
(23-41)
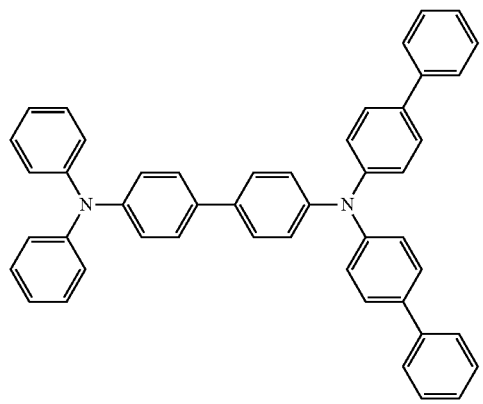
(23-42)
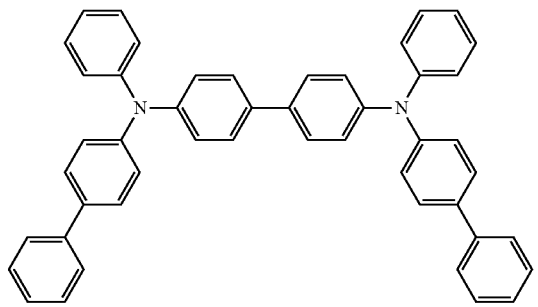

-continued
(23-43)
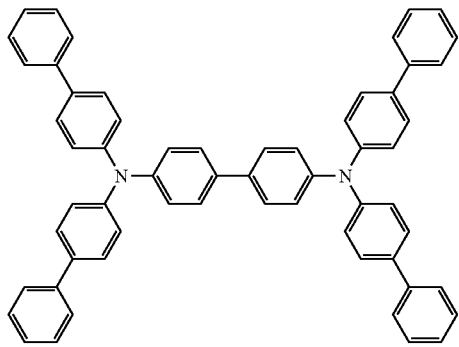
(23-44)
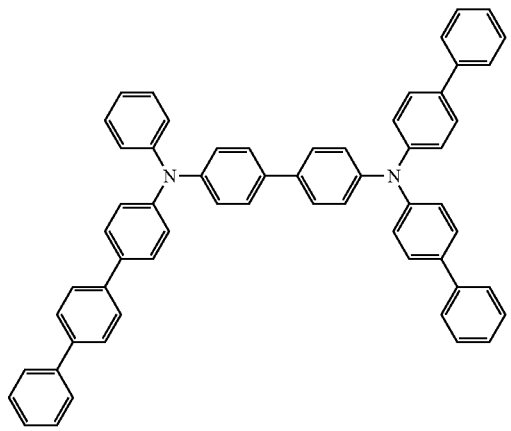
(23-45)
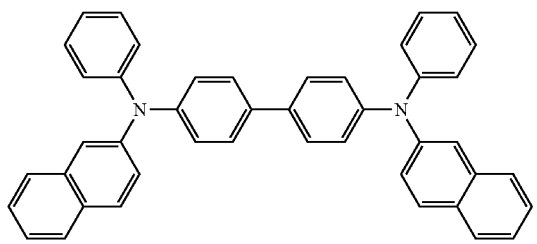
(23-46)
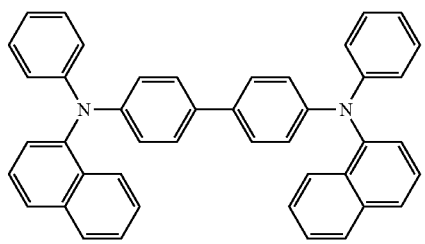
(23-47)
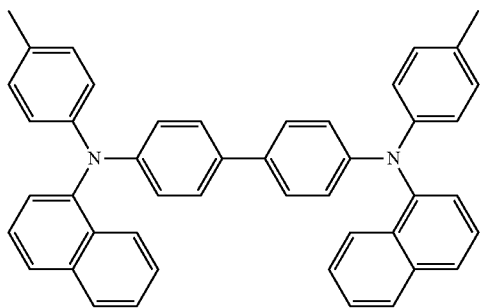
(23-48)
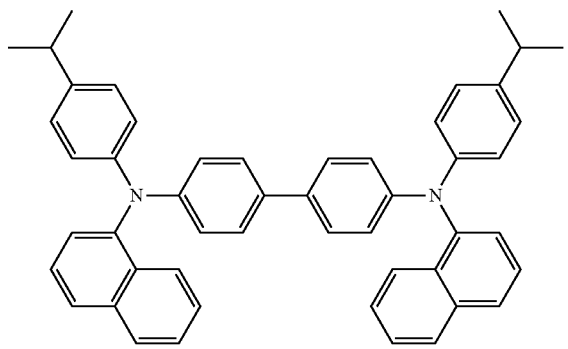
(23-49)
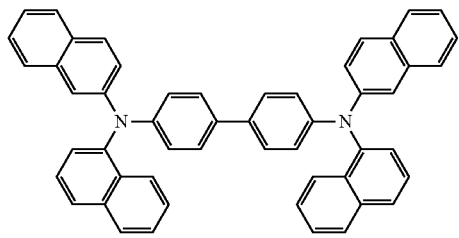
(23-50)
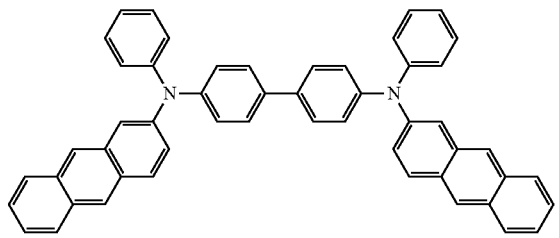
(23-51)
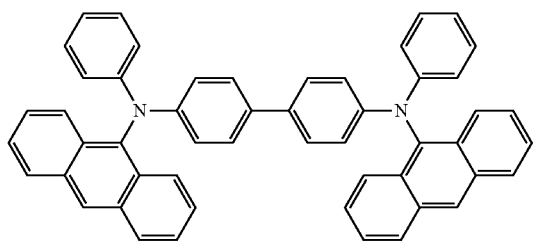
(23-52)
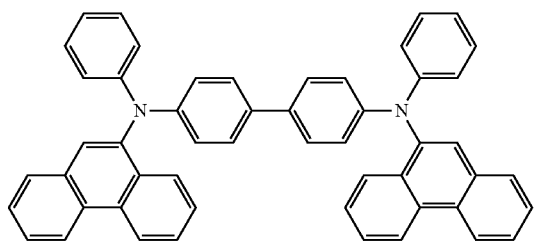

(23-53) 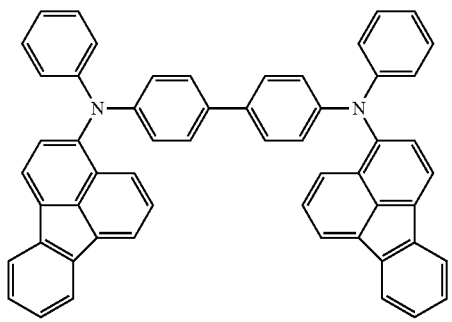
(23-54) 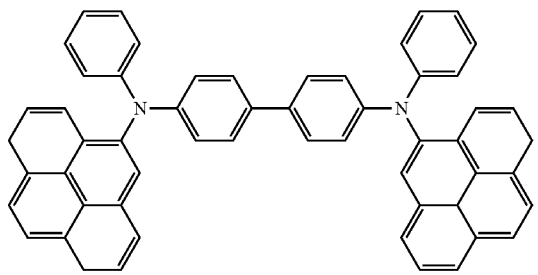
(23-55) 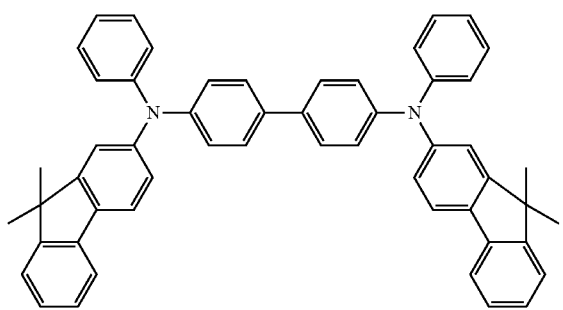
(23-56) 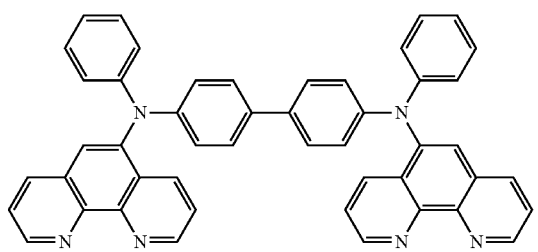
(23-57) 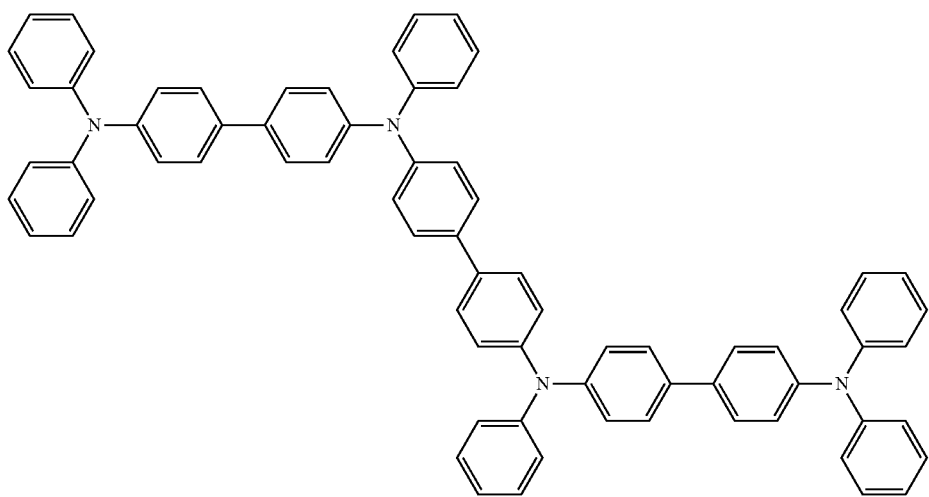

(23-58)
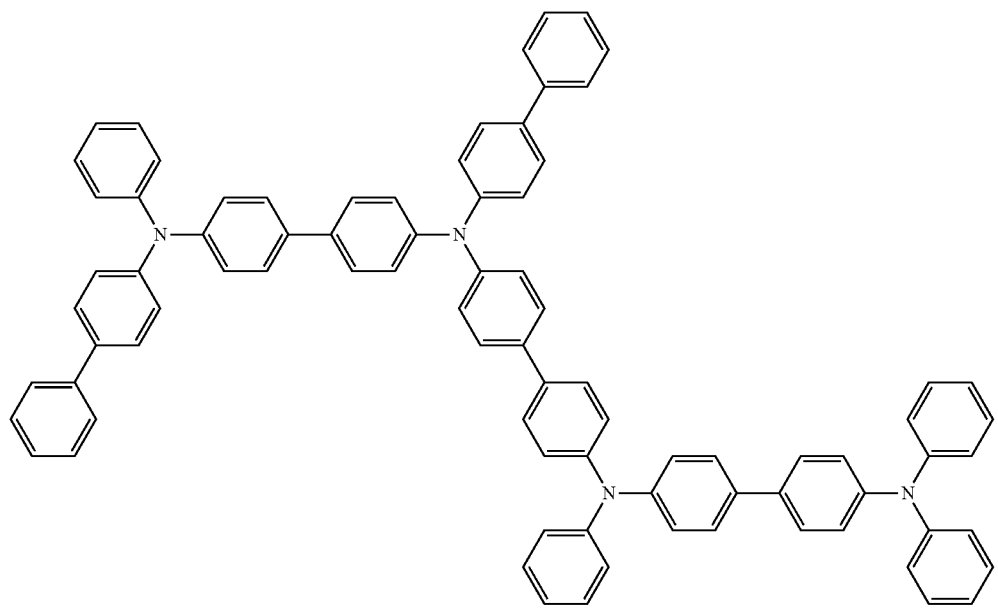
(23-59)
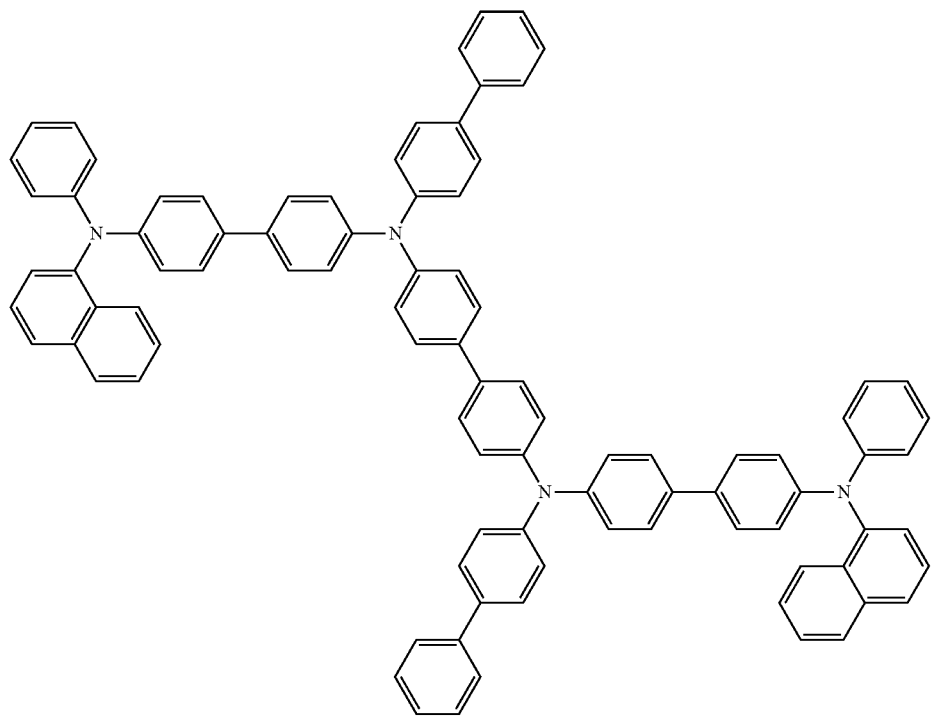

-continued
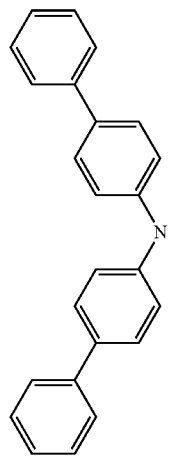
(23-60)
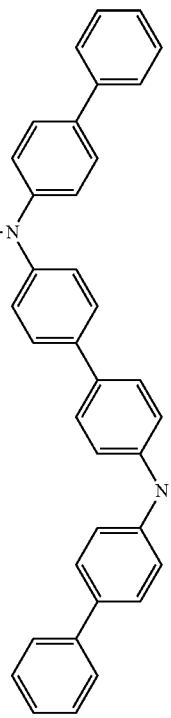
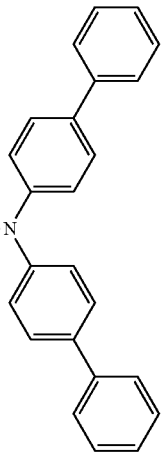
(23-61)
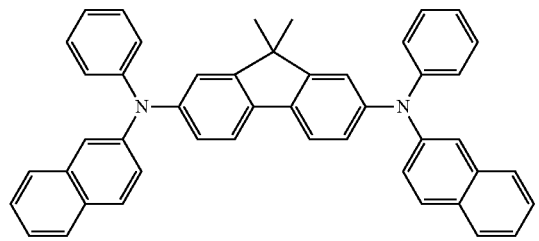
(23-62)
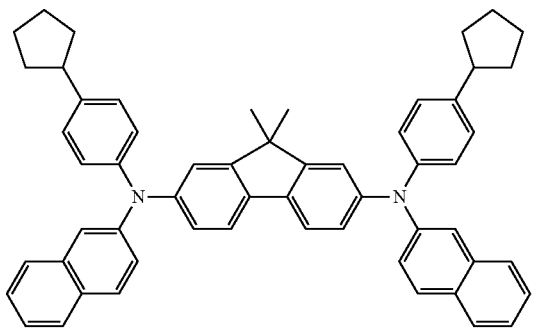
(23-63)
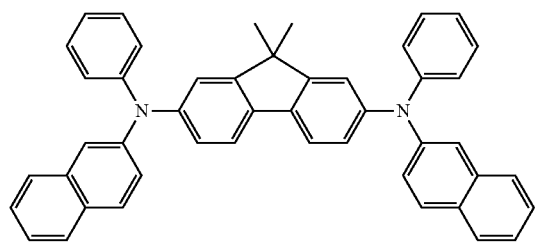
(23-64)
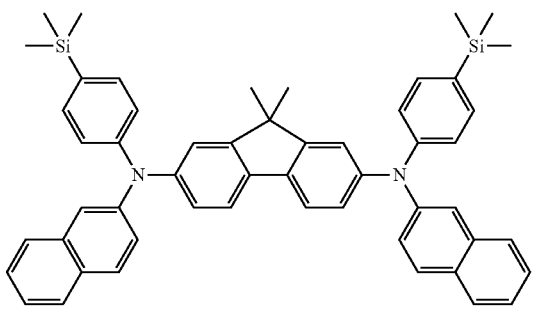
(23-65)
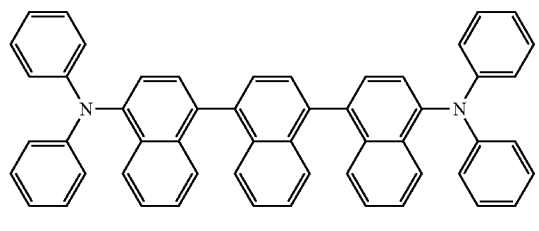
(23-66)
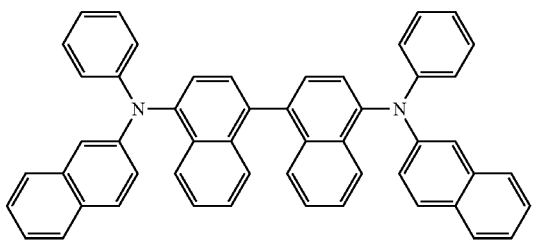

-continued
(23-68)
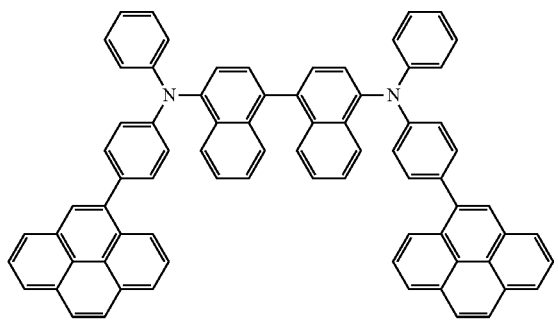
(23-69)
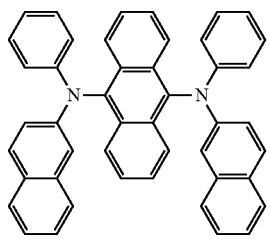
(23-70)
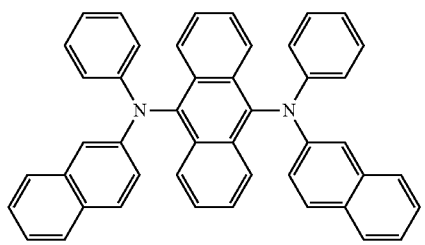
(23-71)
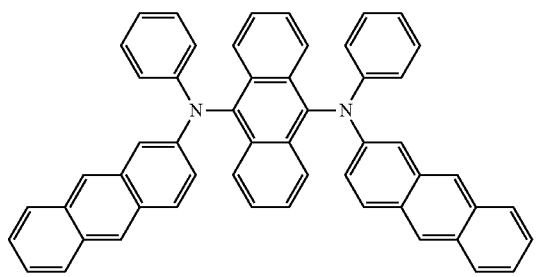
(23-72)
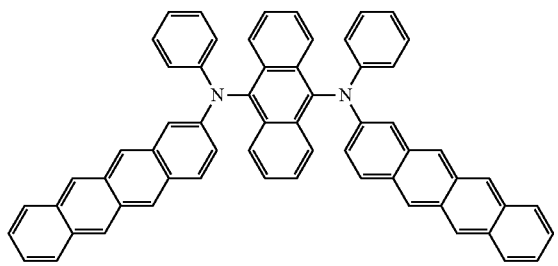
(23-73)
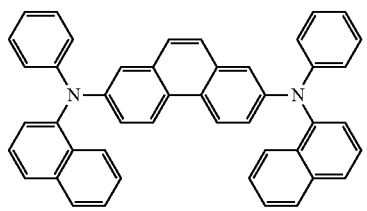
(23-74)
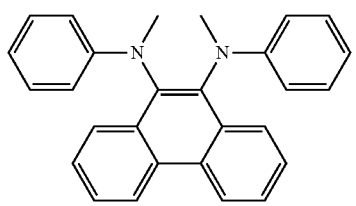
(23-75)
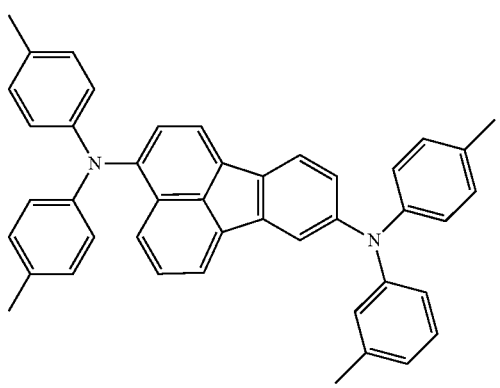

-continued
(23-76)
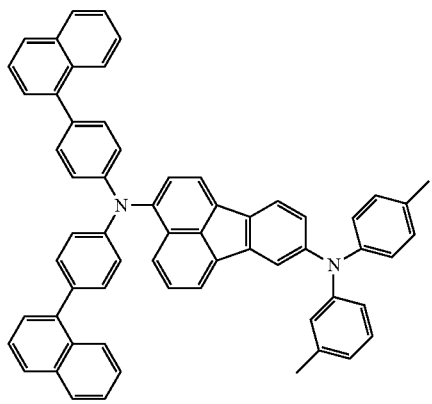
(23-77)
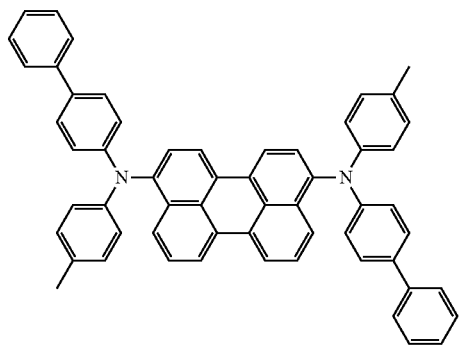
(23-78)
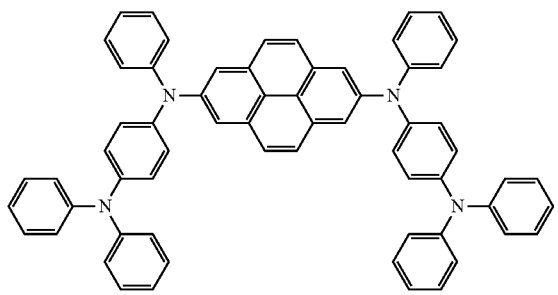
(23-79)
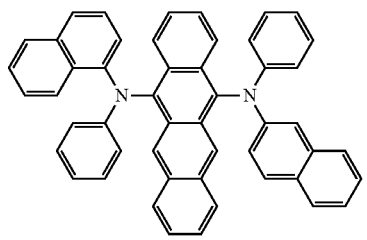
(23-80)
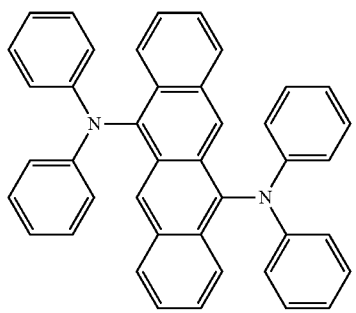
(23-81)
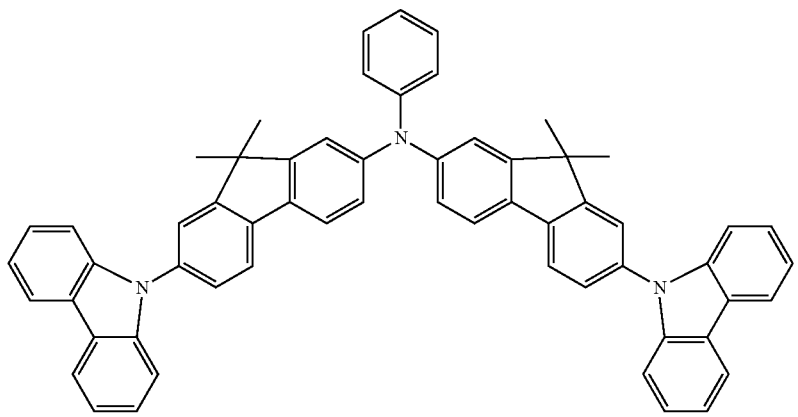

(23-82)

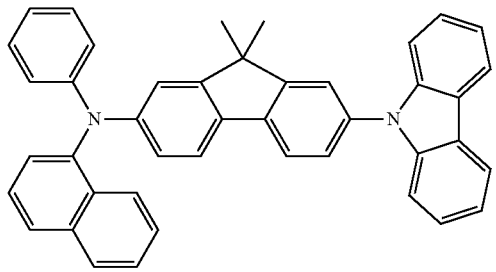

(23-82)

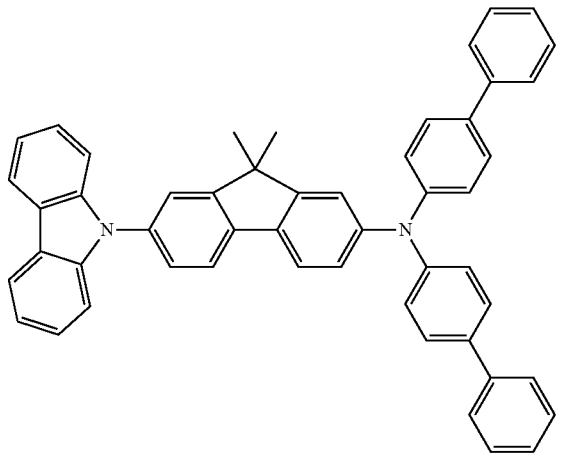

(23-84)

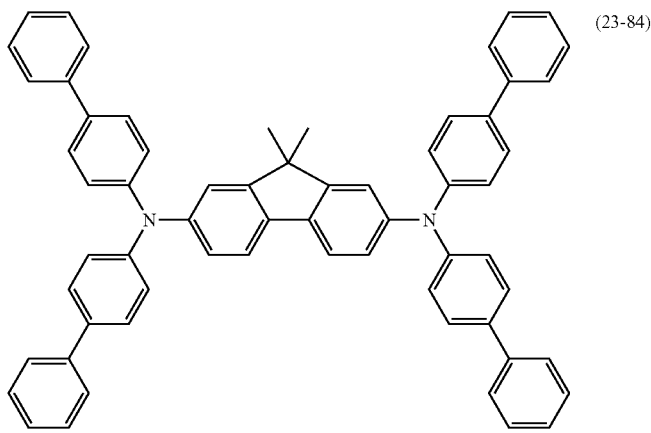

(24)

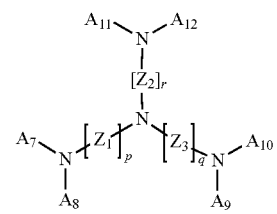

In the formula (24), $A_7$ to $A_{12}$ are independently an aromatic hydrocarbon group that includes 6 to 20 carbon atoms and is substituted by a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group or a silyl group. Adjacent $A_7$ and $A_8$ may be bonded with each other, adjacent $A_9$ and $A_{10}$ may be bonded with each other and adjacent $A_{11}$ and $A_{12}$ may be bonded with each other through a linkage group. $Z_1$ to $Z_3$ are a divalent aromatic hydrocarbon group selected from benzene, naphthalene, anthracene, phenanthrene, naphthacene, fluoranthene and perylene in which the ring carbons other than the bonding part with nitrogen (N) are independently substituted by a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group or a silyl group. p, q and r are an integer of 1 or more. As specific examples of the triarylamine polymer shown in the formula (24), the compounds represented by the following formulas (24-1) to (24-15) can be given.

(24-1) 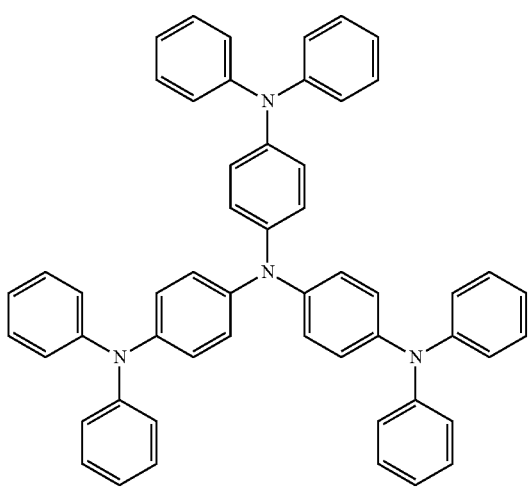
(24-2) 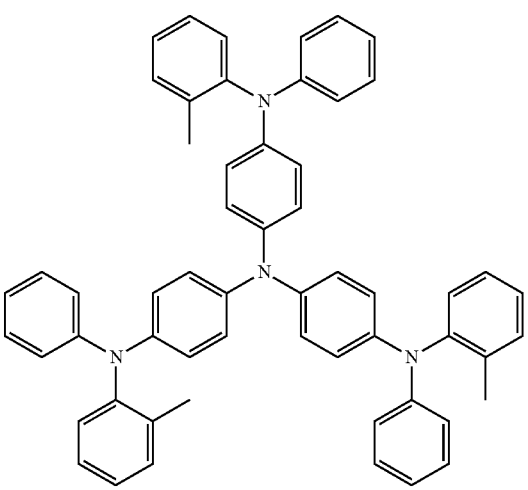
(24-3) 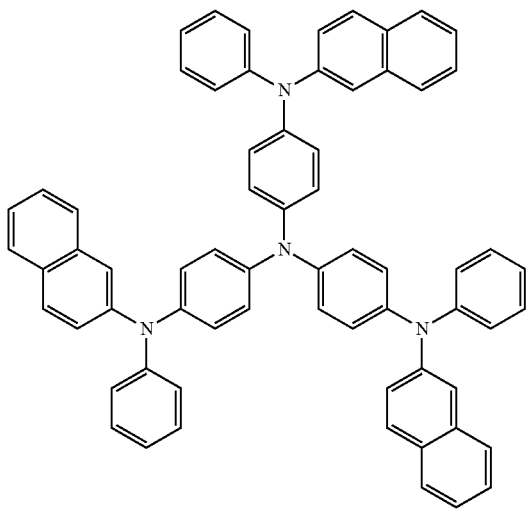
(24-4) 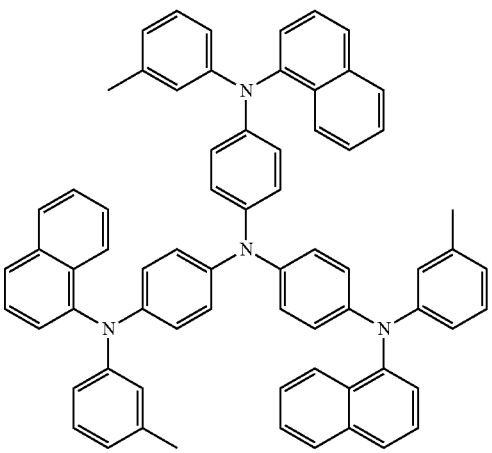
(24-5) 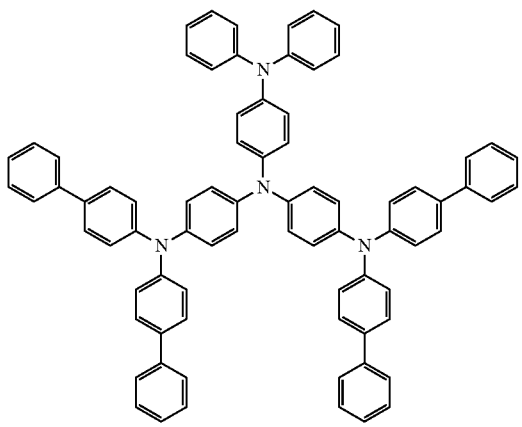
(24-6) 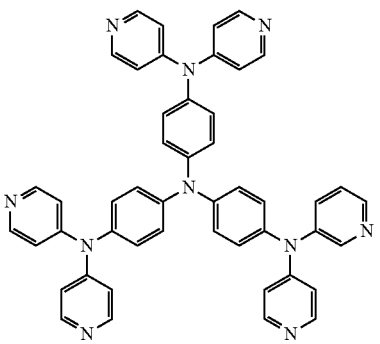

-continued
(24-7)
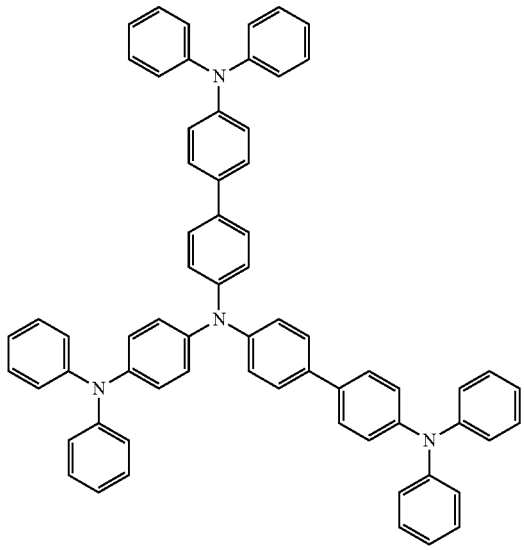
(24-8)
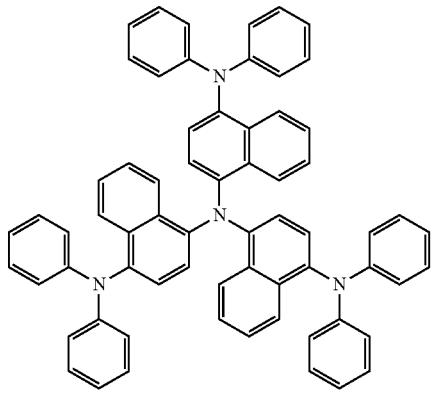
(24-9)
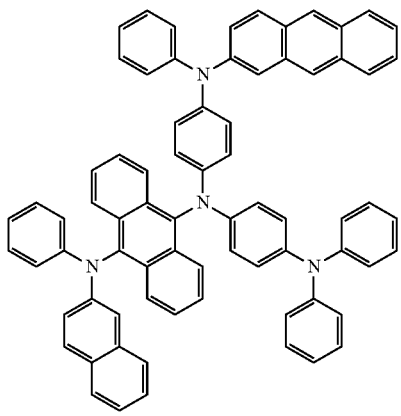
(24-10)
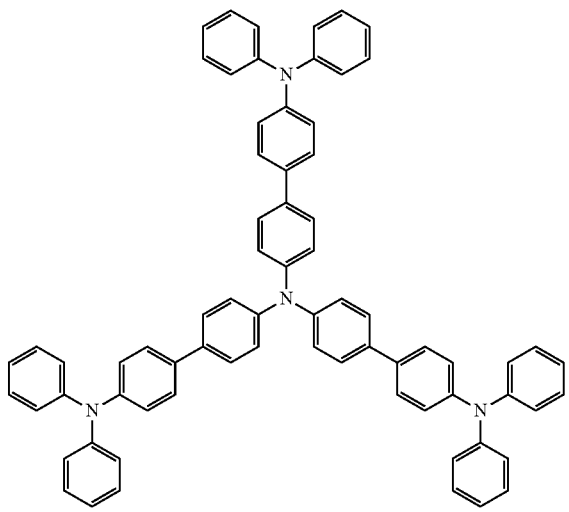
(24-11)
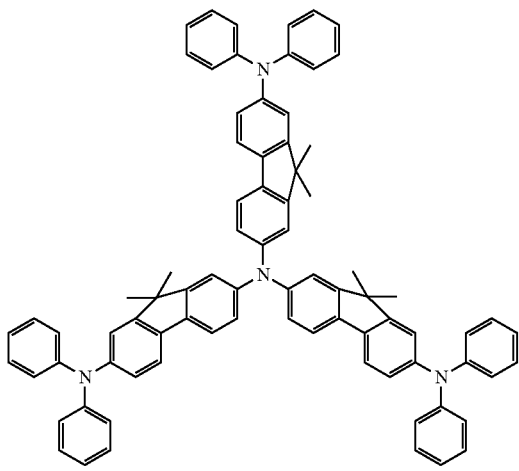
(24-12)
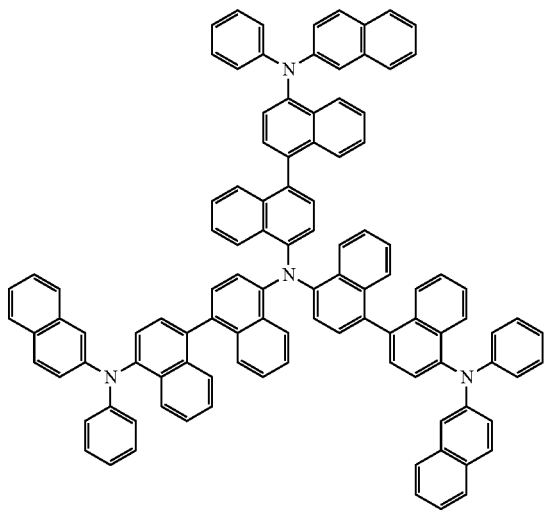

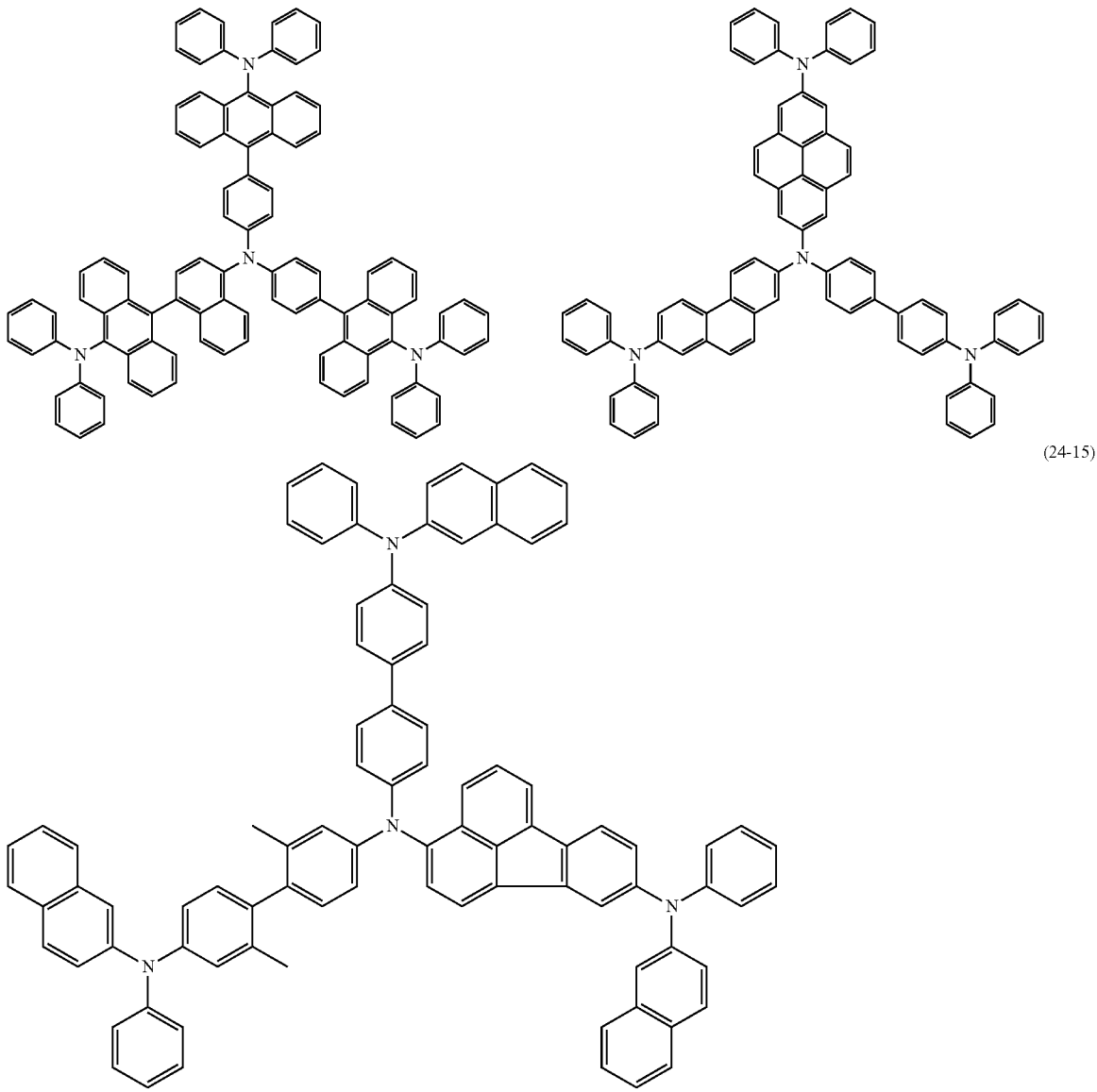

Various compounds explained above may be used in either of the first layer and the second layer of the hole-supplying layer. It is preferred that a compound having a high nitrogen content be used in the first layer.

3. Electron-Transporting Region

As the layer constituting the electron-transporting region, an electron-injecting layer or an electron-transporting layer (hereinbelow, often referred to as the "electron-injecting/transporting layer) can be given. The electron-injecting/transporting layer is a layer that assists injection of electrons into the emitting layer, and transports electrons to the emitting region. The electron-injecting/transporting layer exhibits a high electron mobility. The thickness of the electron-injecting/transporting layer is appropriately selected within a range of several nanometers to several micrometers. In particular, when the electron-injecting/transporting layer has a large thickness, it is preferable that the electron mobility be at least $10^{-5}$ cm$^2$/V·s or more at an applied electric field of $10^4$ V/cm to $10^6$ V/cm in order to prevent an increase in voltage.

The material used in the electron-injecting/transporting layer is preferably a metal complex of 8-hydroxyquinoline or a derivative thereof, or a nitrogen-containing heterocyclic derivative. Specific examples of the metal complex of 8-hydroxyquinoline or the derivative thereof include metal chelate oxynoid compounds containing a chelate of oxine (generally, 8-quinolinol or 8-hydroxyquinoline). For example, tris(8-quinolinol)aluminum can be used. As the nitrogen-containing heterocyclic derivative, oxazole, thiazole, oxadiazole, thiadiazole, triazole, pyridine, pyrimidine, triazine, phenanthroline, benzimidazole, imidazopyridine or the like can be given, for example. Among them, a benzimidazole derivative, a phenanthroline derivative and an imidazopyridine derivative are preferable.

The electron-supplying layer is a layer that transports electrons injected from the cathode to the emitting layer. The film thickness of the electron-supplying layer is desirably 10 nm to 200 nm, preferably 20 nm to 180 nm, for example, although it varies according to the entire configuration of the organic EL device. As the material of the electron-transporting layer, it is preferable to use an organic material having excellent electron-transporting performance. By increasing the transporting efficiency of electrons to the emitting layer, in particular, to the red-emitting layer and the green-emitting layer, variations in emission color in the red-emitting layer and the green-emitting layer by an electrical intensity are suppressed. As such an organic material, a nitrogen-containing heterocyclic derivative having an electron mobility of $10^{-6}$ cm$^2$/V·s or more and $1.0 \times 10^{-1}$ cm$^2$/V·s or less can be given.

As specific materials, a benzimidazole derivative represented by the following formula (9) can be given. However, the specific materials are not limited thereto.

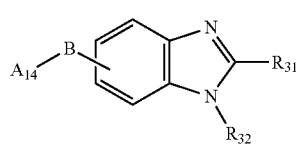

(9)

In the formula (9), $A_{14}$ is a hydrogen atom, a halogen atom, an alkyl group including 1 to 20 carbon atoms or its derivatives, or a hydrocarbon group that includes 6 to 60 carbon atoms and has a polycyclic aromatic hydrocarbon group in which 3 to 40 aromatic rings are fused, or a nitrogen-containing heterocyclic group or its derivative. B is a single bond, a divalent aromatic group, or its derivative. $R_{31}$ and $R_{32}$ are independently a hydrogen atom, a halogen atom, an alkyl group including 1 to 20 carbon atoms and its derivative, an aromatic hydrocarbon group including 6 to 60 carbon atoms and its derivative, a nitrogen-containing heterocyclic group and its derivative or an alkoxy group including 1 to 20 carbon atoms and its derivative.

As specific examples of the compound represented by the formula (9), compounds represented by the following formulas (9-1) to (9-49) can be given. Meanwhile, the "Ar(a)" corresponds to the imidazole skeleton containing $R_{31}$ and $R_{32}$ in the formula (9), and the "B" corresponds to B in the formula (9). Further, the "Ar(1)" and "Ar(2)" correspond to $A_{14}$ in the formula (9), and bond to B in the order of Ar(1) and Ar(2).

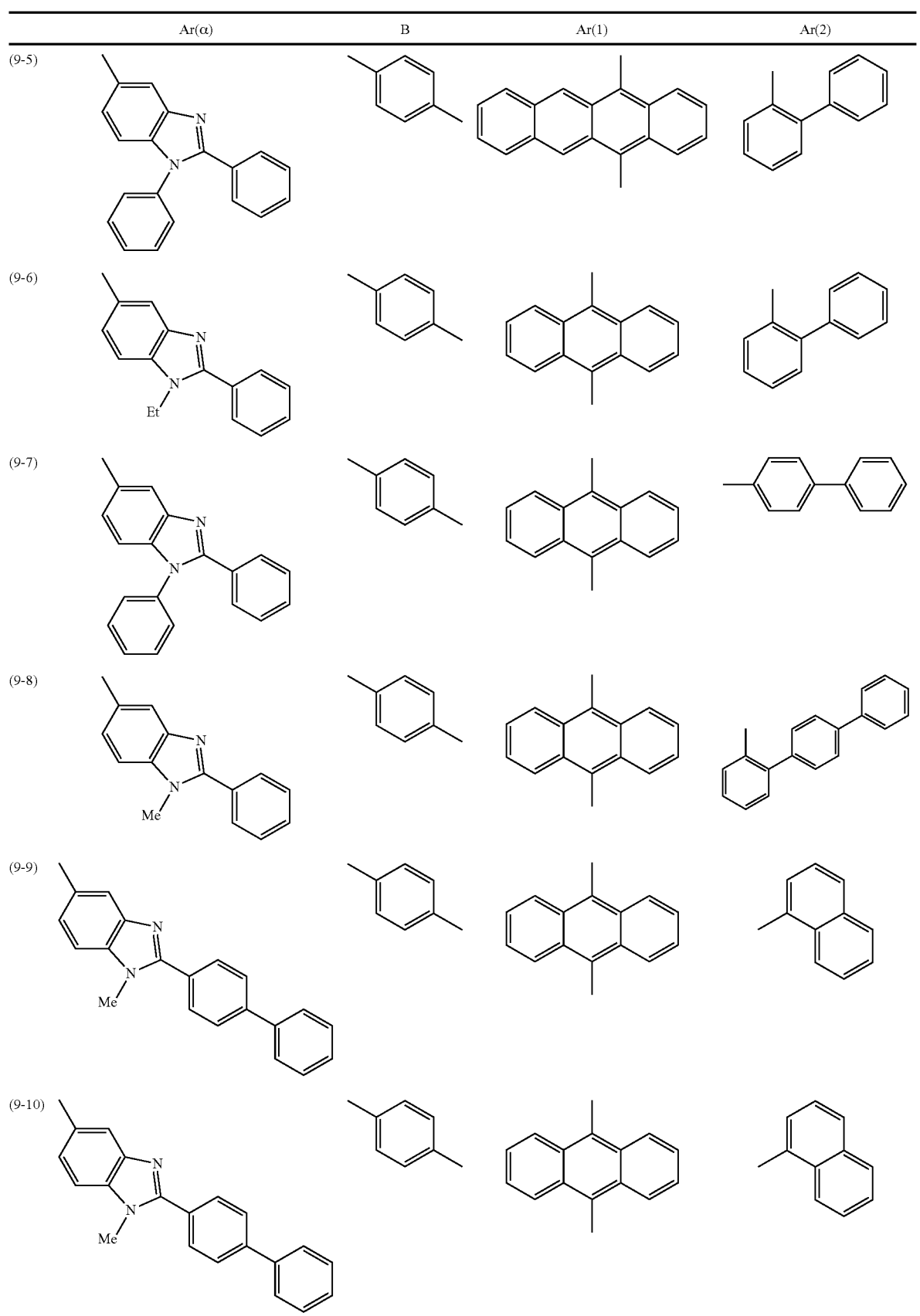

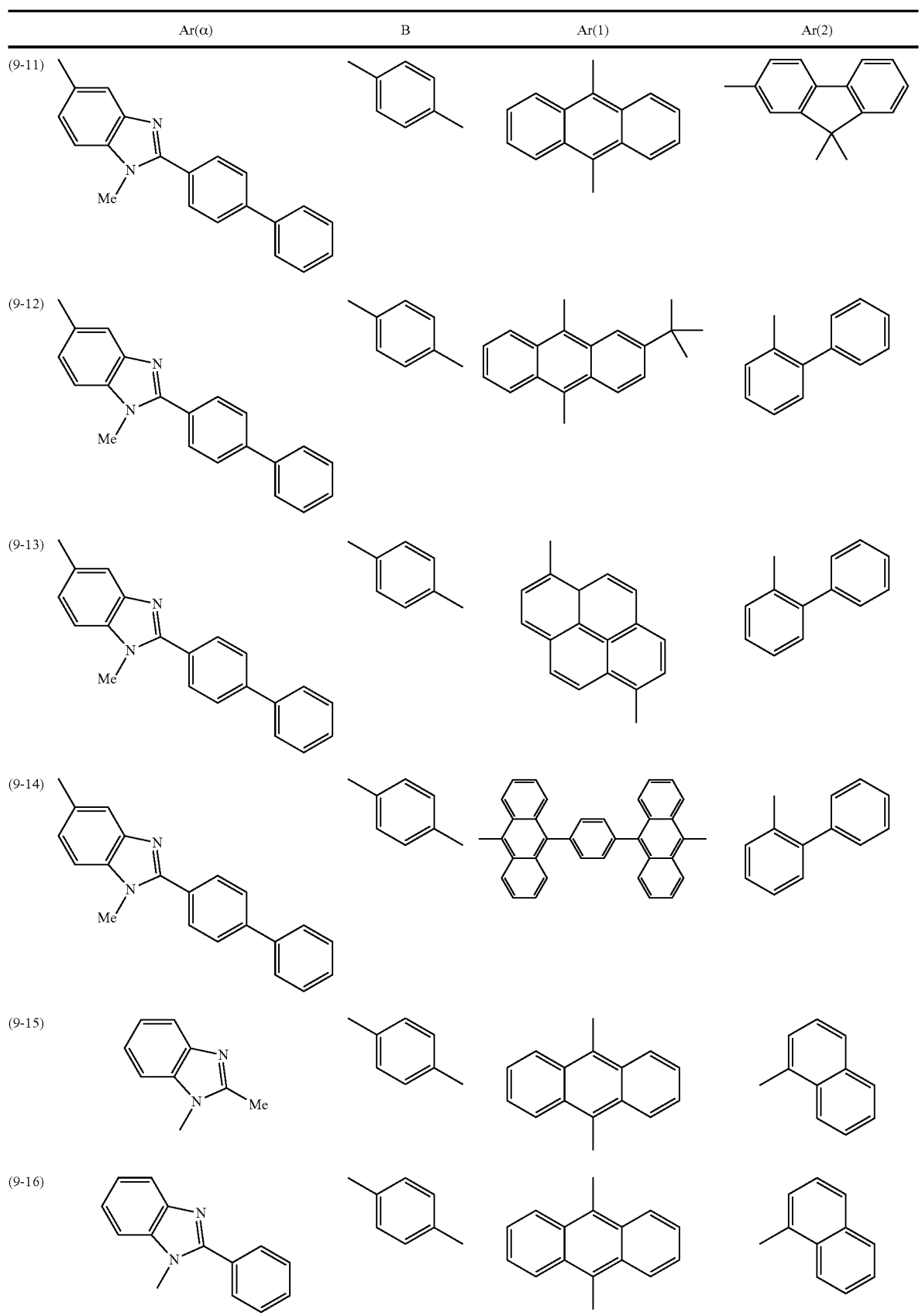

-continued

| | Ar(α) | B | Ar(1) | Ar(2) |
|---|---|---|---|---|
| (9-17) | | | | |
| (9-18) | | | | |
| (9-19) | | | | |
| (9-20) | | | | |
| (9-21) | | | | |
| (9-22) | | | | |

-continued
| | Ar(α) | B | Ar(1) | Ar(2) |
|---|---|---|---|---|
| (9-23) | 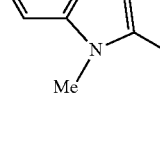 | 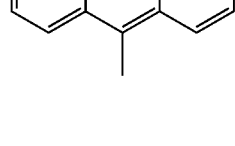 |  | 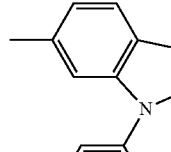 |
| (9-24) | 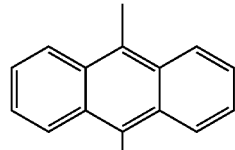 | / | 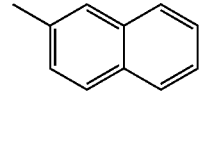 | 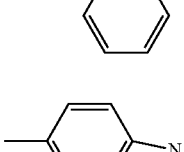 |
| (9-25) | 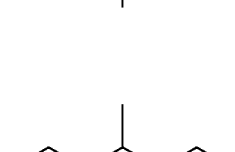 | / | 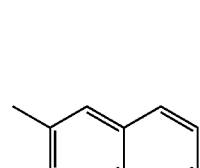 | 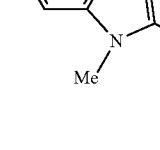 |
| (9-26) | 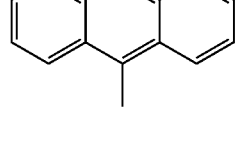 | / | 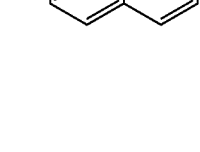 | 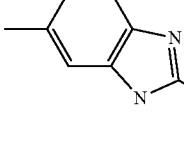 |
| (9-27) | 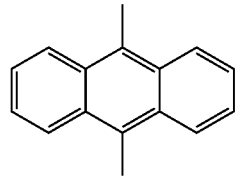 | / | 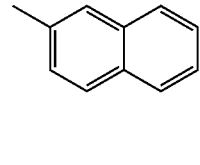 | 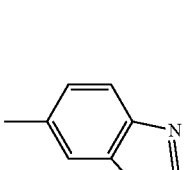 |
| (9-28) | 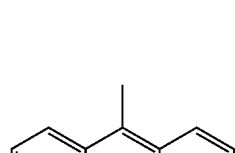 | / | 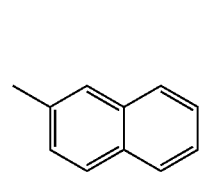 | |

-continued
| | Ar(α) | B | Ar(1) | Ar(2) |
|---|---|---|---|---|
| (9-29) | 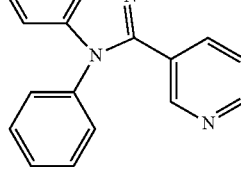 | 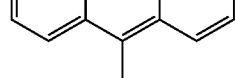 |  | 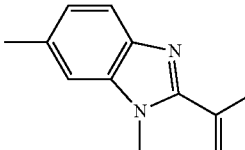 |
| (9-30) | 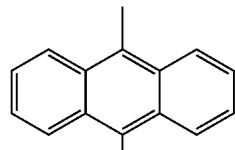 | 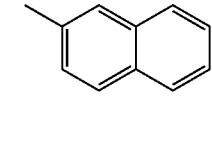 | 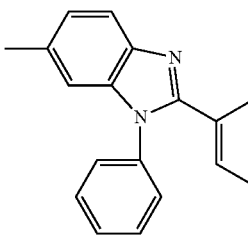 | 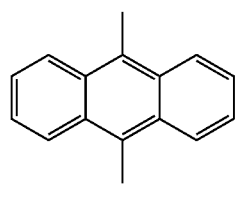 |
| (9-31) | 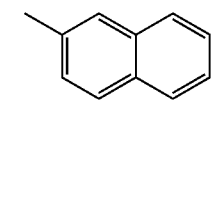 | | 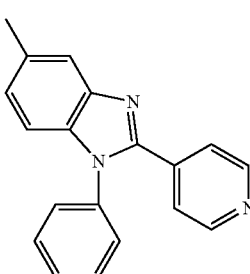 | 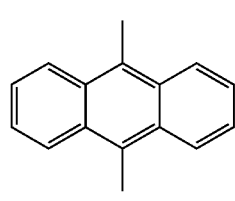 |
| (9-32) | 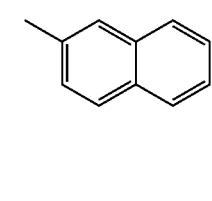 | | 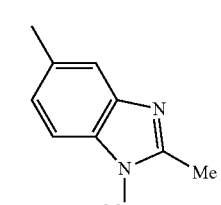 | 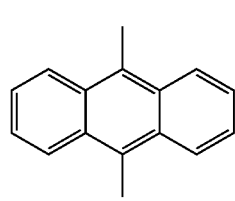 |
| (9-33) | 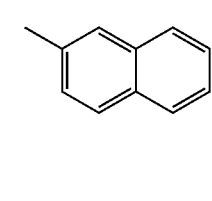 | | 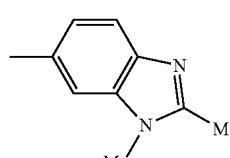 | 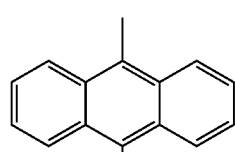 |
| (9-34) | 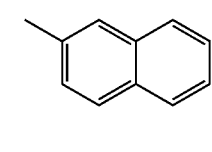 | | | |

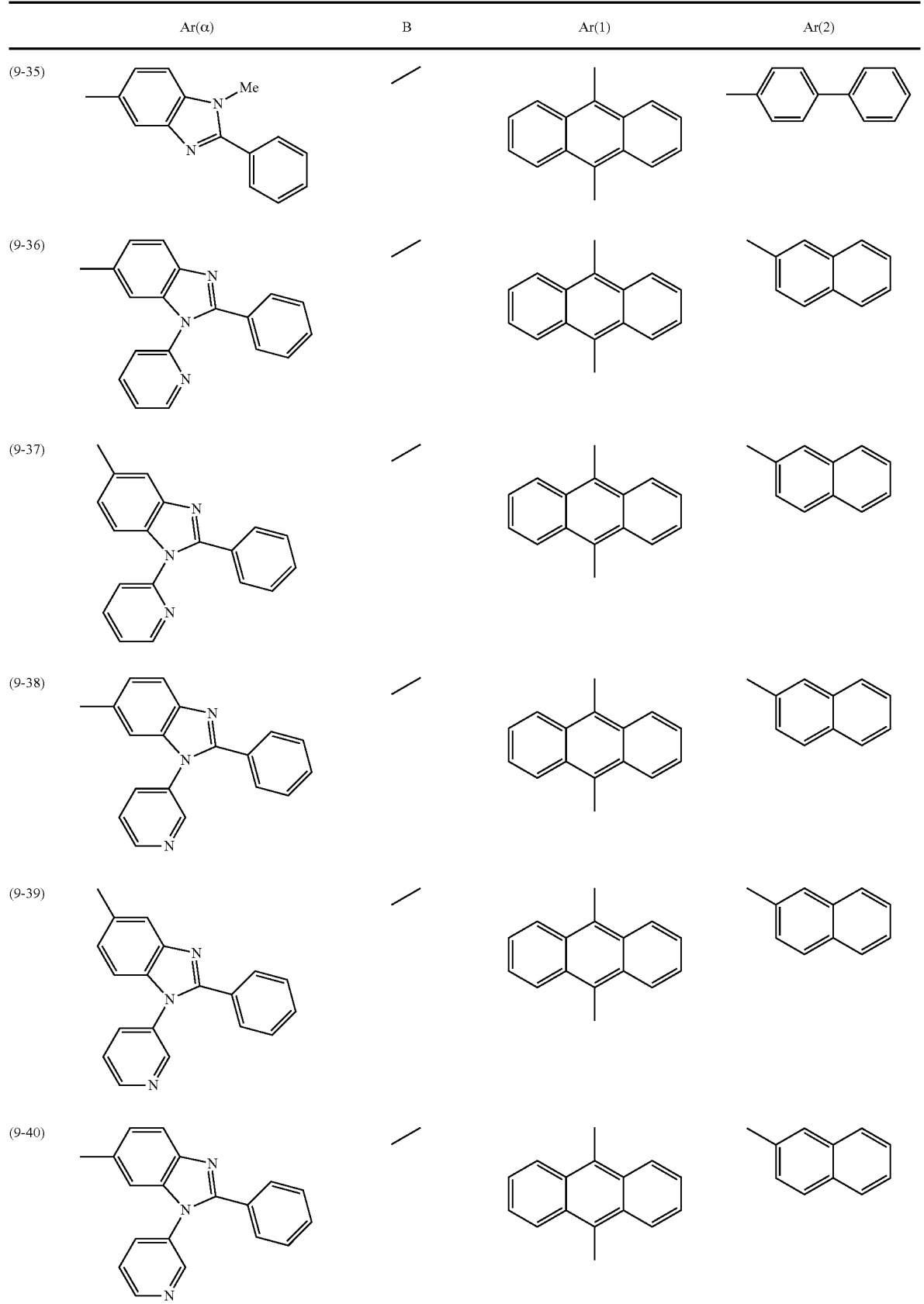

-continued
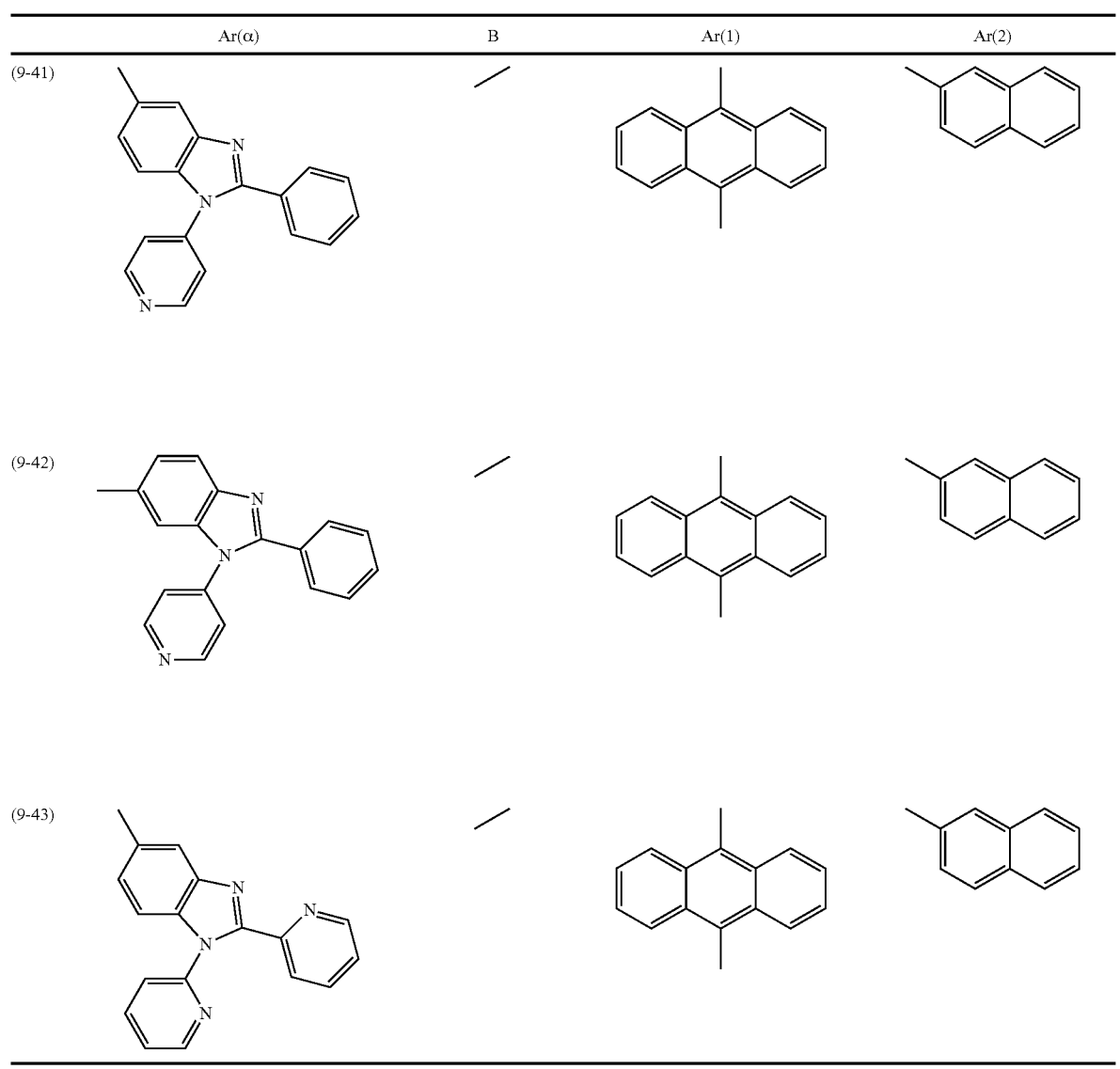
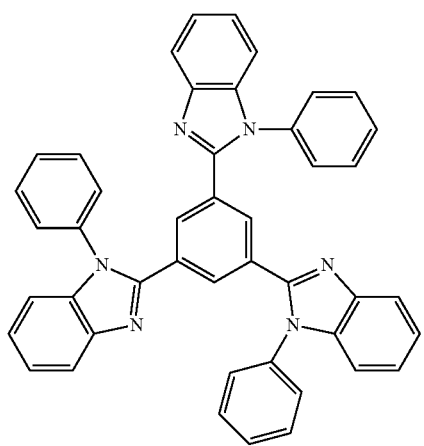
(9-44)
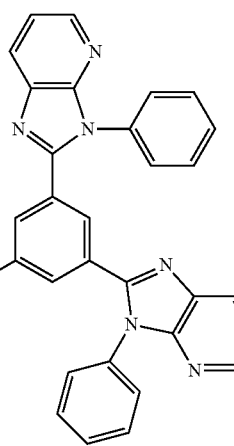
(9-45)

(9-46)

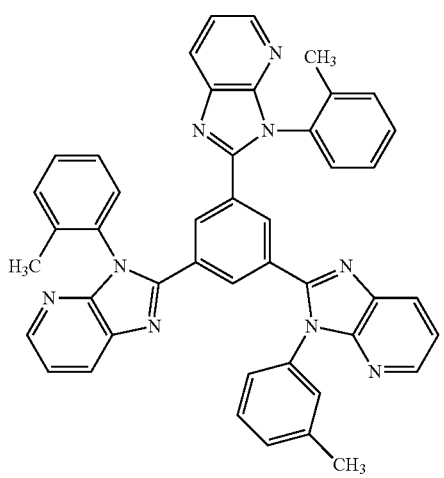

(9-47)

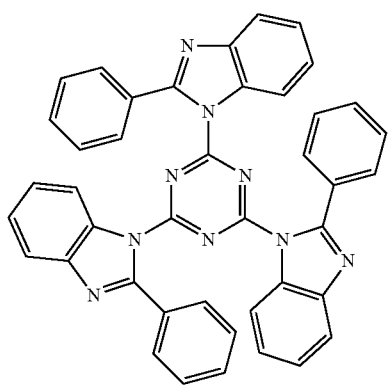

(9-48)

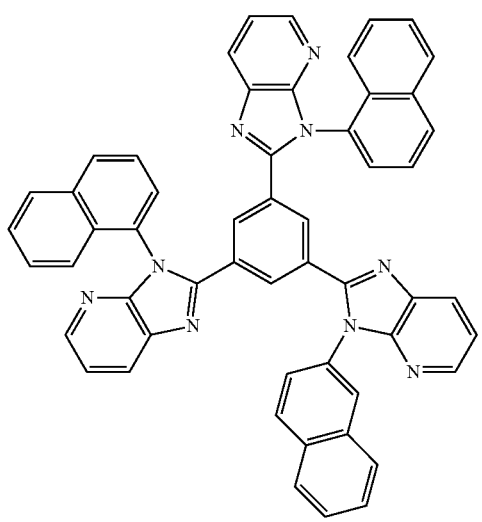

(9-49)

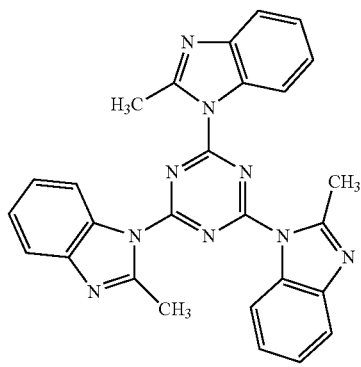

It is preferred that an organic material used in the electron-transporting layer be a compound having an anthracene skeleton as the above-mentioned compounds. The organic material used in the electron-transporting layer is not limited thereto. A benzimidazole derivative having a pyrene skeleton or a chrysene skeleton instead of an anthracene skeleton may be used. Further, not only one organic material is used in the electron-transporting layer, but also a plurality of organic materials may be used in the electron-transporting layer as a mixture or as a stacked layer. The above-mentioned compound may be used in the electron-injecting layer.

In the device of the invention, emission from the emitting layer can be outcoupled from the anode side, the cathode side or the both sides. The substrate and the electrode that are formed in the light-outcoupling direction is required to be transparent to light emitted from the organic EL device.

Subsequently, the configuration examples and the production method of the organic EL device and the display of the invention will be explained.

The organic EL device of the invention may have a configuration in which an anode, an organic layer stacked structure and a cathode are stacked on a first substrate (supporting substrate) in this sequence, or may have a configuration in which a cathode, an organic layer stacked structure and an anode are stacked on the first substrate in this sequence.

An electrode formed on the side nearer to the first substrate may be referred to as the "first electrode", and an electrode on the side nearer to the second substrate that is formed so that it is opposed to the first substrate may be referred to as the "second electrode". The first electrode corresponds to an anode or a cathode, and the second electrode corresponds to a cathode or an anode. Here, the organic layer stacked structure has a stacked layer structure in which one or plural hole-supplying layers, plural emitting layers, an electron-supplying layer (plural electron-supplying layers) are stacked in this sequence from the anode side, for example. Between the emitting layers, an intermediate layer is formed.

For the sake of convenience, a display having a configuration in which light is emitted from the second substrate may be called a "top-emission display" and a display having a configuration in which light is emitted from the first electrode may be called a "bottom-emission display".

In a display, plural organic EL devices may be arranged in a stripe, a diagonal, a delta or a rectangle.

If a display is driven in an active matrix manner, the first electrode is patterned according to a pixel, and is connected to a thin film transistor provided in the first substrate. In this case, a display is configured such that a barrier comprising an insulating material is provided on the first electrode, and the first electrode is exposed in the bottom part of an opening provided in the barrier. The second electrode is formed in a state that it is insulated from the first electrode by the barrier and the organic layer stacked structure that cover the periphery of the first electrode. The second electrode may be formed as the so-called solid electrode without being patterned, and may serve as an electrode common to each pixel.

On the first substrate, normally, a device-driving part is provided. The organic EL device or the like of the invention are formed on or above the first substrate.

Each of the layers constituting the organic EL device between the anode and the cathode can be formed by the so-called dry process such as a vacuum vapor deposition method, an ionic beam method (EB method), a molecular beam epitaxy method (MBE) method, a sputtering method and an OVPD (organic vapor phase deposition) method.

The organic layer stacked structure can be formed by the so-called wet process such as a laser transfer method, a spin coating method, a dipping method, a doctor blading method, a coating method such as an ejection coating method and a spray coating method, and a printing method such as an ink jet printing method, an offset printing method, a letterpress printing method, an intaglio printing method, a screen printing method and a microgravure coating method. According to the properties of the materials constituting the organic layer stacked structure, a dry process and a wet process may be used in combination.

The first electrode is provided on an interlayer insulating layer, for example. This interlayer insulating layer covers a device driving part formed on the first substrate. The device driving part is formed of one or plural thin film transistors (TFT, Thin Film Transistor), and the TFT and the first electrode are electrically connected through a contact plug provided in the interlayer insulating layer. As the constituent materials of the interlayer insulting layer, a $SiO_2$-based material such as $SiO_2$, BPSG, PSG, BSG, AsSG, PbSG, SiON, SOG (spin-on glass), low-melting glass and glass paste; a SiN-based material; and an insulting resin such as polyimide can be used singly or in appropriate combination.

For the formation of an interlayer insulting layer, a known process such as a CVD method, a coating method, a sputtering method and various printing methods can be used. In a bottom-emission display, the interlayer insulating layer is required to be formed of a material that is transparent to light emitted from the organic EL device, and the device driving part is required to be formed such that it does not shield light from the organic EL device.

When a bus electrode formed of a low-resistant material is provided in the second electrode, it is desired that the bus electrode be provided at a position at which the projection image of the bus electrode is included in the projection image of the barrier. As the material for forming the bus electrode, aluminum, an aluminum alloy, silver, a silver alloy, copper, a copper alloy, gold and a gold alloy can be mentioned, for example.

If a top-emission display is configured, it may be configured such that a protective layer and an adhesion layer (sealing layer) be formed from the second electrode side between the second electrode and the second substrate. As the material constituting the protective layer, it is preferable to use a material that is transparent to light that is emitted in the emitting layer, and is dense enough to prevent transmission of water. Specifically, a material that is mainly formed of carbon such as amorphous silicon (α-Si), amorphous silicon carbide (α-SiC), amorphous silicon nitride (α-$Si_{1-x}N_x$), amorphous silicon oxide (α-$Si_{1-y}O_y$), amorphous carbon (α-C), amorphous silicon oxide nitride, silicon nitride (α-SiON), $Al_2O_3$, diamond-like carbon (DLC, Diamond Like Carbon) and carbon nanotubes or the like can be mentioned. Such an inorganic amorphous insulting material has a low water permeability since it does not form grains, and hence the use thereof leads to the formation of an excellent protective layer.

The protective layer may be formed from an insulating material or a conductive material having a thickness of 2 nm to 3 μm, for example. The protective layer may have a single layer structure of these materials, or it may be of a stacked layer structure. In particular, the protective layer made of nitride is dense and has an extremely high blocking effect against water, oxygen and other impurities that adversely affect the organic EL device.

It is preferred that the protective layer be formed by a film-forming method in which the energy of film forming particles is small, such as a vapor vacuum deposition method, or by a CVD method, since effects exerted on the underlayer can be minimized.

In order to prevent lowering in luminance by deterioration of the organic layer stacked structure, it is desired that the film-formation temperature be set to normal temperature, and further, in order to prevent peeling of the protective layer, it is desired that the protective layer be formed under conditions where the stress exerted on the protective layer is minimized. It is preferred that the protective layer be formed without exposing the electrode that has already been formed to air. As a result, deterioration of the organic layer stacked structure by water or oxygen in the air can be prevented. Further, if a display is a top-emission display, it is preferred that the protective layer be formed of a material that transmits 80% or more of light generated in the organic layer stacked structure, for example. Specifically, the protective layer can be formed of an inorganic amorphous insulating material. For example, the material mentioned above can be exemplified. If the protective layer is formed of a conductive material, the protective layer may be formed of a transparent conductive material such as ITO or IZO.

As the material for constituting an adhesive layer (sealing layer), a thermosetting adhesive such as an acrylic adhesive, an epoxy adhesive, a urethane adhesive, a silicone adhesive and a cyano acrylate adhesive, and a UV setting adhesive can be mentioned.

In the meantime, even if a bottom-emission display is formed, it can be configured that the protective layer and the adhesive layer are formed from the second electrode side between the second electrode and the second substrate.

The display of this invention can also be used as a backlight device for a liquid crystal display device or a lightening device that includes a planar light source device.

Hereinbelow, a specific description will be made on one embodiment of the organic EL device and a display using the organic EL device.

Figure 2:
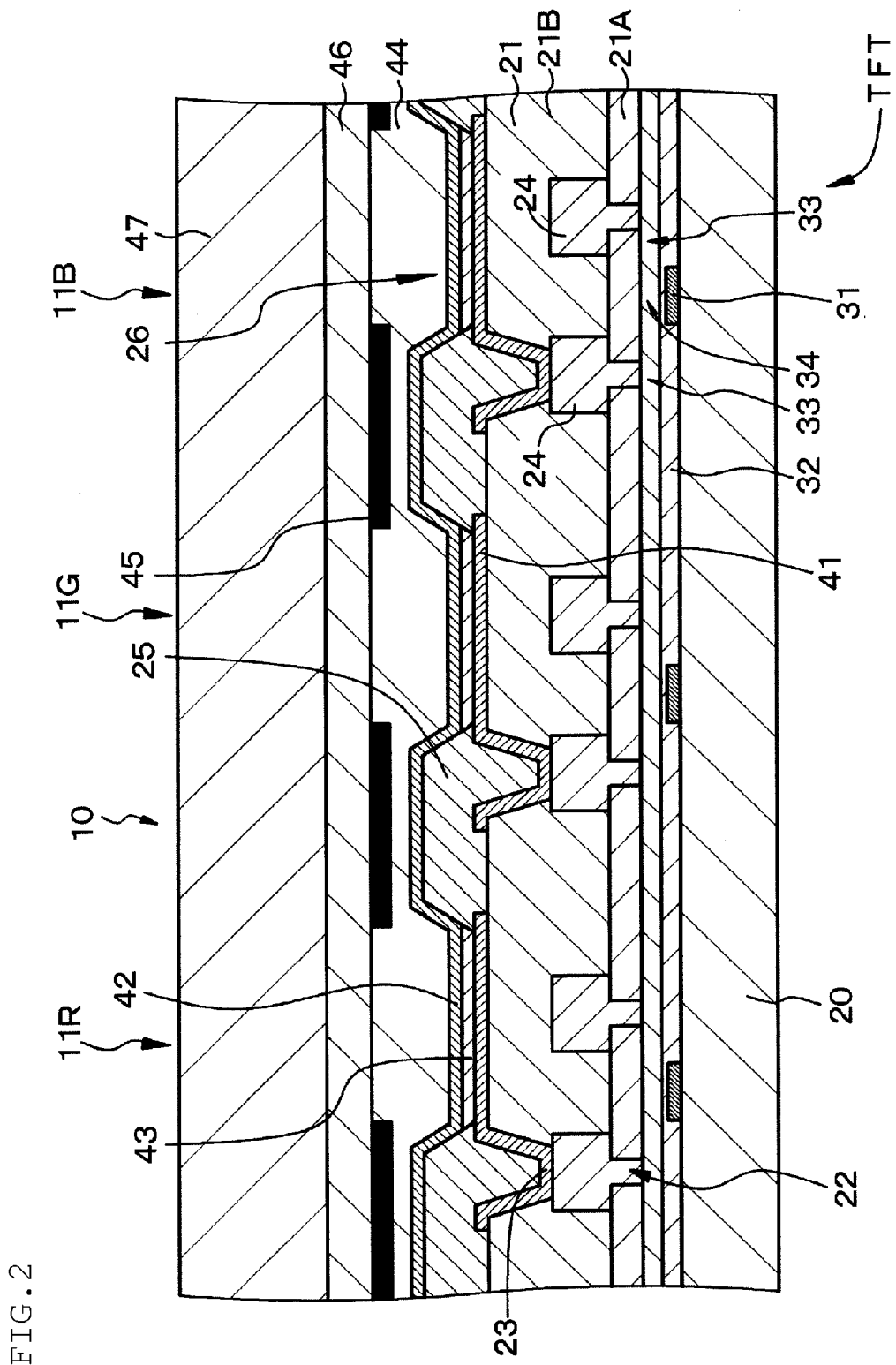
FIG. 2 is a schematic partial cross-sectional view showing a part of the cross-sectional construction of an image display part in the display according to one embodiment of the invention.
Figure 3:
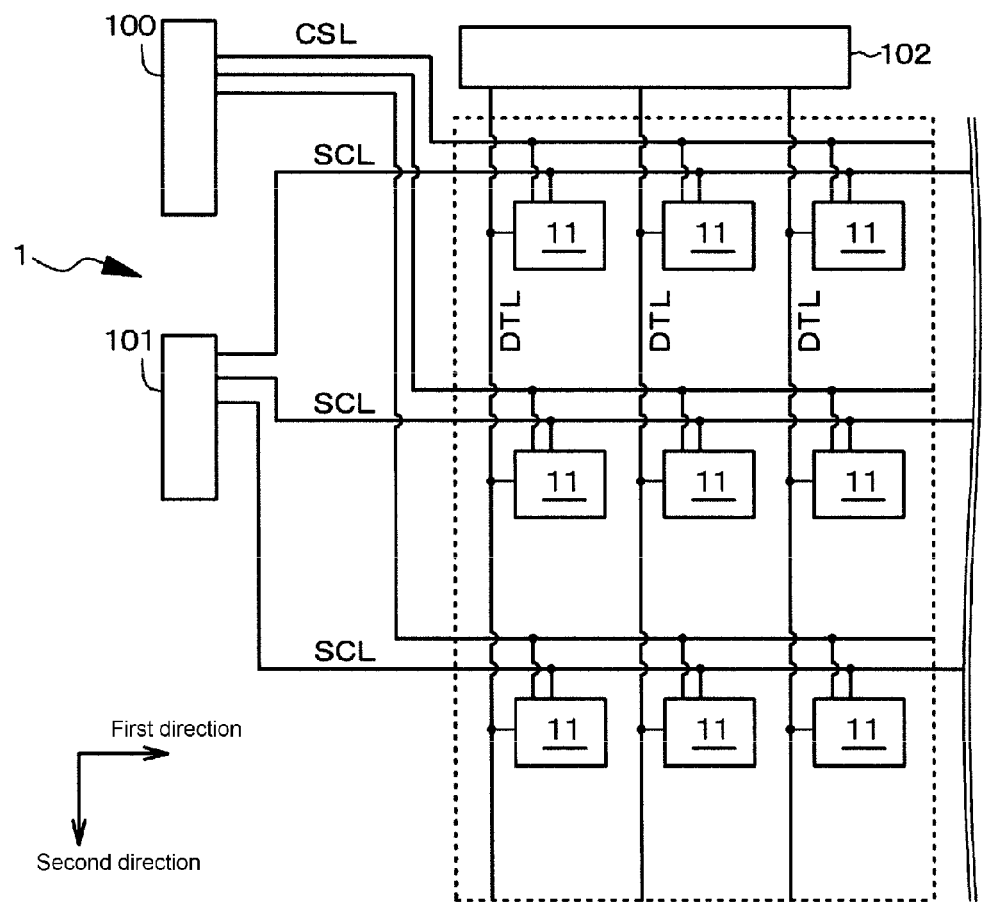
FIG. 3 is a conceptual view of the display according to one embodiment of the invention.
Figure 4:
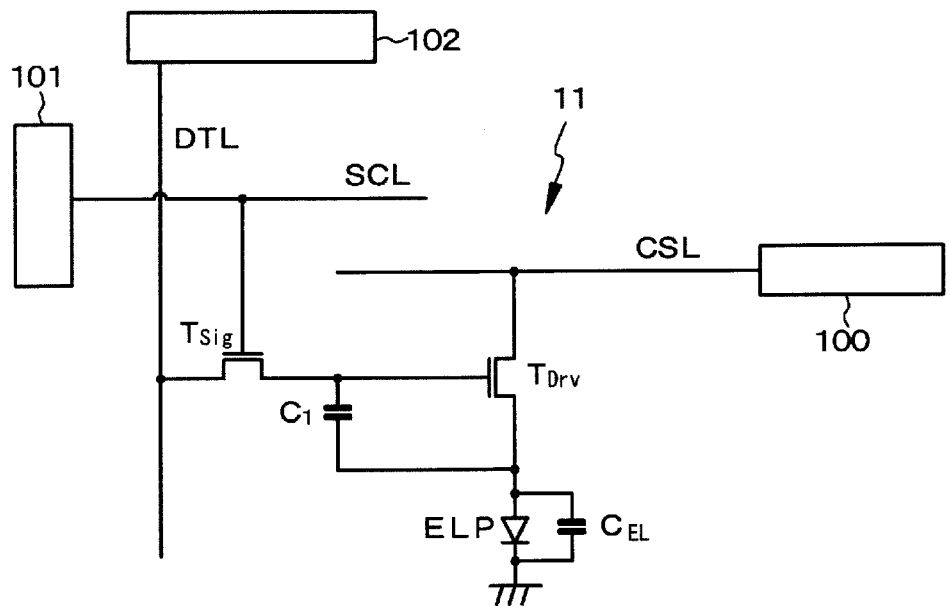
FIG. 4 is a conceptual view of a pixel driving circuit in the display according to one embodiment of the invention.

FIG. 1 is a schematic partial cross-sectional view of the organic EL device according to one embodiment of the invention;

FIG. 2 is a schematic partial cross-sectional view showing the cross sectional structure of an image display part of the display according to one embodiment of the invention;

FIG. 3 is a conceptual view of the display according to one embodiment of the invention; and FIG. 4 is a conceptual view of a pixel driving circuit of the display according to one embodiment of the invention (an example in which the driving circuit is allowed to be one (2Tr/1C driving circuit) comprising two transistors $T_{Drv}$ and $T_{Sig}$ and one capacitor $C_1$).

An organic EL device 11 has a structure in which an anode (first electrode) 41, an organic layer stacked structure 43 and a cathode (second electrode) 42 are stacked in this sequence on a first substrate 20. The organic layer stacked structure 43 has a configuration in which a hole-supplying layer 51 (a hole-injecting layer 51₁ and a hole-transporting layer 51₂), an emitting layer 52 and an electron-supplying layer 53 (a first layer 53₁ and a second layer 53₂) are stacked in sequence from the first electrode side, for example. That is, a part of the organic layer stacked structure 43 that is in contact with the anode 41 is formed of the hole-injecting layer 51₁ and a part of the organic layer stacked structure 43 that is in contact with the cathode 42 is formed of a second layer 53₂ of the electron-supplying layer 53. In this organic EL device 11, emission light generated when holes injected from the anode 41 and electrons injected from the cathode 42 are recombined in the emitting layer 52 is outcoupled through a second substrate 47 that is opposed to the first substrate 20. More specifically, as for the emitting layer 52, a red-emitting layer, a blue-emitting layer and a green-emitting layer are stacked in sequence from the anode side, as described later.

A display 1 is provided with organic EL devices 11 arranged in a two-dimensional matrix form, and is a top-emission display. This display 1 is used as an organic EL television apparatus or the like. For example, in this display, on the first substrate 20, as a display region, plural organic EL devices 11 are arranged in a matrix. In FIG. 2, the organic EL device 11 comprises a red organic EL device 11R, a green organic EL device 11G and a blue organic EL device 11B. In the periphery of the display region, an image signal output circuit 102 that is a driver for image display, a scanning circuit 101 and a current supply part 100 are provided (FIGS. 3 and 4). One pixel is formed by combination of adjacent organic EL device 11 (the red organic EL device 11R, the green organic EL device 11G and the blue organic EL device 11B). Further, by each of the red organic EL device 11R, the green organic EL device 11G and the blue organic EL device 11B, a sub-pixel is formed.

Specifically, an image display part 10 is provided with:
(a) a first substrate 20;
(b) a driving circuit provided on the first substrate 20;
(c) an interlayer insulting layer 21 that covers the driving circuit;
(d) an emitting part (organic stacked layer structure 43) provided on the interlayer insulating layer 21;
(e) a protective layer 44 provided on the emitting part (organic stacked layer structure 43);
(f) a light-shielding layer 45 provided on the protective layer 44; and
(g) a second substrate 47 that covers the protective layer 44 and the light-shielding layer 45 (FIG. 2)

More specifically, a driving circuit is provided on the first substrate 20 made of soda glass. The driving circuit is formed of plural TFTs. A TFT comprises a gate electrode 31 formed on the first substrate 20, a gate insulating film 32 formed on the first substrate 20 and the gate electrode 31, a source/drain region 33 provided on a semiconductor layer formed on the gate insulating film 32 and a channel-forming region 34 that is in the source/drain region 33 and corresponds to a part of a semiconductor layer positioned above the gate electrode 31. In the shown example, the TFT is configured as a bottom-emission TFT. However, it may be a top-gate TFT. The electrode 31 of the TFT is connected to a scanning line SCL (not shown in FIG. 2). An interlayer insulating layer 21 (21A and 21B) covers the first substrate 20 and the driving circuit.

The first electrode 41 that constitutes the organic electroluminescence device is provided on the interlayer insulating layer 21B that comprises $SiO_x$ or $SiN_y$, a polyimide resin or the like. The TFT and the first electrode 41 are electrically connected through a contact plug 22 provided on the interlayer insulating layer 21A, a wiring 23 and a contact plug 24. In the drawings, one TFT is shown for one organic EL device driving part.

On the interlayer insulating layer 21, an insulating layer (barrier) 25 having an opening 26 is formed, in which the first electrode 41 is exposed at the bottom part of the opening 26. The insulating layer 25 has excellent flatness, and in order to prevent deterioration of the organic layer stacked structure 43 by water to keep luminance, the insulating layer is formed of an insulating material having low water absorption (specifically, a polyimide resin). In a part ranging upwardly from the part of the first electrode 41 that is exposed to the bottom part of the opening 26 to the insulting layer 25 that surrounds the opening 26, the organic layer stacked structure 43 provided with an emitting layer that comprises an organic emitting material is formed. The organic layer stacked structure 43 has a stacked layer structure. However, in FIG. 2, it is shown as a single layer structure.

On the second electrode 42, in order to prevent water from reaching the organic layer stacked structure 43, based on a plasma CVD method, an insulating protective layer 44 formed of amorphous silicon nitride ($\alpha$-$Si_{1-x}N_x$) is provided. On the protective layer 44, a light-shielding layer 45 is formed. Above the protective layer 44 and the light-shielding layer 45, a second substrate 47 formed of soda glass is arranged. The protective layer 44, the light-shielding layer 45 and the second substrate 47 are connected by an adhesion layer 46 formed of an acrylic adhesive. The first electrode 41 is used as the anode (anode electrode) and the second electrode 42 is used as the cathode (cathode electrode). Specifically, the first electrode 41 is formed of a 0.2 μm to 0.5 μm-thick light-reflective material comprising aluminum (Al), silver (Ag) or an alloy thereof, and the second electrode 42 is formed of a 0.1 μm-thick transparent conductive material such as ITO and IZO, or is formed of a metal thin film (semi-transparent metal thin film) with a thickness of about 5 nm that transmits light to a certain degree such as silver (Ag) and magnesium (Mg). The second electrode 42 is not patterned, and is formed in a single sheet.

The second substrate (sealing substrate) 47 is provided with, for example, a color filter (not shown) and the light-shielding layer 45 as black matrix. It serves to allow light generated in the organic EL device 11 to be outcoupled, and absorbs external light reflected by the wiring between the organic EL devices 11, thereby to improve contrast.

In the red-emitting organic EL device 11R, the green-emitting organic EL device 11G and the blue-emitting organic EL device 11B, the color filters are each formed of a red filter, a green filter and a blue filter (each of them is not shown). The red filter, the green filter and the blue filer each have a rectangular shape, and are arrange without forming a gap. Each of the red filter, the green filter and the blue filter is formed of a resin in which a pigment is mixed. By appropriate selection of a pigment, light transmittance in a wavelength region of intended red, green or blue color becomes high and light transmittance in other wavelength regions becomes low.

The light-shielding layer 45 is formed of, for example, a black resin film (specifically, a black polyimide resin) in which a black colorant is mixed, and having an optical density of 1 or more. Alternatively, the light-shielding layer 45 is formed of a thin film filter that utilizes interference of a thin film. The thin film filter is formed by stacking two or more films made of a metal, a metal nitride or a metal oxide. This layer serves to attenuate light by utilizing interference of the thin film. As the thin film filter, specifically, a filter obtained by alternately stacking Cr and chromium oxide (III) ($Cr_2O_3$) can be given.

In the display region, a pixel driving circuit is provided (FIGS. 3 and 4). The pixel driving circuit is an active-type driving circuit formed below the anode (first electrode) 41. This pixel driving electrode is provided with:

(A) a scanning circuit 101;
(B) an image signal output circuit 102;
(C) a current-supply part 100;
(D) M current-supply lines CSL that are connected to the current-supply part 100 and are extended in the first direction;
(E) M scanning lines SCL that are connected to the scanning circuit 101 and are extended in the first direction; and
(F) N data lines DTL that are connected to the image signal output circuit 102 and are extended in the second direction.

The organic EL devices 11 are arranged in a two-dimensional matrix form in which N devices are arranged in the first direction and M devices are arranged in the second direction that is different from the first direction (total: N×M). Each device has an emitting part ELP (specifically, an organic EL emitting part). The symbol $C_{EL}$ indicates the parasitic capacity of the emitting part. The device is further provided with a driving circuit for driving the emitting part ELP. This driving circuit is connected to the current supply line CSL, the scanning line SCL and the data line DTL. In FIG. 3, 3×3 organic EL devices 11 are shown, but these devices are illustrated only for exemplification. The scanning circuit 101 is arranged on the both ends or one end of the scanning line SCL. The region at which the data line DTL and the scanning line SCL intersects corresponds to any one (sub pixel) of each organic EL device 11.

The driving circuit is formed of at least:

(A) a driving transistor $T_{Drv}$ provided with a source/drain region, a channel-forming region and a gate electrode;
(B) an image signal wiring transistor $T_{Sig}$ provided with a source/drain region, a channel-forming region and a gate electrode; and
(C) a capacitance part $C_1$ The driving transistor $T_{Drv}$ and the image signal writing transistor $T_{Sig}$ are specifically formed of a thin film transistor (TFT).

In the driving transistor $T_{Drv}$, (A-1) one of the source/drain regions is connected to the current supply line CSL;
(A-2) the other source/drain region is connected to the emitting part ELP and is connected to one end of the capacity part $C_1$; and
(A-3) the gate electrode is connected to the other source/drain region of the image signal wiring transistor $T_{Sig}$ and is connected to the other end of the capacitance part $C_1$.

On the other hand, in the image signal writing transistor $T_{Sig}$, (B-1) one of the source/drain regions is connected to the data line DTL; and
(B-2) the gate electrode is connected to the scanning line SCL.

The driving transistor $T_{Drv}$ and the image signal writing transistor $T_{Sig}$ are each formed of an n-channel TFT provided with a source/drain region, a channel-forming region and a gate electrode.

In this display device 1, for each sub-pixel, a scanning signal is supplied from the scanning circuit 101 through the gate electrode of the image signal writing transistor $T_{Sig}$, and at the same time, an image signal is retained in the storage capacitor $C_1$ through the image signal writing transistor $T_{Sig}$ from the image signal output circuit 102. That is, the driving transistor $T_{Drv}$ is allowed to be subjected to on-off control depending on the signal retained in this storage capacitor $C_1$, as a result, a driving current $I_d$ is flown in the organic EL device 11, whereby holes and electrons are recombined in the emitting layer 52 to cause emission. This light is outcoupled through the first electrode 41 and the first substrate 20 in the case of a bottom-emission display, or is outcoupled through the second electrode 42, the color filter (not shown) and the second substrate 47 in the case of a top-emission display.

In this embodiment, as shown in FIG. 1, the organic EL device 11 is provided with the organic layer stacked structure 43 in which plural emitting layers 52 that emit light of different colors are stacked between the anode 41 and the cathode 42. The emitting layer 52 has a configuration in which, between the anode 41 and the cathode 42, a first emitting layer $52_1$ that emits red light, an intermediate layer $52_4$, a second emitting layer $52_2$ that emits blue light and a third emitting layer $52_3$ that emits green light are stacked from the anode side. Then, by overlapping of light emitted from the plural emitting layers $52_1$, $52_2$ and $52_3$, white light is emitted.

In the above embodiment, three emitting layers are provided. The number of the emitting layer is not limited to three. For example, two emitting layers may be formed. The emitting layer may be either a fluorescent emitting layer or a phosphorescent emitting layer, or may be a combination of them.

The exemplified intermediate layer is formed of a single layer. The intermediate layer may be of a stacked layer structure of two or more layers. In this case, it suffices that the compound represented by the formula (1) mentioned above be contained in any of the intermediate layers.

Figure 5:
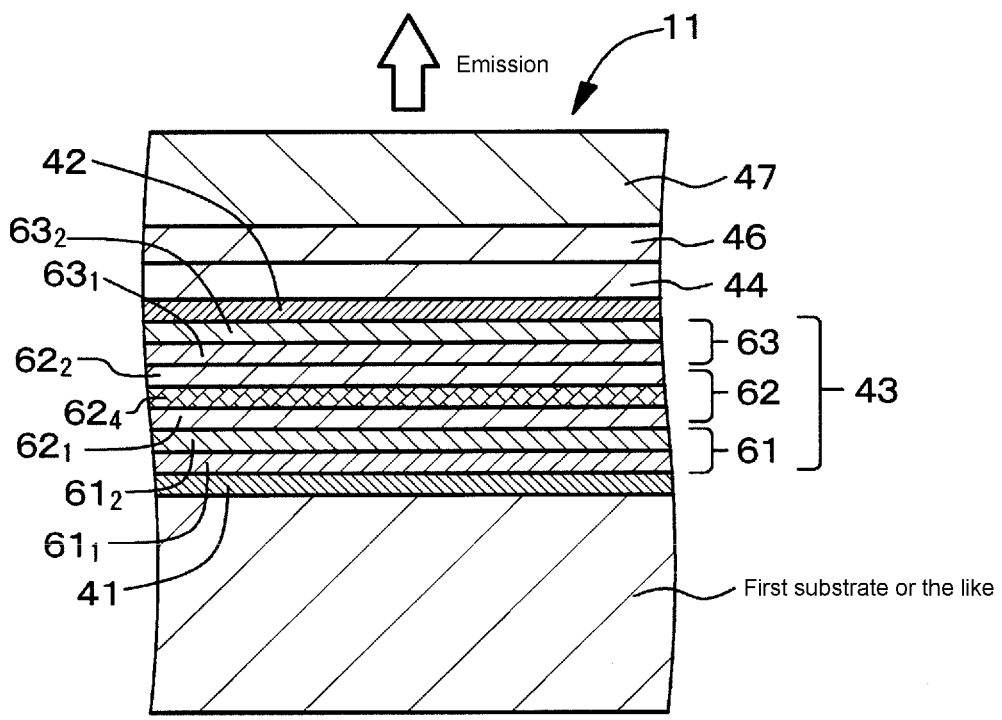
FIG. 5 is a schematic partial cross-sectional view of an organic EL device according to another embodiment of the invention.

FIG. 5 is a schematic partial cross-sectional view of the organic EL device according to another embodiment of the invention.

The device of this embodiment is the same as the device shown in FIG. 1 mentioned above, except for an emitting layer 62 of the organic layer stacked layer structure 43. Therefore, an explanation is omitted. A hole-supplying layer 61 and an electron-supplying layer 63 are the same as the hole-supplying layer 51 and the electron-supplying layer 53 in FIG. 1.

In the device of the invention, the emitting layer 62 has a configuration in which a first emitting layer $62_1$, an intermediate layer $62_4$ and a second emitting layer $62_2$ are stacked in this sequence from the anode (first electrode) 41. By overlapping of light emitted from the two emitting layers $61_1$ and $62_2$, the device emits white light.

In the device of this embodiment, it is preferred that at least one emitting layer (specifically, the first emitting layer $62_1$) of the remaining emitting layers other than the emitting layer that comprises an anthracene derivative as a host material (specifically, the second emitting layer $62_2$) be comprise at least a phosphorescent emitting material as the host material. It is preferred that the second emitting layer $62_2$ comprise an anthracene derivative as a host material.

EXAMPLES

Examples 1 to 9 and Comparative Examples 1 and 2

An organic EL device 11 having the layer configuration shown in FIG. 1 was fabricated.

First, on a glass plate (first substrate 20) having a dimension of 30 mm×30 mm, as the anode 41, an Al layer was formed in a film thickness of 200 nm. Thereafter, above a region other than a 2 mm×2 mm emitting region, an interlayer insulating layer 21 formed of $SiO_2$ was formed by a vacuum vapor deposition method.

Subsequently, on the anode 41 and the interlayer insulating layer 21, a 10 nm-thick hole-injecting layer $51_1$ formed of hexanitrileazatriphenylene [formula (21-1)] was formed by a vacuum vapor deposition method at a deposition rate of 0.2 nm/sec to 0.4 nm/sec. Thereafter, a 30 nm-thick hole-transporting layer $51_2$ formed of the compound represented by the following formula (31) was formed by a vacuum vapor deposition method at a deposition rate of from 0.2 nm/sec to 0.4 nm/sec.

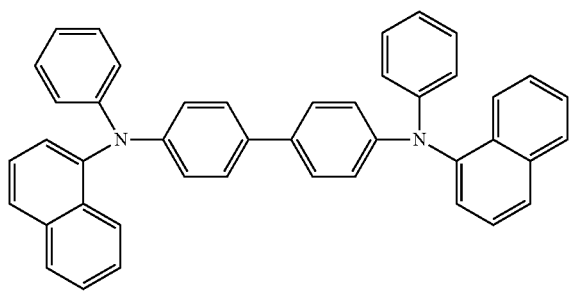

(31)

Subsequently, the emitting layers $52_1$, $52_2$, $52_3$ and an intermediate layer $52_4$ were stacked in the order, in the thickness and from the materials shown in Tables 1 and 2. The "%" of the dopant material shown in the Tables is a doping concentration (film thickness ratio).

Thereafter, as the electron-transporting layer, a compound represented by the following formula (32) was formed on the emitting layer 52 in a film thickness of 100 nm. The first emitting layer $52_1$ exhibits hole-transporting properties and the second emitting layer $52_2$ and the third emitting layer $52_3$ exhibit electron-transporting properties.

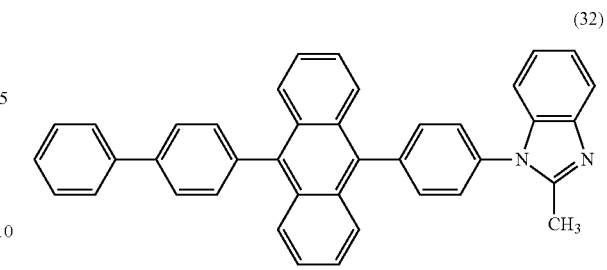

(32)

Subsequently, as the first layer of the cathode, LiF was formed in a thickness of about 0.3 nm (deposition rate: 0.01 nm/sec) by a vacuum vapor deposition method. Thereafter, as the second layer, Mg—Ag was formed in a film thickness of 10 nm by a vacuum vapor deposition method, whereby the cathode 42 having a two-layer structure was provided.

The interface between the anode 41 and the hole-injecting layer $51_1$ serves as the first end surface of the cavity structure (resonator structure) and the interface between the first layer of the cathode 42 and the second layer of the cathode 42 serves as the second end surface of the resonator structure.

An organic EL device was fabricated in the manner as mentioned above. By using the resulting organic EL device, the chromaticity, the voltage and the external quantum efficiency were measured under driving condition of 10 mA/cm². Further, a luminance after conducting constant current driving for 1000 hours at an initial luminance of 400 nit and at a temperature of 50° C. was measured, and a relative luminance for the initial luminance was calculated.

The measurement results are shown in Table 1 and Table 2. In Table 1 and Table 2, the "EQE ratio" indicates a relative value when the value of the external quantum efficiency of a sample in Example 1 was taken as "100", and the "relative luminance" indicates a relative value of the luminance after 1000 hours when the initial luminance of a sample in Example 1 was taken as "1".

TABLE 1

| | Anode side First emitting layer | Intermediate layer | Second emitting layer | Cathode side Third emitting layer | Chromaticity (x, y) | Voltage (V) | EQE ratio | Relative luminance |
|---|---|---|---|---|---|---|---|---|
| Example 1 | 10 nm Host (1) Dopant (1) (1%) | 10 nm Intermediate layer 1 | 10 nm Host (2) Dopant (3) (5%) | 10 nm Host (2) Dopant (2) (5%) | (0.28, 0.30) | 8.0 | 100 | 0.95 |
| Example 2 | 10 nm Host (1) Dopant (1) (1%) | 10 nm Intermediate layer 2 | 10 nm Host (4) Dopant (3) (5%) | 10 nm Host (4) Dopant (2) (5%) | (0.28, 0.30) | 8.0 | 99 | 0.95 |
| Example 3 | 10 nm Host (1) Dopant (1) (1%) | 10 nm Intermediate layer 3 | 10 nm Host (5) Dopant (3) (5%) | 10 nm Host (5) Dopant (2) (5%) | (0.28, 0.30) | 7.9 | 100 | 0.94 |
| Example 4 | 10 nm Host (1) Dopant (1) (1%) | 10 nm Intermediate layer 4 | 10 nm Host (6) Dopant (3) (5%) | 10 nm Host (6) Dopant (2) (5%) | (0.28, 0.30) | 8.1 | 100 | 0.95 |
| Example 5 | 10 nm Host (1) Dopant (1) (1%) | 10 nm Intermediate layer 5 | 10 nm Host (7) Dopant (3) (5%) | 10 nm Host (7) Dopant (2) (5%) | (0.28, 0.30) | 8.0 | 101 | 0.93 |
| Example 6 | 10 nm Host (1) Dopant (1) (1%) | 10 nm Intermediate layer 6 | 10 nm Host (8) Dopant (3) (5%) | 10 nm Host (8) Dopant (2) (5%) | (0.28, 0.30) | 8.1 | 98 | 0.95 |
| Example 7 | 10 nm Host (1) Dopant (1) (1%) | 10 nm Intermediate layer 7 | 10 nm Host (9) Dopant (3) (5%) | 10 nm Host (9) Dopant (2) (5%) | (0.28, 0.30) | 7.9 | 100 | 0.95 |
| Example 8 | 10 nm Host (1) Dopant (1) (1%) | 10 nm Intermediate layer 8 | 10 nm Host (10) Dopant (3) (5%) | 10 nm Host (10) Dopant (2) (5%) | (0.28, 0.30) | 7.9 | 101 | 0.96 |

TABLE 2

| | Anode side First emitting layer | Intermediate layer | Second emitting layer | Cathode side Third emitting layer | Chromaticity (x, y) | Voltage (V) | EQE ratio | Relative luminance |
|---|---|---|---|---|---|---|---|---|
| Example 9 | 10 nm<br>Host (1)<br>Dopant (1) (1%) | 10 nm<br>Intermediate layer 9 | 10 nm<br>Host (11)<br>Dopant (3) (5%) | 10 nm<br>Host (11)<br>Dopant (2) (5%) | (0.28, 0.30) | 8.0 | 100 | 0.95 |
| Comp. Ex. 1 | 10 nm<br>Host (1)<br>Dopant (1) (1%) | 10 nm<br>Intermediate layer 10 | 10 nm<br>Host (2)<br>Dopant (3) (5%) | 10 nm<br>Host (2)<br>Dopant (2) (5%) | (0.18, 0.19) | 8.0 | 85 | 0.70 |
| Comp. Ex. 2 | 10 nm<br>Host (1)<br>Dopant (1) (1%) | 3 nm<br>Intermediate layer 10 | 10 nm<br>Host (2)<br>Dopant (3) (5%) | 10 nm<br>Host (2)<br>Dopant (2) (5%) | (0.28, 0.30) | 8.0 | 85 | 0.70 |
| Example 10 | 10 nm<br>Host (1)<br>Dopant (1) (1%) | 5 nm/5 nm<br>Intermediate layer 11/<br>Intermediate layer 1 | 10 nm<br>Host (2)<br>Dopant (3) (5%) | 10 nm<br>Host (2)<br>Dopant (2) (5%) | (0.28, 0.30) | 7.8 | 100 | 0.93 |
| Example 11 | 15 nm<br>Host (3)<br>Dopant (4) (5%) | 10 nm<br>Intermediate layer 12 | 15 nm<br>Host (2)<br>Dopant (3) (5%) | | (0.34, 0.38) | 8.5 | 150 | 0.80 |
| Comp. Ex. 3 | 15 nm<br>Host (3)<br>Dopant (4) (5%) | 10 nm<br>Intermediate layer 13 | 15 nm<br>Host (2)<br>Dopant (3) (5%) | | (0.20, 0.20) | 8.5 | 100 | 0.40 |
| Example 12 | 10 nm<br>Host (1)<br>Dopant (1) (1%) | 10 nm<br>Intermediate layer 14 | 10 nm<br>Host (11)<br>Dopant (3) (5%) | 10 nm<br>Host (11)<br>Dopant (2) (5%) | (0.28, 0.30) | 8.0 | 100 | 0.95 |

The structures of the compounds shown in Table 1 and Table 2 used in each Example are shown below.

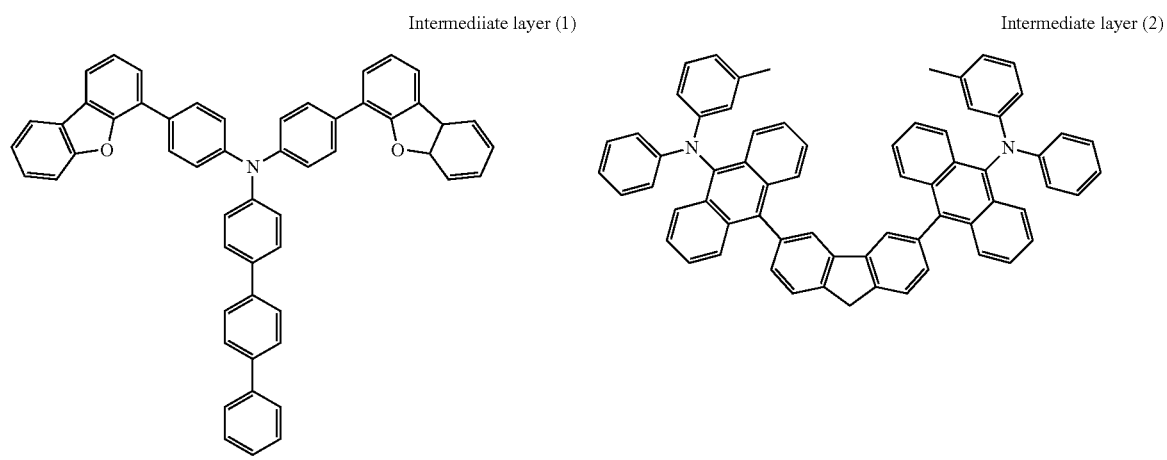

Intermediate layer (1)

Intermediate layer (2)

-continued
Intermediate layer (3) Intermediate layer (4)
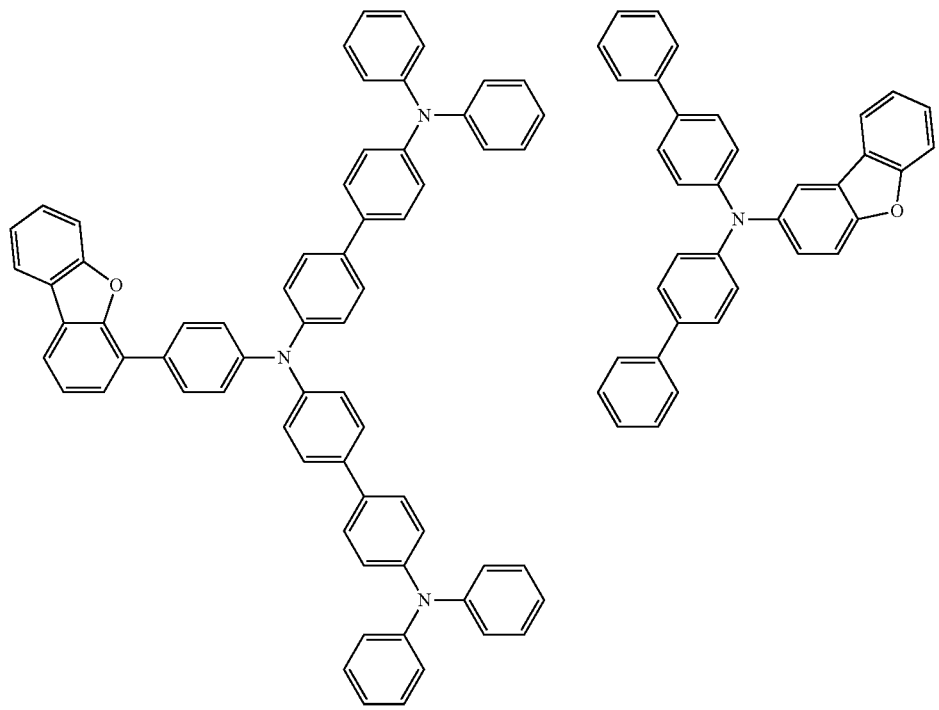
Intermediate layer (5)
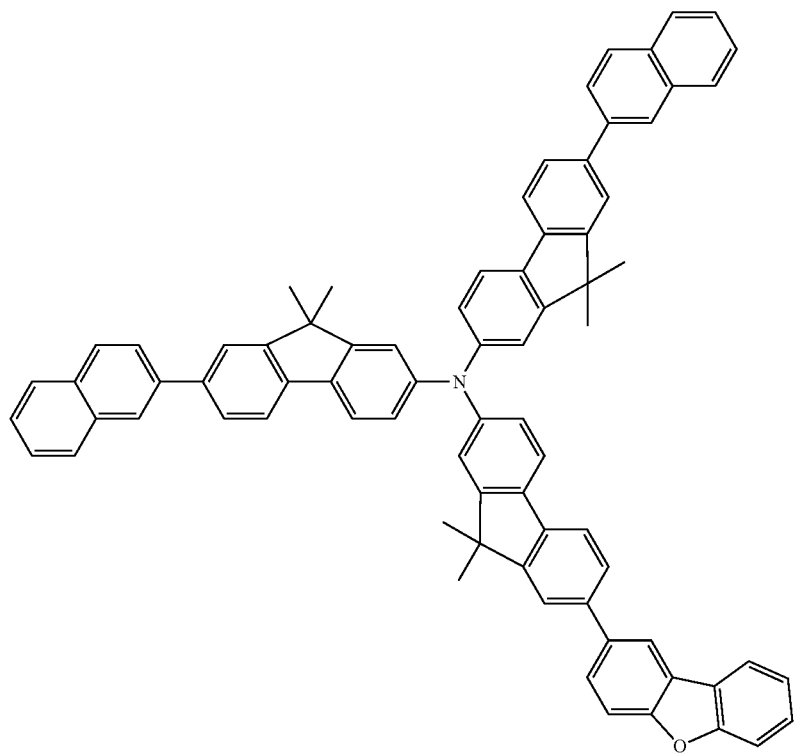

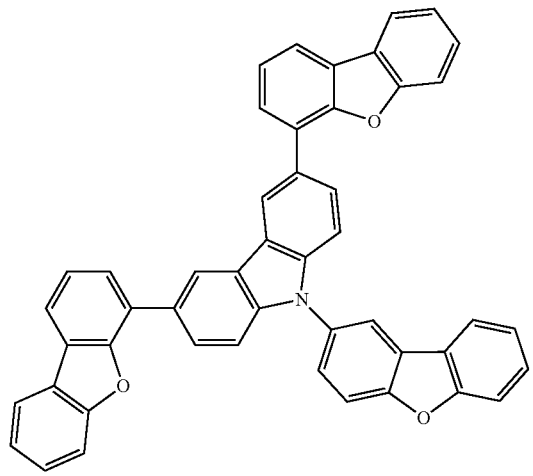
Intermediate layer (6)
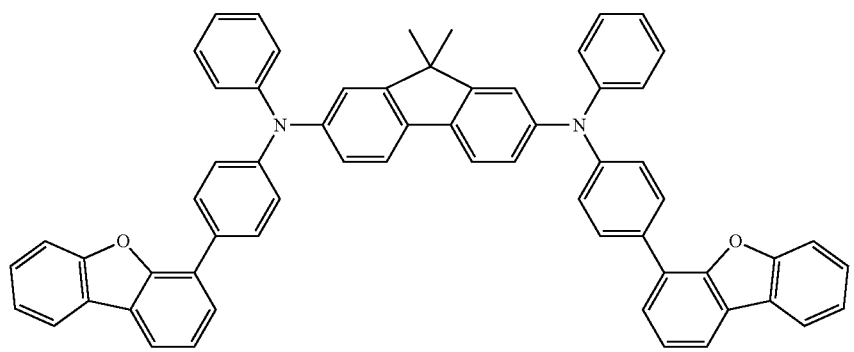
Intermediate layer (7)
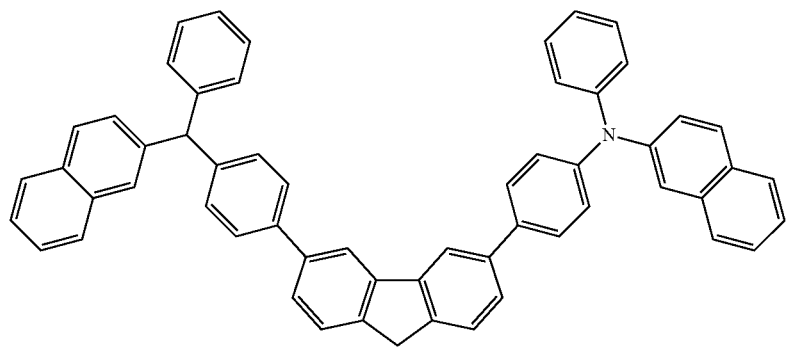
Inermediate layer (8)

Inermediate layer (9)
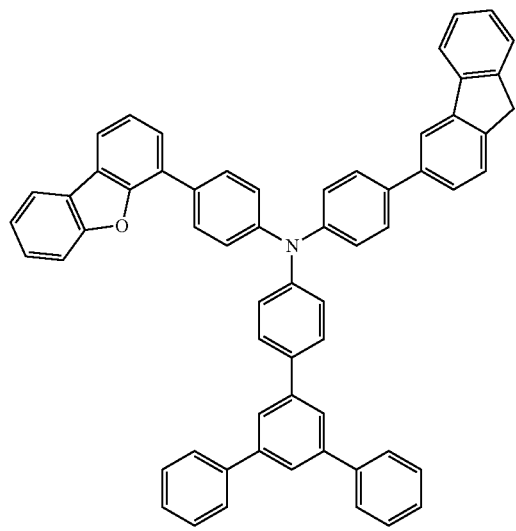
Inermediate layer (10)
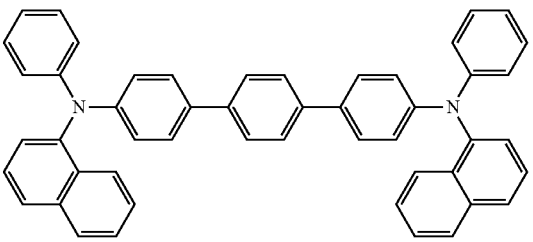
Inermediate layer (11)
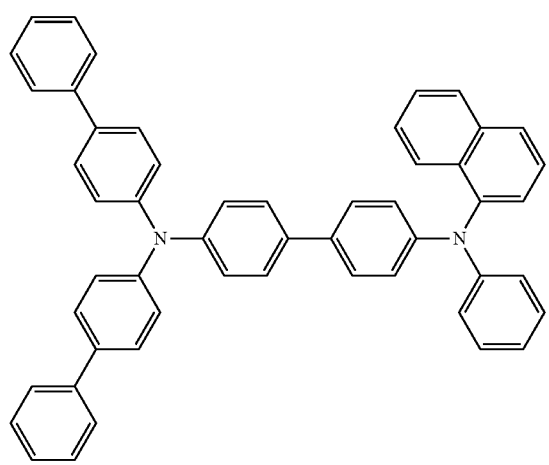
The host (1) is a red fluorescent host material, the host (2) is a green and blue fluorescent host material and the host (3) is a yellow phosphorescent host material.
Dopant (1)
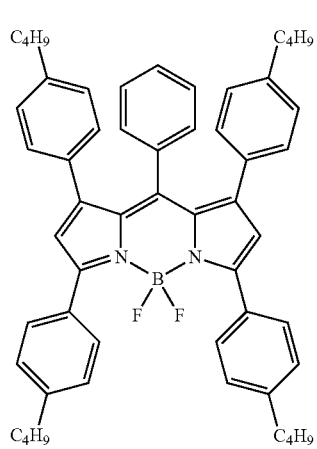
Dopant (2)
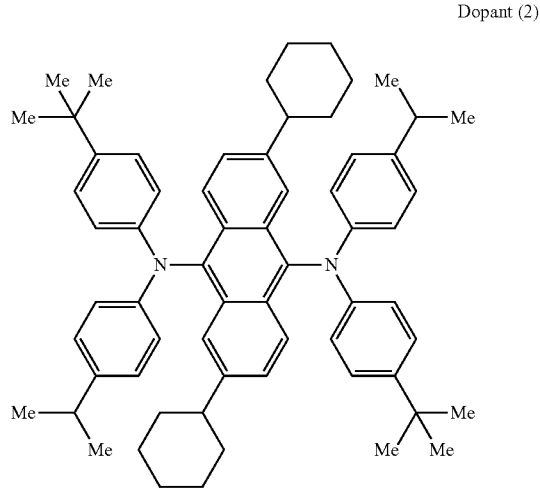

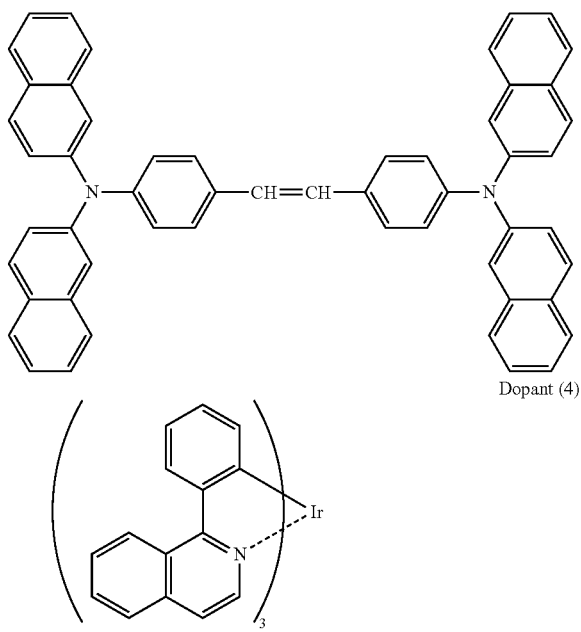

The dopant (1) is a red fluorescent dopant material, the dopant (2) is a green fluorescent dopant material, the dopant (3) is a blue fluorescent dopant material and the dopant (4) is a yellow phosphorescent dopant material.

In the organic EL devices in Examples 1 to 9, at least one emitting layer of the plural emitting layers (specifically, the second emitting layer and the third emitting layer) comprise, as a host material, an anthracene derivative (the host (2), the hosts (4) to (11) given above). The first emitting layer comprises the host (1) as a hole-transporting host material (the host (1) given above). The ionization potential of the hole-transporting material is less than 5.6 eV. Specifically, the host (1) has an ionization potential of 5.57 eV.

The ionization potential means energy necessary for removing electrons from each material to ionize the material, and was measured by means of an ultraviolet photoelectron spectroscopic analysis apparatus (AC-2: manufactured by Riken Keiki Co., Ltd.).

It is preferred that the hole-transporting material be a polycyclic aromatic hydrocarbon compound including a 4 to 7-membered mother skeleton. In Examples 1 to 9, the hole-transporting material is a naphthacene compound represented by the host (1). The emitting layer (first emitting layer) including the hole-transporting material comprises the dopant (1).

From the results of Examples 1 to 9, by using the intermediate layers (1) to (9) as the intermediate layer, white emission was confirmed, and the luminous life was sufficiently long.

On the other hand, in Comparative Example 1 and Comparative Example 2, the intermediate layer (10) formed of α-NPD was used. In Comparative Example 1, since the thickness of the intermediate layer 10 was allowed to be 10 nm, due to excessive electron blocking properties, emission balance was biased toward the cathode-side emitting layer as the blue-emitting layer, and white color was not obtained. In Comparative Example 2, since the thickness of the intermediate layer (10) was 3 nm, while white emission was obtained, deterioration was accelerated in the interface between the intermediate layer (10) and the second emitting layer that emits blue light, resulting in a short life.

Example 10

An organic EL device was fabricated in the same manner as in Example 1, except that the intermediate layer was allowed to be a stacked layer structure of the intermediate layer (1) (thickness: 5 nm) and the intermediate layer (11) (thickness: 5 nmm). However, the intermediate layer (1) is in contact with the second emitting layer $52_2$ and the intermediate layer (11) is in contact with the first emitting layer $52_1$.

The results are shown in Table 2.

In Example 10, the intermediate layer $52_4$ was a stacked layer structure of the intermediate layer (1) and the intermediate layer (11). It was confirmed that, by allowing the intermediate layer (1) to be arranged such that it was in contact with the second emitting layer $52_2$ that emitted blue light, white emission was obtained, and the luminous life was sufficiently long.

Example 11

An organic EL device having the layer configuration shown in FIG. 5 was fabricated.

Specifically, as shown in Table 2, between the anode 41 and the cathode 42, a first emitting layer (that emits yellow light) $62_1$, an intermediate layer $62_4$ composed of the intermediate layer (12) and a second emitting layer (that emits blue light) $62_2$ were stacked from the anode side, and the first emitting layer $62_1$ was formed such that it comprised at least a phosphorescent emitting material (specifically, the host (3)), and the second emitting layer $62_2$ comprises an anthracene derivative as a host material (specifically, the host (2) as a fluorescent material), and white light was emitted by overlapping of light emitted from the two emitting layers $62_1$ and $62_2$.

Various measurements were conducted in the same manner as in Example 1, and the results of the measurements are shown in Table 2. White emission was obtained and a long-lived organic EL device could be obtained.

Comparative Example 3

An organic EL device was fabricated and evaluated in the same manner as in Example 11, except that the intermediate layer (13) was used as the intermediate layer. The results are shown in Table 2.

In the case of the device of this Example, emission balance was biased toward the cathode-side emitting layer as the blue-emitting layer, white color was not obtained and the device had a short life.

Example 12

An organic EL device was fabricated in the same manner as in Example 9, except that the intermediate layer (14) was used as the intermediate layer. The results are shown in Table 2.

The invention is explained hereinabove. The invention is not restricted to the Examples and the Embodiments mentioned above. The configuration, structure, material used of the organic EL device and the display and the layer structure or the like of the organic EL device in the Examples are given only for exemplification, and can be appropriately modified. The display was explained as an active matrix display, but it can be a passive matrix display. The configuration of the pixel driving circuit for active matrix driving is not restricted to the configuration explained in the Examples. According to need, a capacitance element or a transistor may be added. In this case, according to the modification of the pixel driving circuit, in addition to the signal line driving circuit or the scanning line driving circuit, a necessary driving circuit may be added.

As the color filters provided in the organic EL device, a red color filter, a green color filter and a blue color filter were mentioned. Alternatively, a yellow color filter may be arranged. In the case of a white organic EL device, a color filter is not necessarily be provided. In the case of an organic EL device in which a pair of electrodes (anode and cathode) are provided and an organic stacked layer structure disposed between the electrodes, other constituent element (for example, an inorganic compound layer or an inorganic component) may be contained.

In the case of the organic EL devices explained in the Examples, by allowing them to have a resonant structure in which emission light is outcoupled after resonation between the first electrode and the second electrode, the color purity of the outcoupled light can be improved, and the intensity of the outcoupled light in the vicinity of the central wavelength of resonance can be improved. In this case, when the interface between the first electrode and the organic layer stacked layer structure is allowed to be a first end surface, the interface between the first layer of the second electrode and the second layer of the second electrode is allowed to be a second end surface and the organic stacked layer structure is allowed to be a resonator part, whereby light generated in the emitting layer can be resonated and outcoupled from the second end surface, it suffices that the optical length OL between the first end surface and the second end surface constituting the resonator satisfies the following formula (A). Actually, it is preferred that the optical length OL be selected such that it is a positive minimum value that satisfies the formula (A). The optical length is also called as the optical path length, and generally indicates n×L when a light ray travels a distance L in a medium having a refractive index of n.

$$(2 \cdot OL)/\lambda + \phi/(2\pi) = m \quad (A)$$

Wherein,
OL: the optical length between the first end surface and the second end surface (unit: nm)
$\phi$: the sum of the phase shift $\phi_1$ of reflected light generated in the first end surface and the phase shift $\phi_2$ of reflected light generated in the second end surface $\phi_2(\phi=\phi_1+\phi_2)$(unit: rad)
$\lambda$: the peak wavelength of the spectrum of light to be outcoupled from the side of the second end surface (unit: nm)
m: an integer that makes OL to be a positive value In the organic EL device, it is preferred that the optical length $OL_1$ between the maximum emission position in the emitting layer and the first end surface satisfy the following formulas (B-1) and (B-2), and that the optical length $OL_2$ between the maximum emission position and the second end surface satisfy the following formulas (C-1) and (C-2). Here, the maximum emission position means a position where the emission intensity is the largest in the emission region. For example, when light is emitted in both of the interface of the anode side of the emitting layer and the interface of the cathode side of the emitting layer, it suffices that an interface having a stronger emission intensity be chosen.

$$OL_1 = tL_1 + a_1 \quad (B-1)$$

$$(2tL_1)/\lambda = -\phi_1/(2\pi) + m_1 \quad (B-2)$$

$$OL_2 = tL_2 + a_2 \quad (C-1)$$

$$(2tL_2)/\lambda = -\phi_2/(2\pi) + m_2 \quad (C-2)$$

Wherein,
$\lambda$: the peak wavelength of the spectrum of light to be outcoupled
$tL_1$: the optical theoretical length between the first end surface and the maximum emission position
$a_1$: the correction amount based on emission distribution in the emitting layer
$\phi_1$: the phase shift (rad) of reflected light generated in the first end surface
$m_1$: 0 or an integer
$tL_2$: the optical theoretical length between the second end surface and the maximum emission position
$a_2$: the correction amount based on emission distribution in the emitting layer
$\phi_2$: the phase shift (rad) of reflected light generated in the second end surface
$m_2$: 0 or an integer The amounts of the phase shifts $\phi_1$ and $\phi_2$ can be obtained by measuring the values of the real number part and the imaginary number part of the complex index of refraction of a material constituting the first electrode and the second electrode by means of an ellipsometer, and by conducting calculation based on these values (see "Principles of Optic", Max Born and Emil Wolf, 1974 (PERGAMON Press)).

By satisfying the formulas (B-1) and (B-2), when light traveling towards the first electrode among the light generated in the emitting layer is reflected by the first end surface and returns, the phase of the return light and the phase of light emitted at the time of emission coincide, whereby the return light is in a relationship with the light traveling towards the second electrode among the light generating in the emitting layer that they intensity with each other. In addition, by satisfying the formulas (C-1) and (C-2), among the light generated in the emitting layer, when light traveling towards the second electrode is reflected by the second end surface and returns, the phase of the return light and the phase of light emitted at the time of emission coincide, whereby the return light is in a relationship with the light travelling towards the first electrode that they intensify with each other.

Here, by forming an electron-transporting layer in a thickness larger than the total thickness of the hole-supplying layers, it becomes possible to design such that the relationship between $m_1$ and $m_2$ in the formulas (B-1), (B-2), (C-1) and (C-2) become $m_1 > m_2$. As a result, light coupling efficiency can be enhanced.

The optical theoretical length $tL_1$ in the formula (B-1) and the optical theoretical length $tL_2$ in the formula (C-1) are, when an assumption is made that the emission region has no spread, changes in amount of the phase at the first end surface or the phase at the second end surface and changes in amount of the phase caused by travelling are offset, thereby enabling the phase of the return light to coincide with the phase of light emitted at the time of emission. However, the emission region normally has a spread, in the formulas (B-1) and (C-1), correction amounts $a_1$ and $a_2$ based on the emission distribution are added.

The correction amounts $a_1$ and $a_2$ differ according to the emission distribution. However, if the maximum emission position is on the second electrode side of the emitting layer, and the emission distribution spreads from the maximum emission position to the first electrode side or if the maximum emission position is on the first electrode side of the emitting layer, and the emission distribution spreads from the maximum emission position to the second electrode side, it can be obtained from the following formulas (D-1) and (D-2), for example.

$$a_1 = b \cdot \ln(s) \tag{D-1}$$

$$a_2 = -a_1 \tag{D-2}$$

In the formulas (D-1) and (D-2), when the emission distribution in the emitting layer spreads from the maximum emission position to the direction of the first electrode, the "b" is in the range of $2n_{ave} \leq b \leq 6n_{ave}$, and when it spreads from the maximum emission position to the direction of the second electrode, the "b" is the range of $-6n_{ave} \leq b \leq -2n_{ave}$. The "s" is the physical property value relating to the emission distribution in the emitting layer (1/e attenuation distance), and the "$n_{ave}$" is an average refractive index of a material that is present between the first end surface and the second end surface at a peak wavelength λ of the spectrum of light to be outcoupled.

INDUSTRIAL APPLICABILITY

The organic EL device and the display of the invention can be used for a planar emitting body such as a flat panel display of a wall-hanging television, lightings, a copier, a printer, a backlight of a liquid crystal display, or a light source in instruments or the like, a sign board, a signal light or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in this specification and the Japanese application specification claiming priority under the Paris Convention are incorporated herein by reference in its entirety.

The invention claimed is:

1. An organic electroluminescence device that comprises, between an anode and a cathode, an organic layer stacked structure that comprises stacked plural emitting layers that emit light of different colors,
wherein the organic electroluminescent device comprises, between the emitting layers, at least one intermediate layer that comprises a compound represented by the following formula (1):

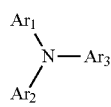
(1)

wherein in the formula (1), $Ar_1$ to $Ar_3$ are independently a substituted or unsubstituted aromatic hydrocarbon group including 6 to 50 ring carbon atoms or a substituted or unsubstituted heterocyclic group including 5 to 30 ring atoms, and any one pair of $Ar_1$ and $Ar_2$, $Ar_1$ and $Ar_3$ and $Ar_2$ and $Ar_3$ may be bonded to each other to form a substituted or unsubstituted nitrogen-containing heterocyclic ring including a nitrogen atom in the formula (1),
provided that at least one of $Ar_1$ to $Ar_3$ is a heterocyclic group represented by the following formula (2):

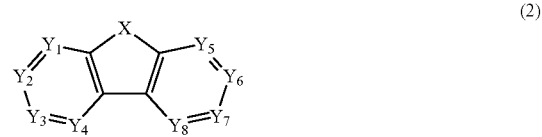
(2)

wherein in the formula (2), X is an oxygen atom or a sulfur atom and $Y_1$ to $Y_8$ are a carbon atom;
one of $Y_1$ to $Y_8$ is a carbon atom that is bonded to the following $L_1$ and the other seven of $Y_1$ to $Y_8$ are independently a carbon atom that is bonded to the following R or form a substituted or unsubstituted ring that includes an adjacent carbon atom;
$L_1$ is a linkage group that is bonded to a nitrogen atom in the formula (1), and is a single bond or a substituted or unsubstituted aromatic hydrocarbon group including 6 to 50 ring carbon atoms;
R is a hydrogen atom, a substituted or unsubstituted alkyl group including 1 to 10 carbon atoms, a substituted or unsubstituted cycloalkyl group including 3 to 10 ring carbon atoms, a substituted or unsubstituted trialkylsilyl group including 3 to 10 carbon atoms, a substituted or unsubstituted triarylsilyl group including 18 to 30 ring carbon atoms, a substituted or unsubstituted alkylarylsilyl group including 8 to 15 carbon atoms (an aryl part includes 6 to 14 ring carbon atoms), a substituted or unsubstituted aromatic hydrocarbon group including 6 to 16 ring carbon atoms, a substituted amino group, a group including a substituted amino group, a halogen atom or a cyano group.

2. The organic electroluminescence device according to claim 1, wherein at least one emitting layer of the plural emitting layers comprises an anthracene derivative as a host material.

3. The organic electroluminescence device according to claim 2, wherein the anthracene derivative is a compound represented by the following formula (3):

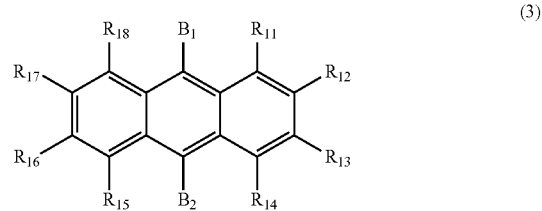
(3)

wherein in the formula (3), $B_1$ and $B_2$ are independently a substituted or unsubstituted aromatic hydrocarbon group including 6 to 20 ring carbon atoms; and
$R_{11}$ to $R_{18}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsilyl group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

4. The organic electroluminescence device according to claim 2, wherein at least one emitting layer of the remaining emitting layers other than the emitting layer that comprises an anthracene derivative as a host material comprises at least compound A having an ionization potential of less than 5.6 eV as a host material.

5. The organic electroluminescence device according to claim 4, wherein the compound A is a polycyclic aromatic hydrocarbon compound including a 4 to 7-membered mother skeleton.

6. The organic electroluminescence device according to claim 5, wherein the mother skeleton of the polycyclic aromatic hydrocarbon compound is pyrene, benzopyrene, chrysene, naphthacene, benzonaphthacene, dibenzonaphthacene, perylene or coronene.

7. The organic electroluminescence device according to claim 4, wherein the compound A is a compound represented by the following formula (4):

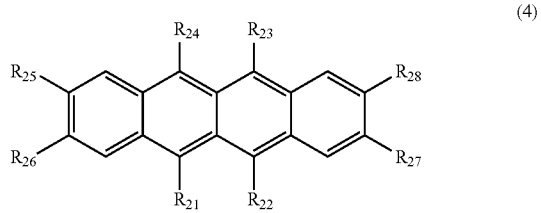

(4)

wherein in the formula (4), $R_{21}$ to $R_{28}$ are independently a hydrogen atom, a fluorine atom, a substituted or unsubstituted alkyl group including 1 to 10 carbon atoms, a substituted or unsubstituted cycloalkyl group including 3 to 10 carbon atoms, a substituted or unsubstituted alkylsilyl group including 3 to 30 carbon atoms, a substituted or unsubstituted arylsily group including 8 to 30 ring carbon atoms, a substituted or unsubstituted alkoxy group including 1 to 20 carbon atoms, a substituted or unsubstituted aryloxy group including 6 to 20 ring carbon atoms, a substituted or unsubstituted aromatic hydrocarbon group including 6 to 30 ring carbon atoms or a substituted or unsubstituted heterocyclic group including 5 to 30 ring atoms.

8. The organic electroluminescence device according to claim 4, wherein the emitting layer including the compound A comprises, as a dopant material, a perylene derivative, a diketo-pyrrolo-pyrrole derivative, a pyrromethene complex, a pyrane derivative or a styryl derivative.

9. The organic electroluminescence device according to claim 4 that comprises, between an anode and a cathode, a first emitting layer, an intermediate layer, a second emitting layer and a third emitting layer being stacked in this sequence from the anode side,
wherein
the first emitting layer comprises at least the compound A as a host material; and
the second emitting layer and the third emitting layer comprise an anthracene derivative as a host material.

10. The organic electroluminescence device according to claim 2, wherein at least one emitting layer of the remaining emitting layers other than the emitting layer that comprises an anthracene derivative as a host material comprises at least a phosphorescent emitting material as a host material.

11. The organic electroluminescence device according to claim 10, wherein the phosphorescent emitting material is a carbazole derivative or a quinoline complex derivative.

12. The organic electroluminescence device according to claim 10 that comprises, between an anode and a cathode, a first emitting layer, an intermediate layer and a second emitting layer being stacked from the anode side,
wherein
the first emitting layer comprises at least a phosphorescent emitting material as a host material, and
the second emitting layer comprises an anthracene derivative as a host material.

13. The organic electroluminescence device according to claim 1, wherein a part of the organic layer stacked structure, said part being in contact with the anode, comprises a hole-supplying layer, and a part of the organic layer stacked structure, said part being in contact with the cathode, comprises an electron-supplying layer.

14. The organic electroluminescence device according to claim 1, that emits white light by overlapping of light emitted from the plural emitting layers.

15. A display that comprises the organic electroluminescence devices according to claim 1 that are arranged in a two-dimensional matrix form.

* * * * *